United States Patent
Sakui et al.

(10) Patent No.: US 6,411,548 B1
(45) Date of Patent: Jun. 25, 2002

(54) SEMICONDUCTOR MEMORY HAVING TRANSISTORS CONNECTED IN SERIES

(75) Inventors: Koji Sakui, Tokyo; Mitsuhiro Noguchi, Yokohama, both of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 9 days.

(21) Appl. No.: 09/615,803

(22) Filed: Jul. 13, 2000

(30) Foreign Application Priority Data

Jul. 13, 1999 (JP) ............................................ 11-198978
Jul. 10, 2000 (JP) ....................................... 2000-208341

(51) Int. Cl.$^7$ ............................................. G11C 16/04
(52) U.S. Cl. ............................ 365/185.17; 365/185.12; 365/185.24
(58) Field of Search ...................... 365/185.12, 185.17, 365/185.18, 185.24, 185.01, 185.33, 145, 230.03, 230.06

(56) References Cited

U.S. PATENT DOCUMENTS

| | | | |
|---|---|---|---|
| 2,791,759 A | | 5/1957 | Brown |
| 2,791,760 A | | 5/1957 | Ross |
| 5,517,457 A | * | 5/1996 | Sakui et al. ............ 365/230.03 |
| 6,026,014 A | * | 2/2000 | Sato et al. ............. 365/185.03 |
| 6,163,485 A | * | 12/2000 | Kawahara et al. ..... 365/185.24 |

FOREIGN PATENT DOCUMENTS

| | | |
|---|---|---|
| JP | 8-315590 | 11/1996 |
| JP | 2000-076880 | 3/2000 |

OTHER PUBLICATIONS

Hiroshi Ishiwara, et al., "Proposal of a Single–Transistor––Cell–Type Ferroelectric Memory Using an SOI Structure and Experimental Study on the Interference Problem in the Write Operation," Jpn. J. Appl. Phys., vol. 36, Part 1, No. 3B, Mar. 1997, pp. 1655–1658.

Hiroshi Ishiwara, et al., "Fabrication of Ferroelectric–Gate Fets and Their Application to Neural Networks," Precision and Intelligence Laboratory, Tokyo Institute of Technology, Mar. 1998, pp. 1335–1339.

Kang–Deog Suh et al., "A 3.3 V 32 MB NAND Flash Memory With Incremental Step Pulse Programming Scheme," IEEE Journal of Solid–State Circuits, vol. 30, No. 11, Nov. 1995, pp. 1149–1156.

Yoshihisa Iwata, et al., "A 35 NS Cycle Time 3.3 V Only 32 MB NAND Flash EEPROM," IEEE Journal of Solid–State Circuits, vol. 30, No. 11, Nov. 1995, pp. 1157–1164.

Thomas Böhm, et al., "Development of Sub–Quarter–$\mu m$ MONOS Type Memory Transistor," Extended Abstracts of the 1995 International Conference on the Solid State Devices and Materials, 1995, pp. 890–892.

* cited by examiner

Primary Examiner—David Nelms
Assistant Examiner—Gene N. Auduong
(74) Attorney, Agent, or Firm—Oblon, Spivak, McClelland, Maier & Neustadt, P.C.

(57) ABSTRACT

A memory cell array is comprised of plural cell units. Each cell unit is connected between a bit line and a source line. Each cell unit is comprised of plural series-connected MFSFETs having substantially the same structure. Of the plural MFSFETs, one MFSFET nearest to the bit line and one MFSFET nearest to the source line are used as select gate transistors. The MFSFETs other than the MFSFETs used as the select gate transistors are used as memory cells. Data is stored in each memory cell as the polarization state of the ferroelectric film of the MFSFET.

31 Claims, 39 Drawing Sheets

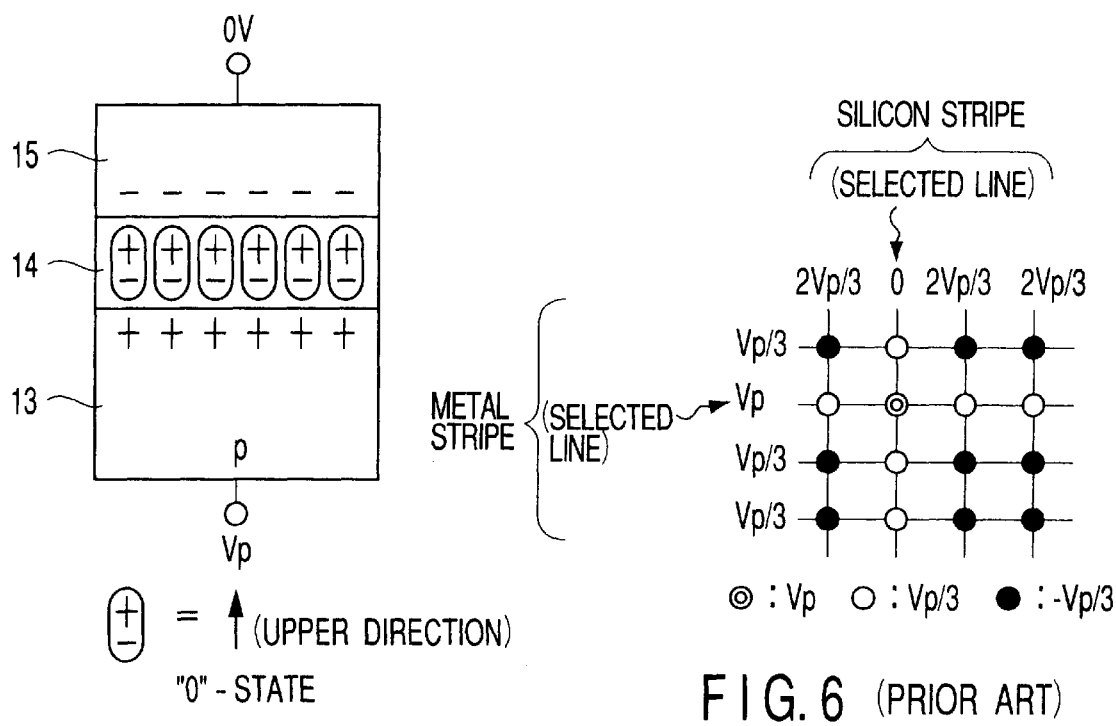
FIG. 4 (PRIOR ART)
FIG. 6 (PRIOR ART)
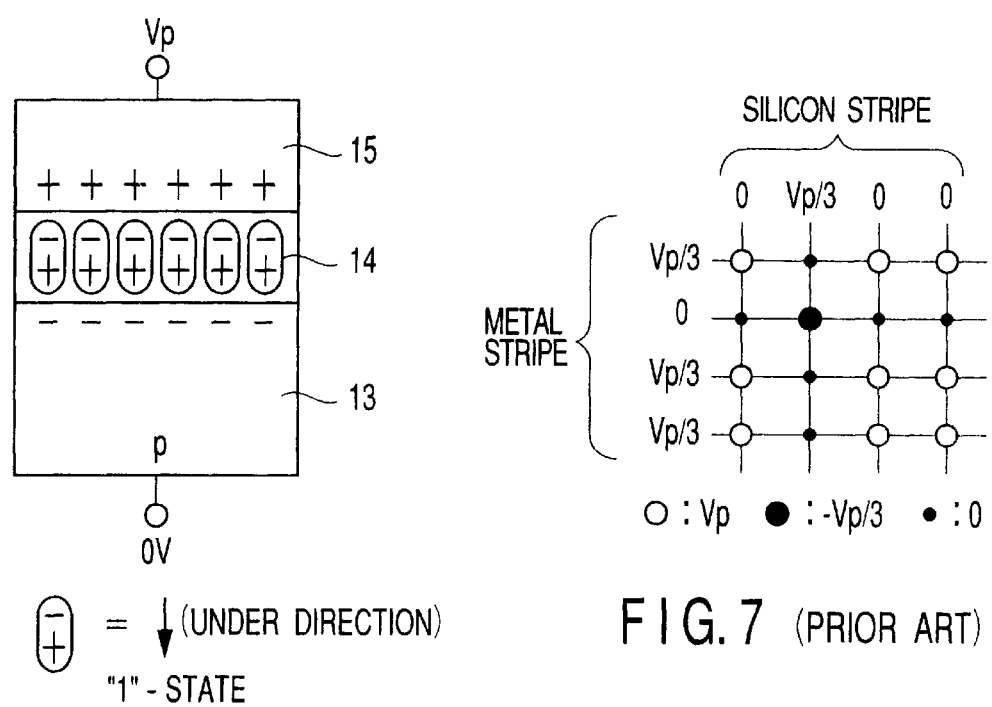
FIG. 5 (PRIOR ART)
FIG. 7 (PRIOR ART)

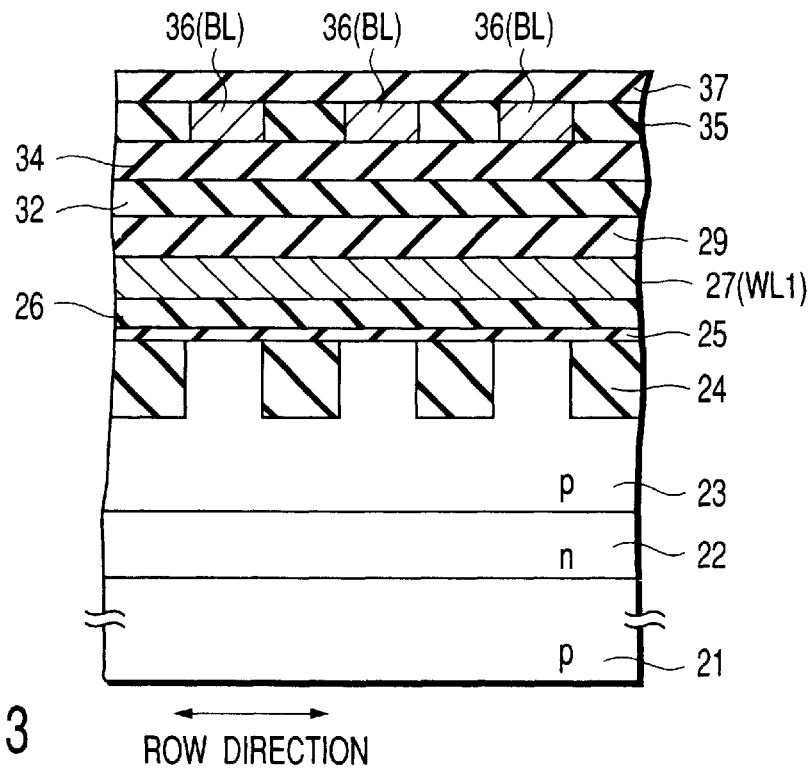
F I G. 13
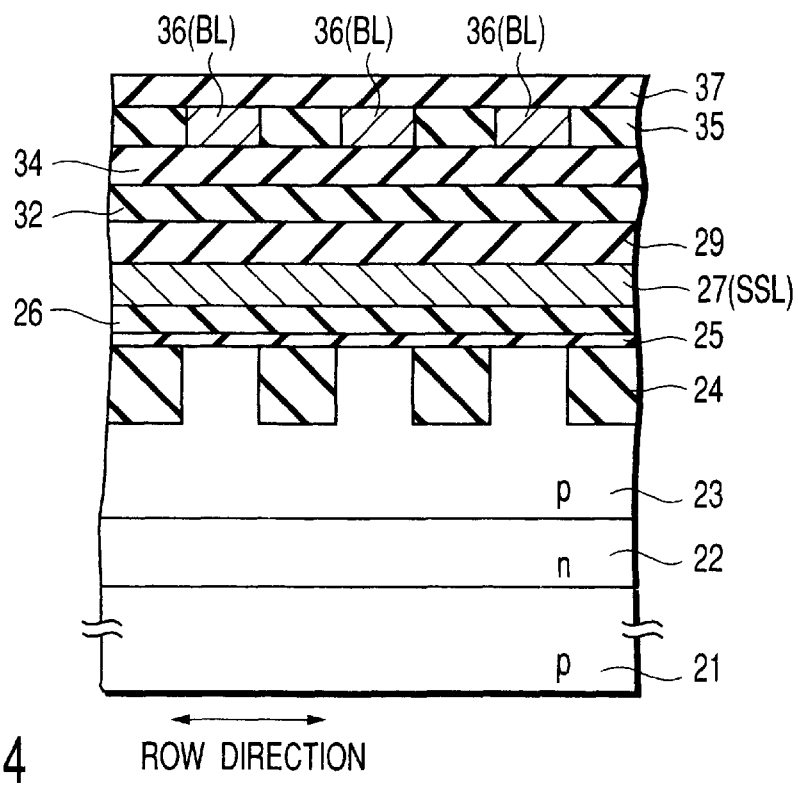
F I G. 14

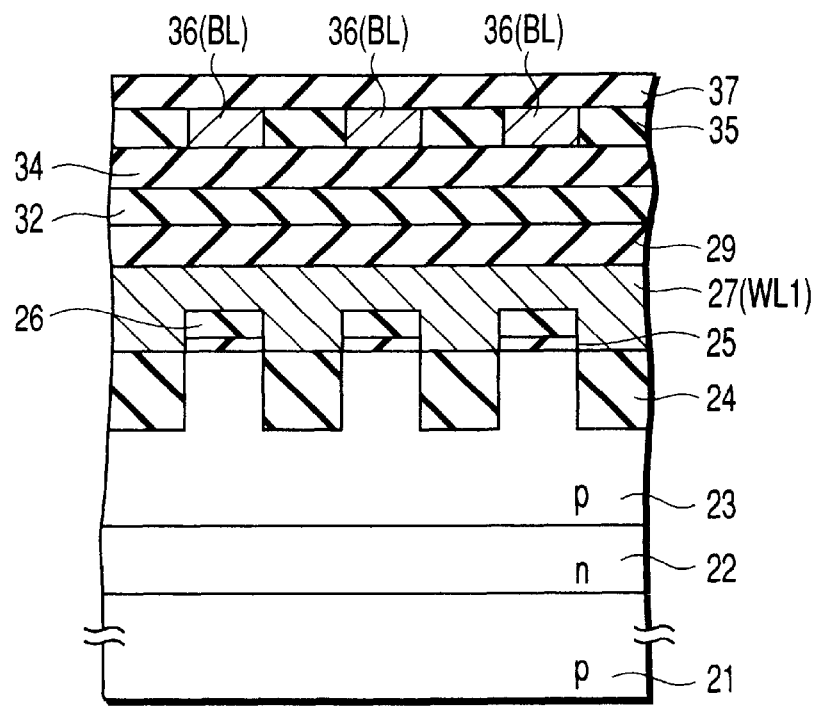
FIG. 18  ROW DIRECTION
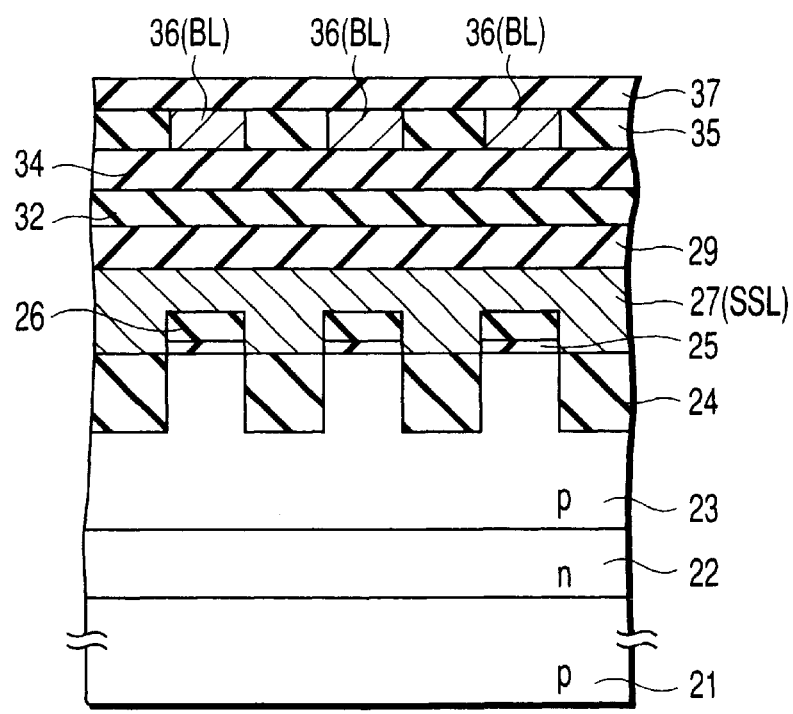
FIG. 19  ROW DIRECTION

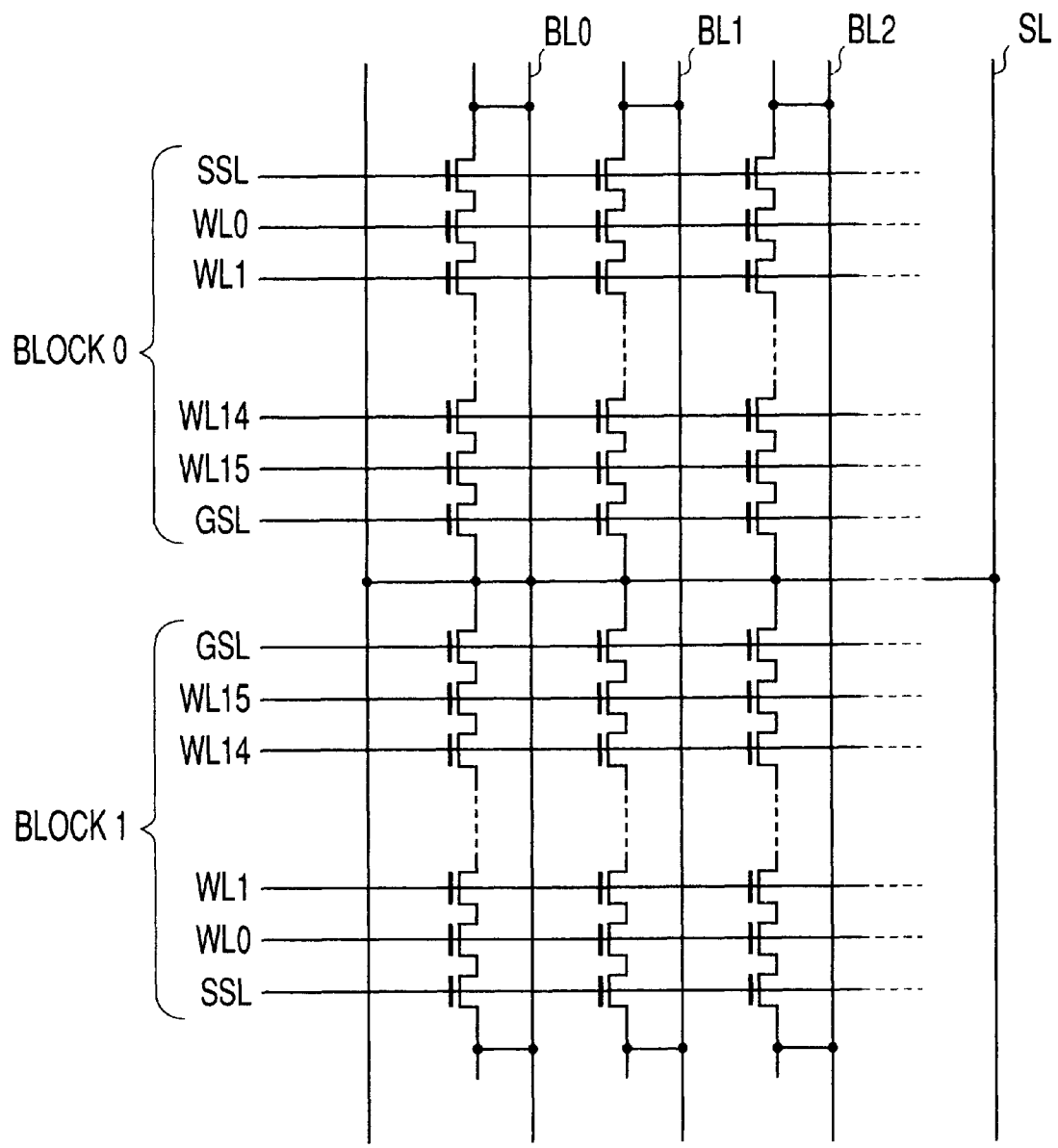
F I G. 32

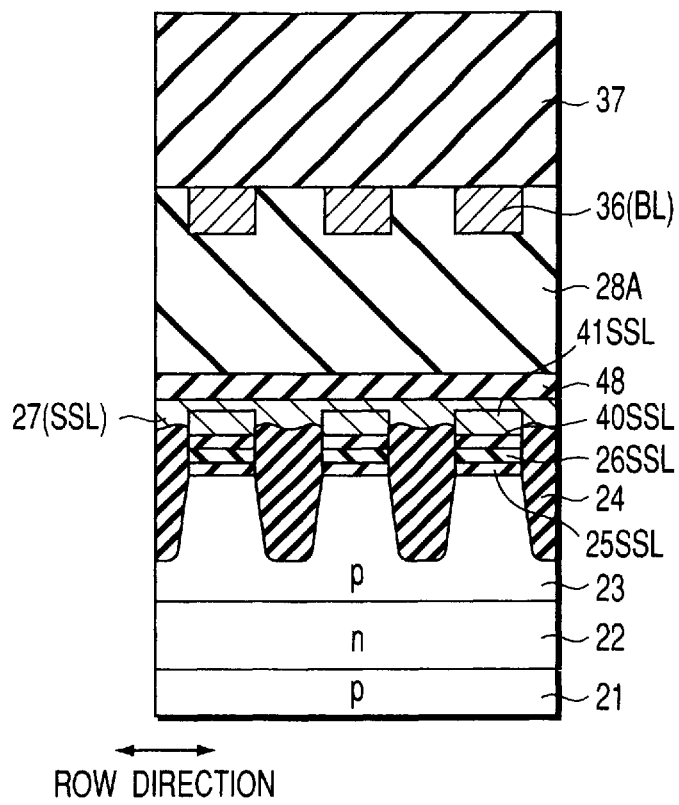
F I G. 45
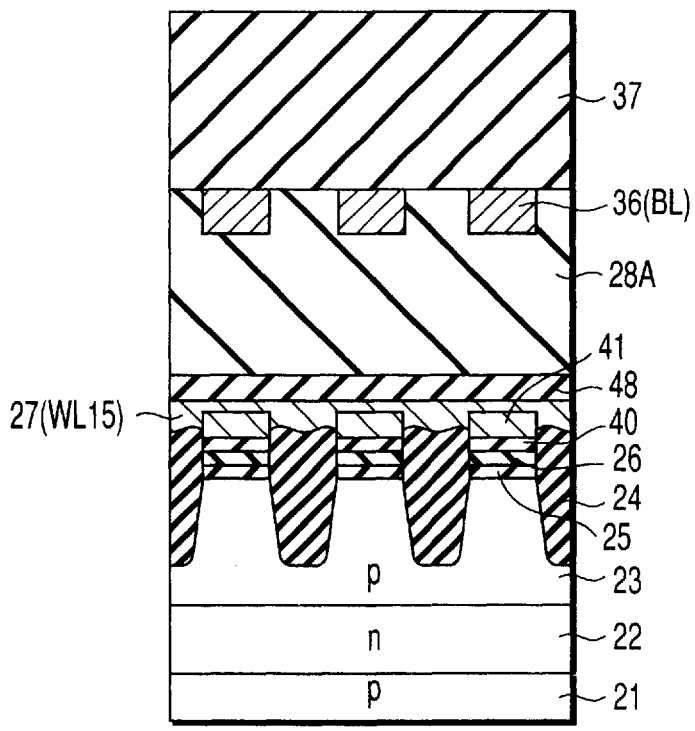
F I G. 46

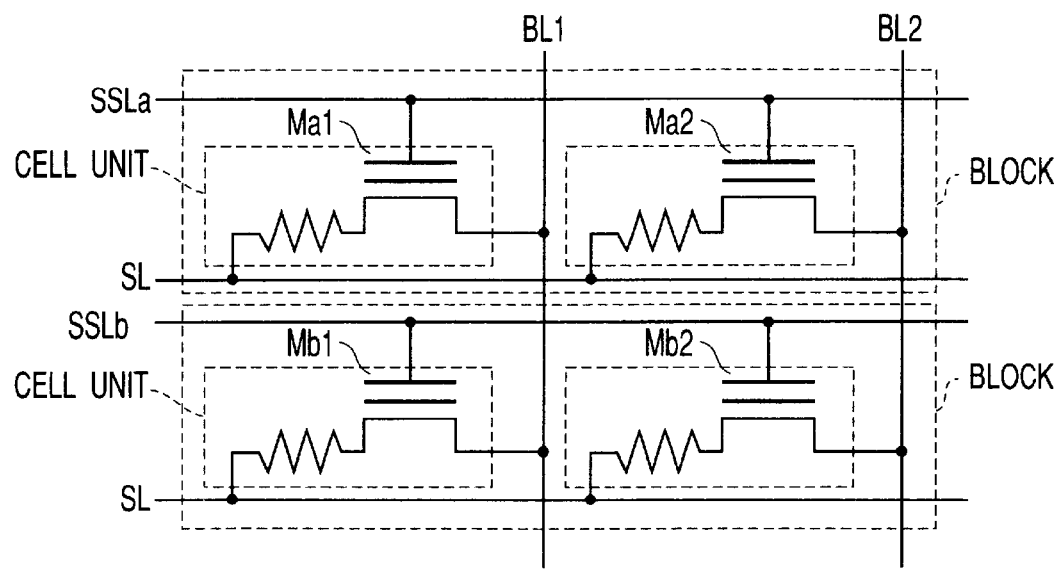
FIG. 55
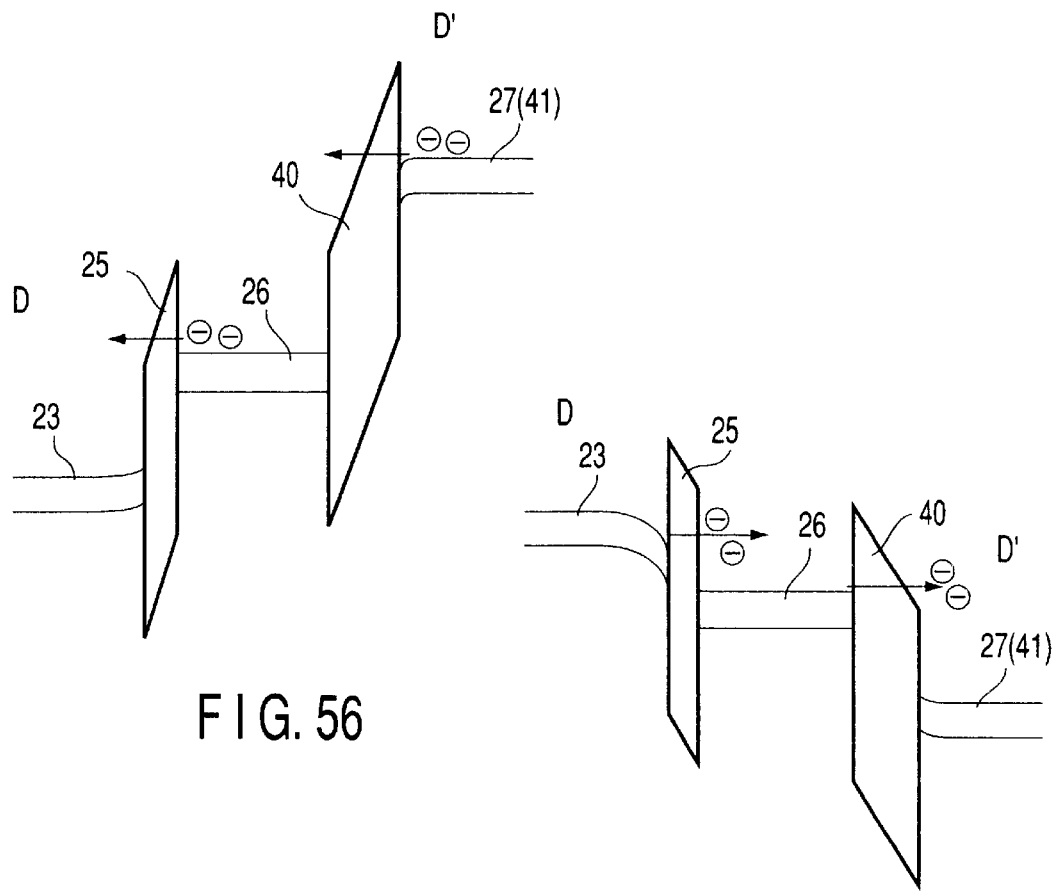
FIG. 56
FIG. 57

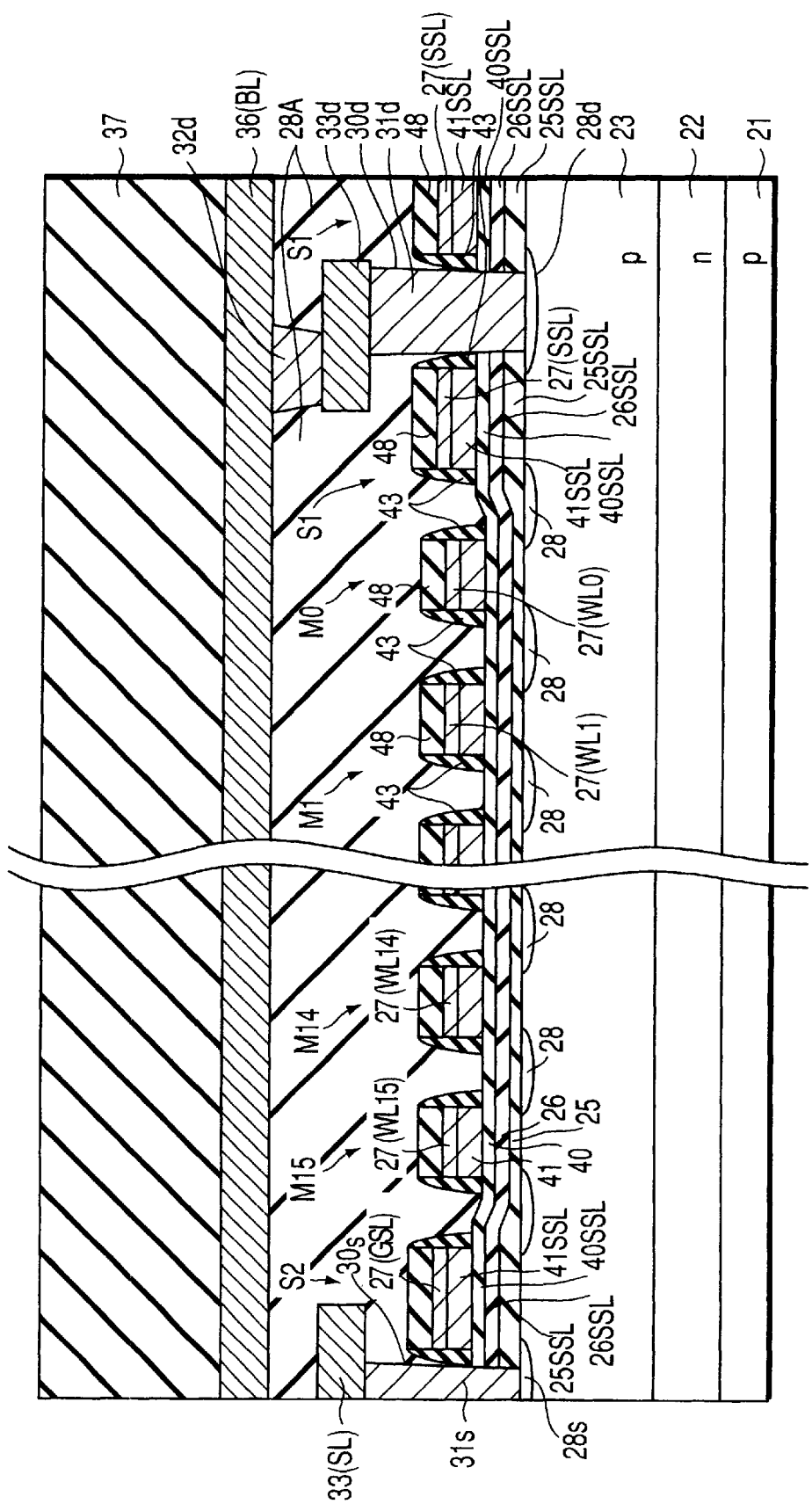
F I G. 59

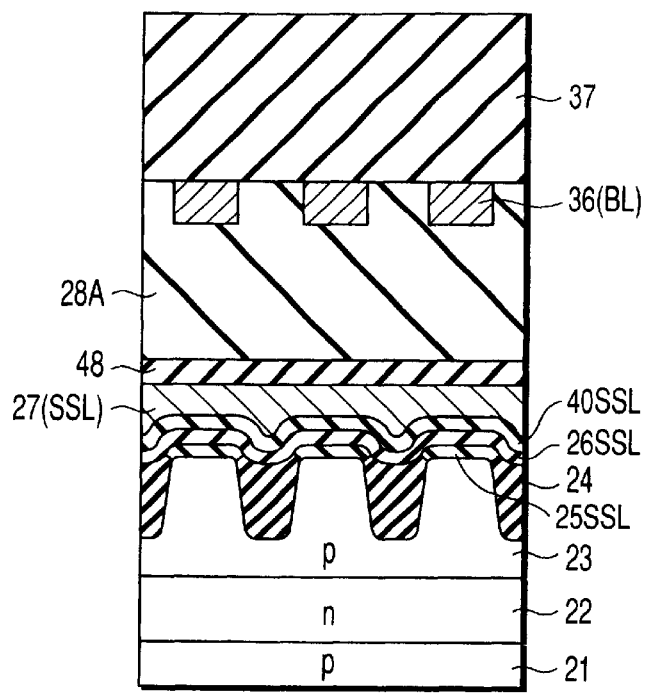
FIG. 64   ROW DIRECTION
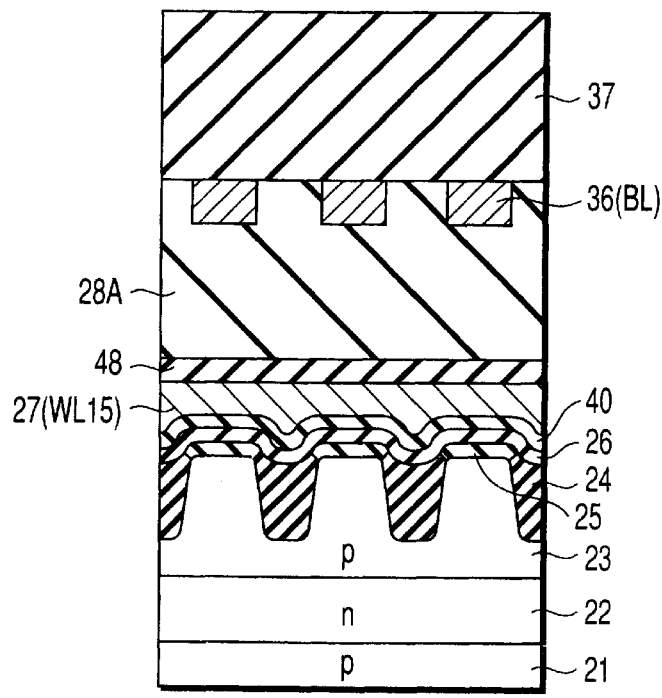
FIG. 65   ROW DIRECTION

SEMICONDUCTOR MEMORY HAVING TRANSISTORS CONNECTED IN SERIES

CROSS-REFERENCE TO RELATED APPLICATIONS

This application is based upon and claims the benefit of priority from the prior Japanese Patent Applications No. 11-198978, filed Jul. 13, 1999; and No. 2000-208341, filed Jul. 10, 2000, the entire contents of which are incorporated herein by reference.

BACKGROUND OF THE INVENTION

(1) Background 1

The present invention relates to a semiconductor memory and, more particularly, to an Ferroelectric Random Access Memory (Ferroelectric RAM).

An Ferroelectric RAM is a semiconductor memory that uses a ferroelectric film as part of a memory cell. The polarization state of this ferroelectric film determines the data ("0"or "1") in the memory cell. The Ferroelectric RAM has many characteristic features, e.g., capabilities of performing high-speed operation, reducing power consumption, increasing memory capacity, and increasing the allowable number of re-write operations (write/erase cycles), and nonvolatility, i.e., retaining data in the absence of power.

Presently, as memory cells for the Ferroelectric RAM, a memory cell obtained by replacing the capacitor insulating film of a memory cell for a DRAM (Dynamic Random Access Memory) with a ferroelectric film, a memory cell obtained by replacing the gate insulating film of a MISFET (Metal Insulated Semiconductor Field Effect Transistor) with a ferroelectric film, and the like are known.

A memory cell having a structure obtained by replacing the gate insulating film of a MISFET with a ferroelectric film is called an MFSFET (Metal-Ferroelectric-Semiconductor Field Effect Transistor). The MFSFET implements a memory function by controlling a current flowing between the source region and the drain region in accordance with the polarization state of the ferroelectric film (assume that polarization which is positive on the substrate side and negative on the gate electrode side is under-direction polarization, and polarization which is negative on the substrate side and positive on the gate electrode side is upper-direction polarization).

In comparison with a memory cell obtained by replacing the capacitor insulating film of a DRAM with a ferroelectric film, an MFSFET allows a reduction in cell size based on the scaling law, and hence suited to achieving an increase in memory capacity and a reduction in chip area. In addition, the MFSFET has an excellent feature that it allows nondestructive data read operation. On the other hand, the MFSFET has its unique technical problems for practical use, e.g., a problem in the process of forming a ferroelectric film on a semiconductor substrate (silicon substrate) (interdiffusion of atoms or the relative dielectric constant of a buffer layer when it is used).

For example, the following are presently known as research papers on the Ferroelectric RAM having MFSFETs:

reference 1: H. Ishihara et al., "Proposal of a Single-Transistor-Cell-Type Ferroelectric Memory Using an SOI structure and Experimental Study on the Interference Problem in the Write Operation" *Jpn J. Appl. Phys. Vol.* 36, pp. 1655–1658, Mar. 1997, reference 2: Hiroshi Ishihara, "Fabrication of ferroelectric-gate FETs and their application to neural networks" *OYO BUTURI*, Vol. 66, No. 12, pp. 1335–1339 (1997), and reference 3: Hiroshi Ishihara, "Current state of Ferroelectric-gate FETs and their problems", Technical Report of IEICE ED97-213, pp. 9–16, Mar. 1998.

A prototype technique for the current MFSFETs is disclosed in the patent application filed by Bell Telephone Laboratories (W. L. Brown, U.S. Pat. No. 2,791,759, I. M. Ross, U.S. Pat. No. 2,791,760) in 1955.

Ever since the proposal of this technique, research and development on MFSFETs have been intermittently conducted over 40-odd years. With regard to MFSFETs, however, unique technical problems which are difficult to solve, the challenge of obtaining excellent interface characteristics by preventing interdiffusion of atoms between a ferroelectric film and a semiconductor film (silicon film), in particular, have not been satisfactorily solved. Currently, therefore, MFSFETs have not reached a level at which they can be put into practical use.

Recently, in order to cope with increases in speed and complexity of electronic devices, there have been strong user demands for semiconductor memories which can realize faster operation, over power consumption, larger memory capacity, a larger allowable number of re-write operations, nonvolatility, and the like. Under the circumstances, a great deal of attention has been paid to the Ferroelectric RAM which can meet such demands, and research and development on the Ferroelectric RAM having MFSFETs have been vigorously conducted mainly in Japan and Korea.

A prototype of an Ferroelectric RAM has a so-called simple matrix structure in which stripe electrodes extending in the Y-direction are arranged below a ferroelectric film, and stripe electrodes extending in the X-direction are arranged on the ferroelectric film. In this structure, however, in program operation, a voltage is partly applied to unselected cells other than a selected cell. For this reason, repetitive write operation causes an interference effect, i.e., inversion of the data an unselected cells.

In order to prevent this interference effect, therefore, research and development have currently been conducted on an Ferroelectric RAM having an active matrix structure using FETs for cell selection, an Ferroelectric RAM as an improvement of an Ferroelectric RAM having a simple matrix structure, and the like.

FIG. 1 shows an embodiment of the conventional cell array arrangement of an Ferroelectric RAM using MFSFETs. FIG. 2 is an equivalent circuit of the device in FIG. 1.

This Ferroelectric RAM is disclosed in reference 3 and has a simple matrix structure.

A silicon oxide film ($SiO_2$) 12 is formed on a silicon substrate 11. For example, striped silicon films 13 extending in the Y-direction are formed on the silicon oxide film 12. Each silicon film 13 has a p-type region and two n-type regions sandwiching the p-type region. The silicon substrate 11, silicon oxide film 12, and silicon film 13 constitute an SOI (Silicon On Insulator) structure.

Ferroelectric films 14 are formed on the silicon films 13 to completely cover the silicon films 13.

Striped metal films (gate electrodes) 15 extending in the X-direction are formed on the ferroelectric films 14. The silicon films (silicon stripes) 13 and metal films (metal stripes) 15 are arranged to intersect at right angles, thereby forming a simple matrix structure. MFSFETs 16 are formed at the intersections of the silicon films 13 and metal films 15.

In the cell array structure, plural memory cells formed in one silicon stripe are connected in parallel with each other and share one source region and one drain region. For this reason, there is no need to form contact holes for the source and drain regions in each memory cell, and hence this structure is suited to increasing the packing density of memory cells.

The basic operation of the Ferroelectric RAM shown in FIGS. 1 and 2 will be described next.

For the sake of descriptive convenience, assume that in the following description, an electric field generated in the ferroelectric film when a low potential is applied to the silicon film 13 and a high potential is applied to the metal film 15 is defined as an under-direction electric field, and an electric field generated in the ferroelectric film when a high potential is applied to the silicon film 13, and a low potential is applied to the metal film 15 is an upper-direction electric field. In addition, assume that polarization which is positive on the silicon film side and negative on the metal film side is under-direction polarization, and polarization which is negative on the silicon film side and positive on the metal film side is upper-direction polarization. Furthermore, assume that under-direction polarization (remanent polarization point) corresponds to a "1"-state ("1"-programming state), and upper-direction polarization (remanent polarization point) corresponds to a "0"-state ("0"-programming state or erase state).

(1) Program Operation

First of all, initialization is performed. In initialization, Vp is applied to all the silicon films (silicon stripes) 13, and 0V is applied to all the metal films (metal stripes) 15. At this time, upper-direction polarization is generated in the ferroelectric films 14 (limited to the portions where the silicon stripes and metal stripes cross each other; ditto for the following description) of all the memory cells.

As shown in FIG. 3, in the ferroelectric film 14 to which no electric field has been applied, the polarization state moves from a point A to a point B.

In the ferroelectric film 14 in which a "0"-state is stored, the polarization state moves from a point C to the point B. In the ferroelectric film 14 in which a "1"-state is stored, the polarization state moves from a point E to the point B through a point G (polarization inversion). That is, the ferroelectric films 14 of all memory cells have upper-direction polarization. Each polarization value is a saturated polarization value Pmax.

When the potential applied to each silicon film 13 is changed from Vp to 0V, the electric field in the ferroelectric film 14 of each memory cell becomes 0, and the amount of upper-direction polarization in the ferroelectric film 14 does not becomes 0 but becomes a remanent polarization value Pr (point C=remanent polarization point). That is, all the memory cells are initialized to the "0"-state (in which the threshold value is high) (see FIG. 4).

Subsequently, "1"-programming is performed for a selected memory cell. More specifically, Vp is applied to the selected metal stripe; Vp/3, to each unselected metal stripe; 0V, to the selected silicon stripe; and 2Vp/3, to each unselected silicon stripe.

At this time, as shown in FIG. 6, the voltage (potential difference) Vp is applied to the ferroelectric film of the selected memory cell (indicated by ⊙), and an under-direction electric field is generated in the ferroelectric film. This under-direction electric field has a value sufficient for inversion of the polarization in the ferroelectric film of the selected memory cell from upper-direction polarization to under-direction polarization, i.e., polarization inversion of the ferroelectric film. Therefore, the polarization state of the ferroelectric film of the selected memory cell moves from a point C to a point F and a point D, and the polarization value of under-direction polarization in the ferroelectric film becomes a saturated polarization value -Pmax.

Meanwhile, a voltage +Vp/3 or -Vp/3 is applied to the ferroelectric films of all unselected memory cells (indicated by white and black circles) other than the selected memory cell.

An under-direction electric field is generated in the ferroelectric film to which the voltage +Vp/3 is applied. This under-direction electric field does not have a value sufficient for inversion of the polarization in the ferroelectric film of the unselected memory cell from upper-direction polarization to under-direction polarization, i.e., polarization inversion of the ferroelectric film. Therefore, the polarization state of the ferroelectric film to which the voltage +Vp/3 is applied is between the point C and the point F, and the polarization of the ferroelectric film is kept in the upper direction.

An upper-direction electric field is generated in the ferroelectric film to which the voltage -Vp/3 is applied. Therefore, the polarization state of the ferroelectric film to which the voltage -Vp/3 is applied is between the point C and the point B. The polarization of the ferroelectric film is kept in the upper direction.

When all silicon films 13 and metal films 15 are set to 0V thereafter, the polarization state of the selected memory cell is set in the "1"-state (in which the threshold value is low) because the polarization state changes from the point D to the point E (remanent polarization point) (see FIG. 5). Meanwhile, the polarization state of each unselected memory cell is restored to the point C (remanent polarization point), and hence the unselected memory cell maintains the "0"-state (see FIG. 4).

In the above program operation, 0V is applied to the selected silicon film 13, and 2Vp/3 is applied to each unselected silicon film 13. At this time, since plural silicon films (silicon stripes) 13 are physically spaced apart from each other, sufficient insulation properties are ensured between the adjacent memory cells as compared with a well isolation process of forming plural wells in one silicon film.

Alternatively, as shown in FIG. 7, predetermined potentials may be applied to the silicon films 13 and metal films 15 after the above program operation. In this case, since a voltage that is equal in magnitude and opposite in direction to the voltage applied in the program operation is applied to the ferroelectric films 14 of most memory cells, an interference effect can be effectively reduced.

(2) Read Operation

In a memory cell (n-channel MFSFET) in the "1"-state, negative charge is induced on the surface of the channel, i.e., the surface of the p-type region of the silicon film 13, by the under-direction remanent polarization in the ferroelectric film 14. Therefore, the threshold value of the memory cell in the "1"-state is smaller than that of a memory cell in the "0"-state .

In a memory cell (n-channel MFSFET) in the "0"-state, positive charge is induced on the surface of the channel, i.e., the channel of the p-type region of the silicon film 13, by the upper-direction remanent polarization in t he ferroelectric film 14. Therefore, the threshold value of the memory cell in the "0"-state is larger than that of the memory cell in the "1"-state.

As shown in FIG. 8, therefore, a predetermined read potential Vread is set, at which a drain current Id flows in the memory cell in the "1"-state, but no drain current Id flows in the memory cell in the "0"-state, and the read potential Vread is applied to the selected metal film (metal stripe) 15. The read operation is then completed by checking whether a cell current flows in the select ed memory cell.

Assume that when $10^3$ memory cells are connected in parallel in a silicon stripe, and 0V is applied to each unselected metal film 15, a leak current Ileak is produced in each unselected memory cell in the silicon stripe. In this case, in order to perform an accurate read, the read current (drain current Id) must be at least about $10^4$ times the leak current Ileak.

Assume that about 0.1V is required to increase a current in the sub-threshold region of an FET by one order of magnitude. In this case, the read potential Vread is about 0.4V.

FIG. 9 is a plan view showing the cell array structure of the Ferroelectric RAM disclosed in references 1 to 3. FIG. 10 is a sectional view taken along a line X—X in FIG. 9.

As described above, memory cells are formed at the intersections of silicon stripes and metal stripes. In each silicon stripe, a p-type region (channel) and two n-type regions (source and drain) sandwiching the p-type region are formed. Each metal stripe serves as a word line. The silicon stripes are physically isolated from each other and spaced a predetermined distance apart from each other.

A cell size in the use of such a cell array structure will be examined below.

Assume that the interval between the silicon stripes (element isolation width) is F (Feature size representing the minimum value of a design rule). In this case, the size of each memory cell in the X-direction (or bit line pitch) is 4F, and the size of each memory cell in the Y-direction (or word line pitch) is 2F. Therefore, the size of one memory cell is $8F^2$ (=4F×2F).

This memory cell size is larger than the cell size of a nonvolatile semiconductor memory such as a flash memory. For example, in a NAND flash EEPROM having a NAND string consisting of 16 series-connected memory cells, the size of one memory cell is $4.5F^2$ (to be described in detail later). If, therefore, an Ferroelectric RAM having a large memory capacity is to be manufactured, the chip size becomes large, resulting in a decrease in yield and an increase in cost. In addition, the Ferroelectric RAM having the cell array structure described above requires a decoder for controlling a potential to be applied to each silicon stripe in data re-write operation (overwrite operation), i.e., cell data change operation, resulting in an increase in complexity of a control circuit and an increase in chip size.

(2) Background 2

The present invention relates to a semiconductor memory that allows a high-density cell layout.

A nonvolatile semiconductor memory (EEPROM) in which digital bit data is stored as a charge amount in a floating gate electrode is known well.

In this nonvolatile semiconductor memory, charge is injected from a channel into a floating gate electrode through a tunnel insulating film, and is extracted from the floating gate electrode to the channel through the tunnel insulating film. A current flowing in the tunnel insulating film upon movement of the charge is called a tunnel current.

The digital bit data stored in the memory cell can be read out from the memory cell by measuring the charge amount in the floating gate electrode as the change amount of conductance of the memory cell (MOSFET).

Of the nonvolatile semiconductor memories under research and development, a NAND EEPROM or AND EEPROM can greatly decrease the number of select gate transistors as compared with the number of memory cells, and hence is suited to increasing the packing density of memory cells.

As is known, a NAND EEPROM has a cell unit in which plural memory cells are connected in series with each other, thereby realizing a high packing density of memory cells. In addition, as is known, an AND EEPROM has a cell unit in which plural memory cells are connected in parallel with each other, thereby realizing a high packing density of memory cells.

In a conventional NAND EEPROM or AND EEPROM, in order to decrease the resistances of the select gate lines of select gate transistors, interconnections (so-called backside sub wires) lower in resistance than the select gate lines are arranged on an interconnection layer located above an interconnection layer on which the select gate lines are arranged, and contact areas (so-called shunt areas) between the select gate lines and the backside sub wires are arranged at predetermined intervals.

According to the prior art, therefore, the memory cell array region expands due to such backside sub wires and shut areas, and it is difficult to reduce the chip area.

This problem will be described in detail below.

FIG. 41 is an equivalent circuit of a cell unit of a conventional NAND EEPROM. FIG. 42 is an equivalent circuit of a cell unit of a conventional AND EEPROM.

As shown in FIG. 41, a cell unit 45 of a NAND EEPROM is comprised of a NAND string constituted by plural (16 in this case) series-connected memory cells M0, M1, . . . , M15 and two select gate transistors S1 and S2 respectively connected to the two ends of the NAND string.

As shown in FIG. 42, a cell unit 45 of an AND EEPROM is comprised of plural (16 in this case) memory cells M0, M1, . . . , M15 connected in parallel with each other between nodes A and B, and two select gate transistors S1 and S2 respectively connected to the two nodes A and B.

In either of the cell units 45 shown in FIGS. 41 and 42, plural (16 in this case) control gate lines (word lines) WL0, WL1, . . . , WL15 are connected, and one or more (two in this case) select gate lines (block select lines) SSL and GSL are connected. Note that at least one select gate line is connected to the cell unit 45, and preferably extends in the same direction as the direction (row direction) in which the control gate lines WL0, WL1, . . . , WL15 extend for the sake of increasing the packing density of memory cells.

A bit line (data transfer line) BL extends in a direction (column direction) perpendicular to the direction in which the word lines (data select lines) WL0, WL1, . . . , WL15 extend. The memory cells M0, M1, . . . , M15 are respectively placed at the intersections of the bit line BL and the word lines WL0, WL1, , WL15, and independently allow writes and reads of digital bit data.

In this case, a memory cell includes a floating gate electrode (charge storing layer). The value of digital bit data is determined by the amount of charge in the floating gate electrode. Plural cell units are arranged in the row and column directions, thus forming a memory cell matrix. Note that a set of plural cell units arranged in the row direction is called a block.

In a large-scale memory in which memory cells are mounted at a high packing density, interconnections are thin and long, and hence it is important to decrease their resistances. Since the control gate lines (word lines) WL0, WL1, . . . , WL15 are the thinnest interconnections in the chip, various techniques have been studied to decrease their resistances.

For example, a technique of making the control gate lines WL0, WL1, ..., WL15 have a multilayer structure consisting of impurity-doped conductive polysilicon and a low-resistance material is known well. As this low-resistance material, for example, a metal silicide such as WSi, CoSi, NiSi, or TiSi or a metal such as Ta or W is used.

In general, the select gate lines SSL and GSL of the select gate transistors are arranged on an interconnection layer different from an interconnection layer on which the control gate lines WL0, WL1, ..., WL15 of the memory cells are arranged.

In this case, if, for example, the select gate lines SSL and GSL are formed to have a multilayer structure consisting of impurity-doped conductive polysilicon and a low-resistance material, a decrease in the resistance of the select gate lines SSL and GSL can be attained. However, since the interconnection layer on which the select gate lines SSL and GSL are arranged differs from the interconnection layer on which the control gate lines WL0, WL1, ..., WL15 are arranged, photolithography and a process (RIE) are independently required on the select gate transistor side and the memory cell side.

As a consequence, misalignment occurs between the select gate lines SSL and GSL and the control gate lines WL0, WL1, ..., WL15, and hence some margin must be ensured in consideration of the misalignment. The chip area increased by this margin.

If the select gate lines SSL and GSL are arranged on the same interconnection layer as the interconnection layer on which the floating gate electrodes (charge storing layers) of the memory cells are arranged, the problem of an increase in chip area due to the above alignment can be prevented.

If, therefore, the select gate lines SSL and GSL and floating gate electrodes (charge storing layers) are arranged on the same interconnection layer and made to have a multilayer structure consisting of impurity-doped conductive polysilicon and a low-resistance material (metal silicide, metal, or the like), a decrease in the resistance of the select gate lines SSL and GSL can be attained, and photolithography and a process (RIE) can be commonly performed on the select gate transistor side and the memory cell side. This makes it possible to prevent the problem of an increase in chip area.

In this case, however, a problem arises in terms of the breakdown voltage of the insulating films between the control gate electrodes and floating gate electrodes of the memory cells.

It is known that the breakdown voltage of the insulating film between the control gate electrode and floating gate electrode of each memory cell greatly decreases as atoms of a metal such as W, Ni, or Ti enter the floating gate electrode. If, therefore, the floating gate electrode has a multilayer structure consisting of impurity-doped conductive polysilicon and a low-resistance material (metal silicide, metal, or the like), the breakdown of the insulating film between the control gate electrode and floating gate electrode of the memory cell decreases, resulting in difficulty in stabilizing the operation of the memory.

When the select gate lines SSL and GSL and floating gate electrodes (charge storing layers) are to be arranged on the same interconnection layer, conductive polysilicon doped with P, As, or B must be used for the select gate lines SSL and GSL and floating gate electrodes. As a result, the resistance of the resultant interconnections become higher than that of the interconnections made of a metal or metal silicide.

When, therefore, the select gate lines SSL and GSL and floating gate electrodes are to be arranged on the same interconnection layer, a technique (stitch interconnection technique) is used, in which so-called backside sub wires are arranged on an interconnection layer located above the interconnection layer on which the select gate lines SSL and GSL are arranged, and the select gate lines SSL and GSL are brought into contact with the backside sub wires every 10 to 1,000 cell units.

In this technique, however, contact areas (shunt areas) for the select gate lines and backside sub wires are required, and hence the chip area increases by the contact areas.

As described above, in a conventional semiconductor memory having a cell unit constituted by plural memory cells connected in series or in parallel, photolithography and a process must be independently performed on the memory cell side and the select gate transistor side, and contact areas for the select gate lines and the backside sub wires located thereabove must be formed, resulting in an increase in chip area.

BRIEF SUMMARY OF THE INVENTION (1) It is an object of the present invention to provide a semiconductor memory (Ferroelectric RAM) which is excellent at micropatterning memory cells, reducing chip size, decreasing write/read voltages, reducing power consumption, and simplifying a manufacturing process, and can attain high-speed operation and high reliability.

In order to achieve the above object, a semiconductor memory according to the present invention has a cell unit constituted by plural series-connected transistors, a bit line connected to one end of the cell unit, and a source line connected to the other end of the cell unit. Each transistor has substantially the same structure and the function of storing data in a nonvolatile manner. Of the plural transistors, one transistor nearest to the bit line and one transistor nearest to the source line are used as select gate transistors. The transistors other than the transistors used as the select gate transistors are used as memory cells.

A semiconductor memory according to the present invention has a cell unit constituted by plural series-connected MFSFETS having substantially the same structure, a bit line connected to one end of the cell unit, and a source line connected to the other end of the cell unit. Of the plural MFSFETS, one MFSFET nearest to the bit line and one MFSFET nearest to the source line are used as select gate transistors, and the MFSFETs other than the MFSFETS used as the select gate transistors are used as memory cells.

(2) It is an object of the present invention to provide a device structure and memory cell layout, which can realize a high-density cell layout and reductions in the resistances of select gate lines and control gate lines and eliminate the necessity to independently perform photolithography and a process on the memory cell side and the select gate transistor side and to form backside sub wires by forming the select gate lines and control gate lines on the same interconnection layer and making them have a multilayer structure consisting of conductive polysilicon and a low-resistance material.

In order to achieve the above object, a semiconductor memory according to the present invention has plural memory cells connected in series or parallel between first and second nodes, and select gate transistors connected between the first node and a third node. Each of plural memory cells and select gate transistors has a charge storing layer. The charge storing layer of each of the plural memory cells is made of the same material as that for each of the select gate transistors, and has the same thickness as that thereof.

In addition, a semiconductor memory according to the present invention has a memory cell and a select gate transistor connected between the memory cell and a bit line or source line. Both the memory cell and the semiconductor have charge storing layers, and the charge storing layer of the memory cell is made of the same material as that for the select gate transistor and has the same thickness as that thereof.

(3) Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a view showing positive charge induced by upper-direction polarization and a channel;

FIG. 5 is a view showing negative charge induced by under-direction polarization and a channel;

FIG. 6 is a view showing a potential relationship in program operation;

FIG. 7 is a view showing a potential relationship at the time of generation of compensation pulses;

FIG. 13 is a sectional view taken along a line XIII—XIII in FIG. 11;

FIG. 14 is a sectional view taken along a line XIV—XIV in FIG. 11;

FIG. 18 is a sectional view taken along a line XVIII—XVIII in FIG. 16;

FIG. 19 is a sectional view taken along a line XIX—XIX in FIG. 16;

FIG. 32 is an equivalent circuit of a cell array of a NAND Ferroelectric RAM;

FIG. 45 is a sectional view taken along a line XLV—XLV in FIG. 43;

FIG. 46 is a sectional view taken along a line XLVI—XLVI in FIG. 43;

FIG. 55 is a view showing the state of a cell unit after the erase step in FIGS. 53 and 54;

FIG. 56 is a view showing a band state during erase operation of the device according to the present invention;

FIG. 57 is a view showing a band state during write operation of the device according to the present invention;

FIG. 59 is a sectional view taken along a line LIX—LIX in FIG. 58;

FIG. 64 is a sectional view taken along a line LXIV—LXIV in FIG. 62;

FIG. 65 is a sectional view taken along a line LXV—LXV in FIG. 62;

DETAILED DESCRIPTION OF THE INVENTION

A semiconductor memory of the present invention will be described below in detail with reference to the accompanying drawing.

(1) Detailed Description 1

Figure 11:
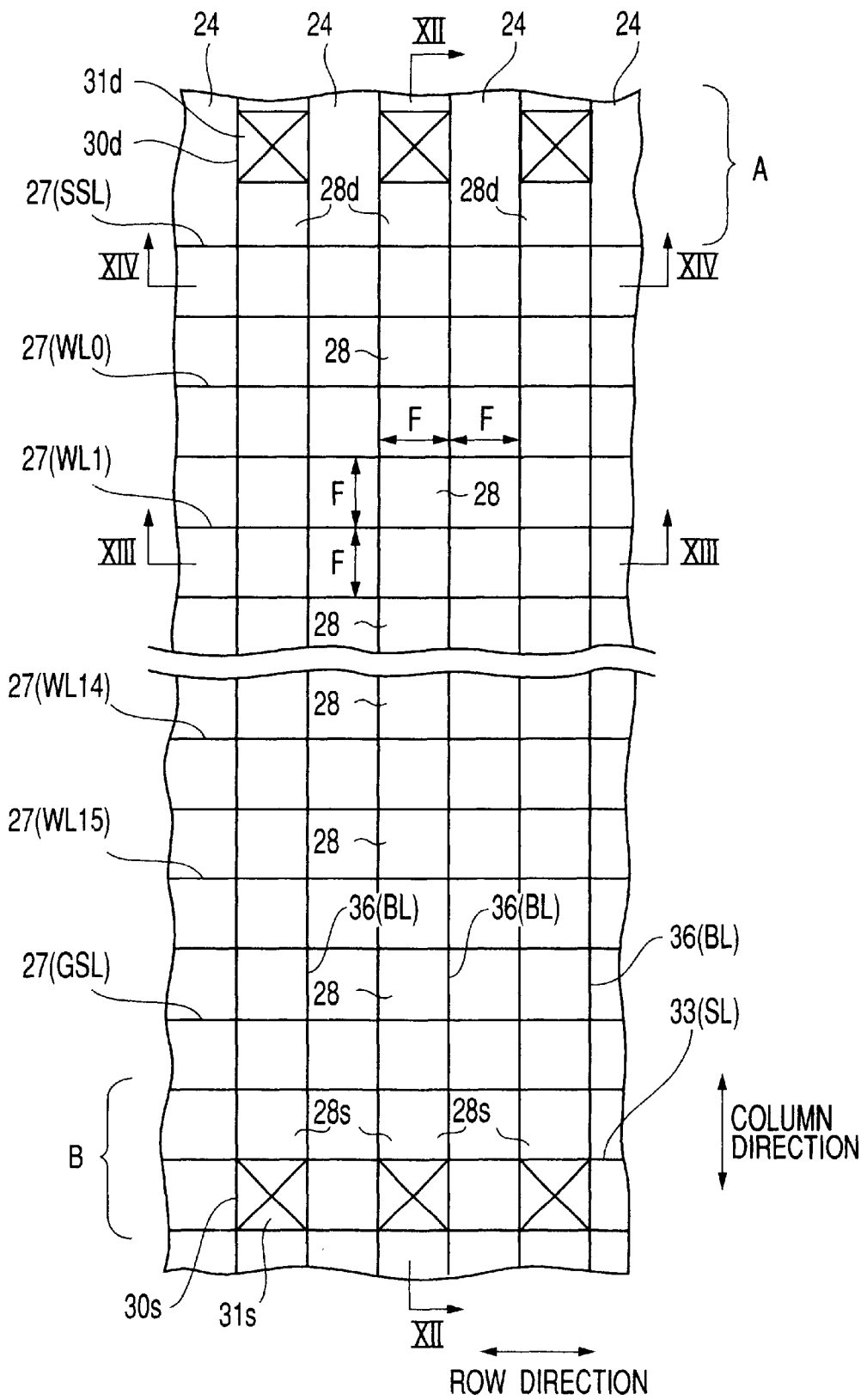
FIG. 11 is a plan view of the first embodiment of a NAND Ferroelectric RAM according to the present invention.
Figure 12:
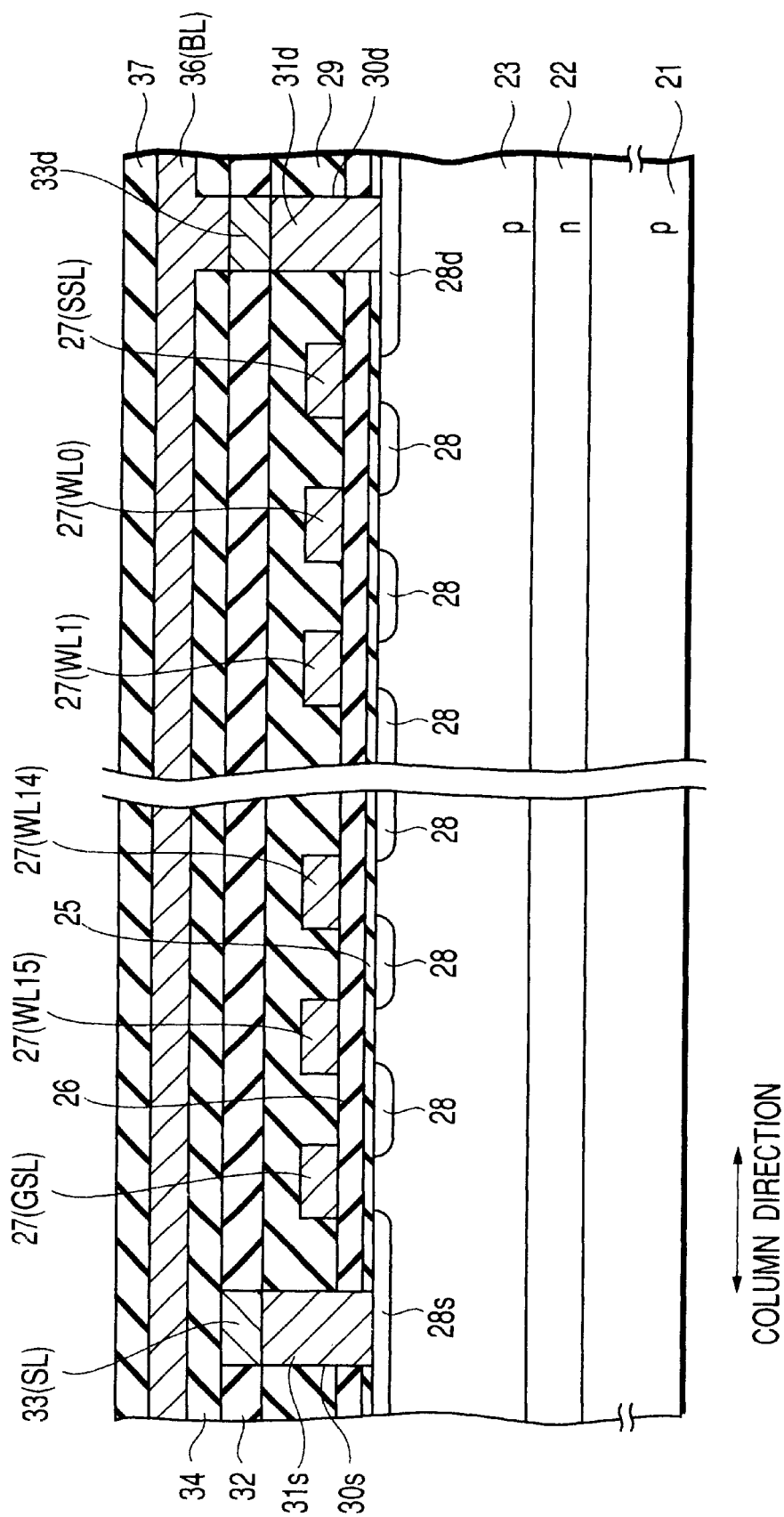
FIG. 12 is a sectional view taken along a line XII—XII in FIG. 11.
Figure 15:
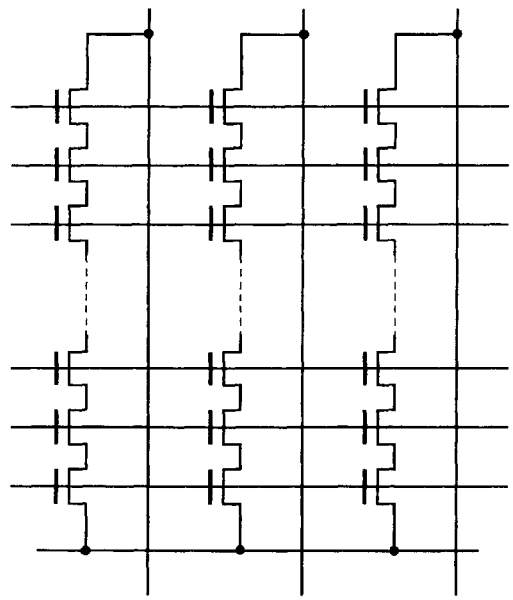
FIG. 15 is an equivalent circuit of the semiconductor device in FIG. 11.

FIG. 11 is a plan view showing the cell array structure of a ferroelectric memory of the present invention. FIG. 12 is a sectional view taken along a line XII—XII in FIG. 11. FIG. 13 is a sectional view taken along a line XIII—XIII in FIG. 11. FIG. 14 is a sectional view taken along a line XIV—XIV in FIG. 11. FIG. 15 is an equivalent circuit of the device shown in FIGS. 11 to 14.

Characteristic features of this cell array structure are that a memory cell array is comprised of a set of NAND strings (or cell units) each consisting of plural series-connected memory cells, and only plural MFSFETs having substantially the same structure are connected in series between a bit line and a source line, with the two MFSFETs on the two ends functioning as select gate transistors, and the remaining MFSFETs functioning as memory cells constituting NAND strings. A ferroelectric memory having such a cell array structure will be referred to as a NAND Ferroelectric RAM.

The cell array structure of the ferroelectric memory according to the present invention will be described in detail below.

In a p-type silicon substrate 21, a so-called twin well constituted by an n-type well region 22 and p-type well region 23 is formed. A memory cell is formed in the p-type well region 23 of the twin well. Note that a memory cell may be directly formed in the silicon substrate 21 without forming any twin well therein. Alternatively, a memory cell may be formed in a general p-well formed in an n- or p-type silicon substrate.

Element isolation layers 24 having an STI (Shallow Trench Isolation) structure are formed in the silicon substrate 21. For example, the element isolation layers 24 are made of silicon oxide. The element isolation layers 24 linearly extend in the column direction, and have a regular striped shape as a whole. Both width and pitch (or the width of each element region) of each element isolation layer 24 are set to F (Feature size representing the minimum value of a design rule; ditto for the following description).

A buffer layer 25 is formed on the p-type well region (silicon substrate) 23 and element isolation layers 24. A ferroelectric film 26 is formed on the buffer layer 25. As is disclosed in reference 2 as well, the buffer layer 25 is formed to prevent interdiffusion of atoms between the p-type well region (silicon substrate) 23 and the ferroelectric film 26.

More specifically, it is known that when a ferroelectric material containing Pb such as PZT ($PbZr_{1-x}Ti_xO3$) or SBT ($SrBi_2Ta_2O_9$) is directly formed on silicon (or silicon oxide), interdiffusion noticeably occurs between Pb atoms in the ferroelectric material and Si atoms in silicon at the time of formation of the ferroelectric material (at a temperature of, e.g., about 400° C.). That is, if the ferroelectric film 26 is directly formed on the p-type well region (silicon substrate) 23, a good interface cannot be obtained between the p-type well region (silicon substrate) 23 and the ferroelectric film 26.

The buffer layer 25 is therefore formed between the p-type well region (silicon substrate) 23 and the ferroelectric film 26 to prevent interdiffusion of atoms between the p-type well region 23 and the ferroelectric film 26.

With regards to the buffer layer 25, the following points must be taken into consideration.

A ferroelectric material (e.g., PZT) generally has a high relative dielectric constant. For this reason, if the buffer layer 25 is made of a material having a relative dielectric constant excessively lower than that of the ferroelectric film 26, most of a voltage applied between the gate electrode and the channel is applied to the buffer layer 25, but only a small fraction of the voltage is applied to the ferroelectric film 26. That is, a very high voltage must be applied between the gate electrode and the channel to apply a voltage required for polarization inversion to the ferroelectric film 26. As a consequence, a dielectric breakdown occurs in the buffer layer 25 or charge is injected into the buffer layer 25 before the occurrence of polarization inversion.

If charge is injected into the buffer layer 25, an electric field that acts in a direction to invert the polarization direction (down or upper direction) of the ferroelectric film 26 is applied to the ferroelectric film 26 in some cases. In such a case, the hold time (data hold time) of remanent polarization becomes excessively short.

In consideration of the above points, the buffer layer 25 is preferably made of a material having a relative dielectric constant equal to or higher than that of the ferroelectric film 26. In addition, the thinner the buffer layer 25, the better. Candidates for a material that can satisfy such conditions include $SrTiO_3$, $CeO_2$, $ZrO_2$, $HfO_2$, titanium oxide, and the like.

Gate electrodes 27 are formed on the ferroelectric film 26. The gate electrodes 27 linearly extend in the row direction and have a regular striped shape as a whole. For example, both width and pitch (excluding a drain contact portion A and source contact portion B) of each gate electrode 27 are set to F.

Source/drain regions 28 are formed on the surface of the p-type well region (silicon substrate) 23 at space portions-between the gate electrodes 27. Drain regions 28d are formed on the surface of the p-type well region 23 at the drain contact portion A. Source regions 28s are formed on the surface of the p-type well region 23 at the source contact portion B.

In this embodiment, cell units, i.e., 18 MFSFETS, are connected in series between the drain region 28d and the source region 28s. These 18 MFSFETs have substantially the same structure and substantially the same characteristics. In this embodiment, however, one MFSFET located nearest to the drain region 28d and one MFSFET located nearest to the source region 28s function as select gate transistors. The 16 remaining MFSFETs serve as memory cells. That is, gate electrodes 27(SSL) and 27(GSL) become select gate lines, and gate electrodes 27(WL0), 27(WL1), . . . , 27(WL15) become word lines.

A method of making MFSFETs having the same structure function as select gate transistors or memory cells will be described in detail later in the description of the basic operation of the NAND Ferroelectric RAM.

The number of MFSFETs connected between the drain region 28d and the source region 28s is not specifically limited except for three or more. That is, it suffices if at least two select gate transistors and at least one memory cell are present between the drain region 28d and the source region 28s.

An interlevel dielectric film (e.g., silicon oxide) 29 is formed on the ferroelectric film 26 and gate electrodes 27 to completely cover the gate electrodes 27. The interlevel dielectric film 29 has a flat surface. A contact hole 30d reaching the drain region 28d and a contact hole 30d reaching the source region 28s are formed in the interlevel dielectric film 29, ferroelectric film 26, and buffer layer 25. A contact plug 31d is formed in the contact hole 30d. A contact plug 31s is formed in the contact hole 30s. The contact plugs 31d and 31s are made of, for example, polysilicon or tungsten.

An interlevel dielectric film (e.g., silicon oxide) 32 is formed on the interlevel dielectric film 29. Interconnection trenches are formed in the interlevel dielectric film 32. An interconnection 33d connected to the contact plug 31d and a source line 33(SL) connected to the contact plug 31s are formed in these interconnection trenches. The interconnection 33d and source line 33(SL) are made of tungsten, aluminum, or the like.

An interlevel dielectric film (e.g., silicon oxide) 34 is formed on the interlevel dielectric film 32, interconnection 33d, and source line 33(SL) to cover the interconnection 33d and source line 33(SL). A via hole reaching the interconnection 33d is formed in the interlevel dielectric film 34. An interlevel dielectric film (e.g., silicon oxide) 35 is formed on the interlevel dielectric film 34. An interconnection trench is formed in the interlevel dielectric film 35. A bit line 36(BL) is formed in this interconnection trench and connected to the interconnection 33d through the via hole. The bit line 36(BL) is made of, for example, aluminum.

A passivation film 37 is formed on the bit line 36(BL).

Figure 16:
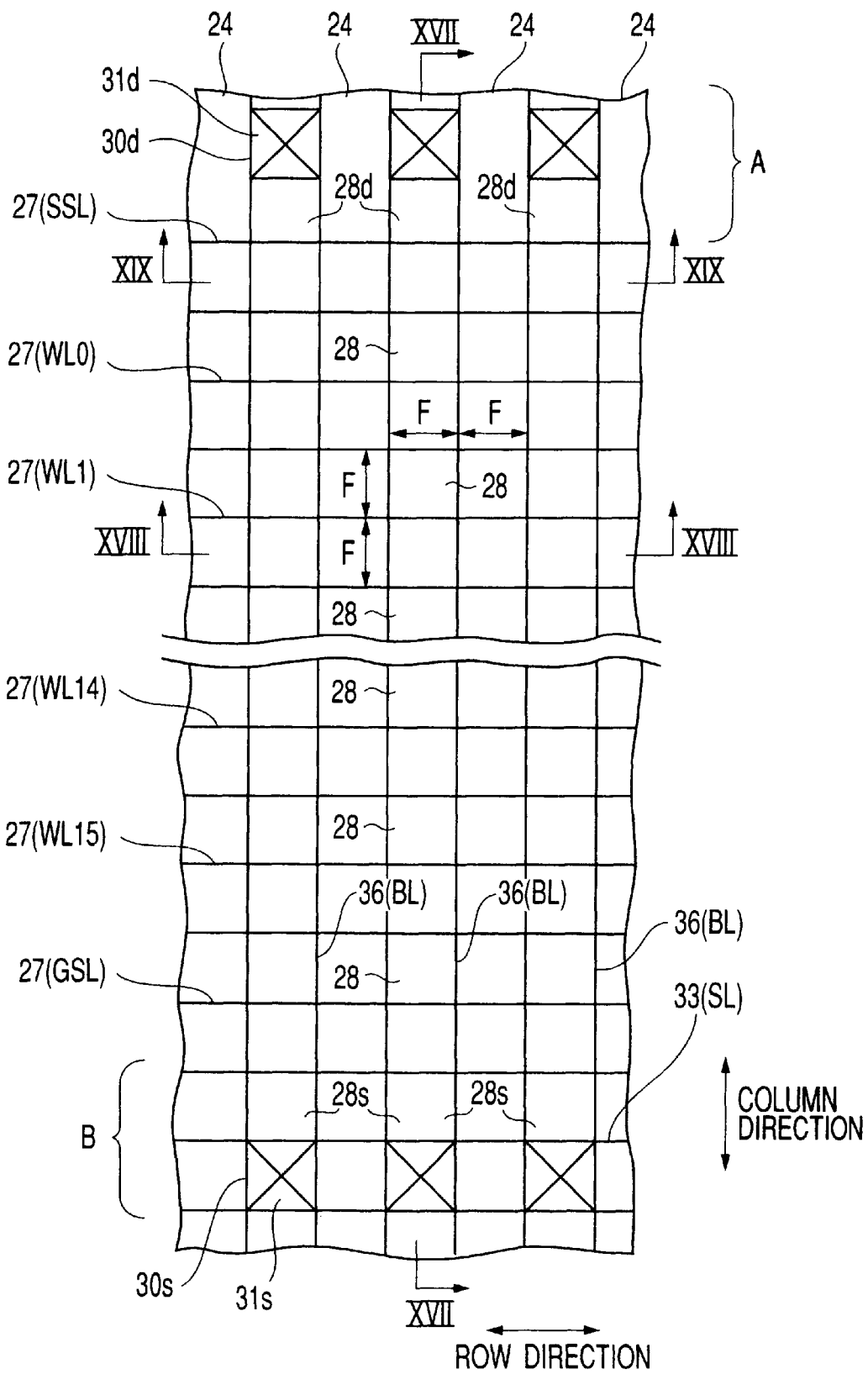
FIG. 16 is a plan view showing the second embodiment of the NAND Ferroelectric RAM according to the present invention.
Figure 17:
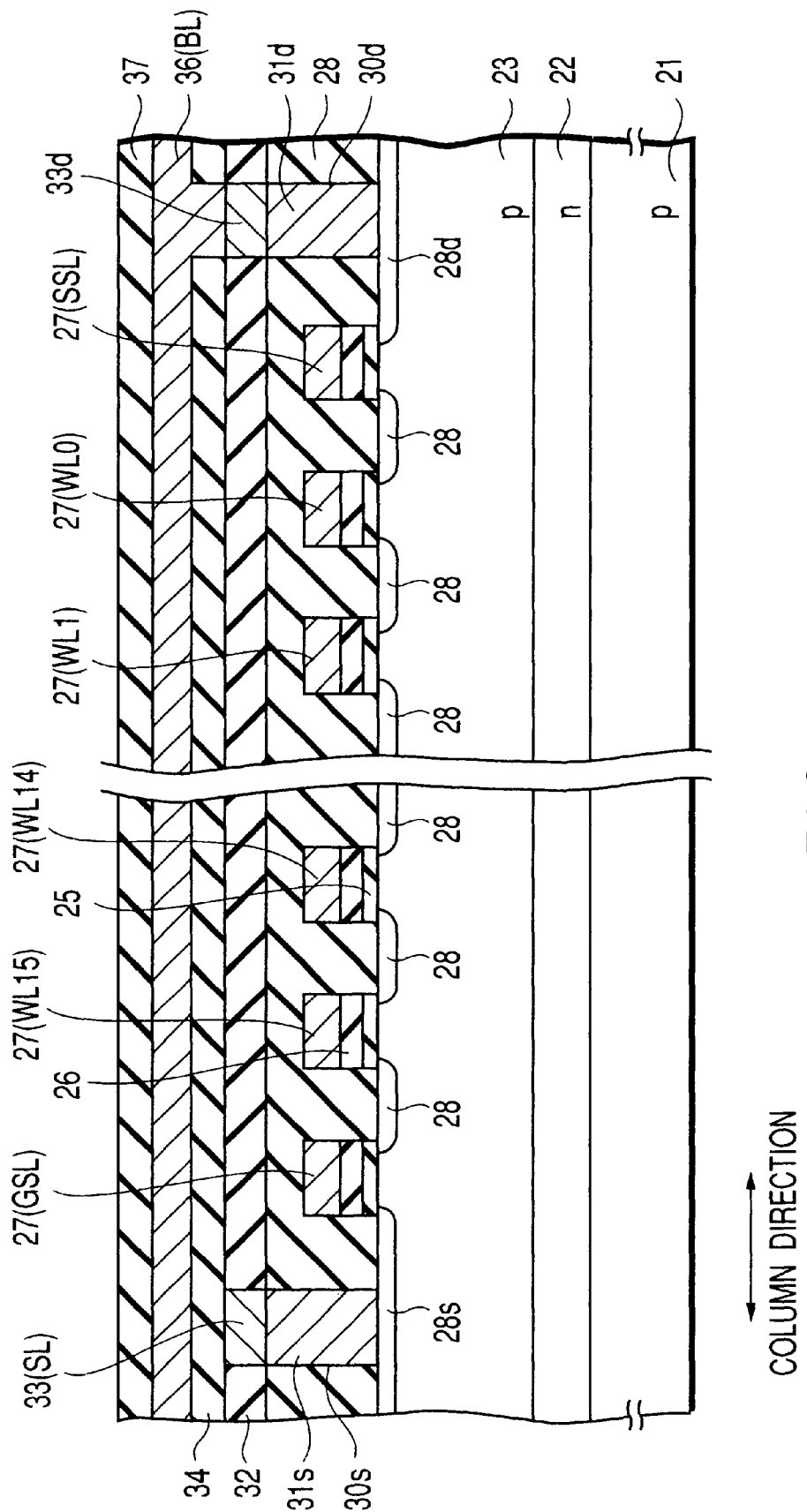
FIG. 17 is a sectional view taken along a line XVII—XVII in FIG. 16.

FIG. 16 is a plan view of the cell array structure of the ferroelectric memory according to the present invention. FIG. 17 is a sectional view taken along a line XVII—XVII in FIG. 16. FIG. 18 is a sectional view taken along a line XVIII—XVIII in FIG. 16.

FIG. 19 is a sectional view taken along a line XIX—XIX in FIG. 16.

Like the above cell array structure, characteristic features of this cell array structure are that a memory cell array is comprised of a set of NAND strings (or cell units) each consisting of plural series-connected memory cells, and only plural MFSFETs having substantially the same structure are connected in series between bit lines and source lines, with the two MFSFETs on the two ends functioning as select gate transistors, and the remaining MFSFETs functioning as memory cells constituting NAND strings.

The cell array structure of this embodiment includes the following characteristic feature unlike the above cell array structure.

In this embodiment, a ferroelectric film 26 is formed on the channel of each of memory cells and select gate transistors. More specifically, in the above embodiment (FIGS. 11 to 14), the ferroelectric film 26 is formed on the entire surface of the silicon substrate 21, and data are stored according to the polarization states of some portions of the ferroelectric film 26 (portions on channels). In this embodiment, the ferroelectric films 26 are formed on the channels of the respective transistors (memory cells and select gate transistors), and data are stored according to the polarization states of the ferroelectric films 26 provided for the respective transistors.

Note that the ferroelectric films 26 may be formed across element isolation layers 24. That is, the edge portions of the ferroelectric films 26 on the channels may overlap the element isolation layers 24.

The cell array structure of the ferroelectric memory according to the present invention will be described in detail below.

In a p-type silicon substrate 21, a so-called twin well constituted by an n-type well region 22 and p-type well region 23 is formed. A memory cell is formed in the p-type well region 23 of the twin well. Note that a memory cell may be directly formed in the silicon substrate 21 without forming any twin well therein. Alternatively, a memory cell may be formed in a general p-well formed in an n- or p-type silicon substrate.

The element isolation layers 24 having an STI (Shallow Trench Isolation) structure are formed in the silicon substrate 21. For example, the element isolation layers 24 are made of silicon oxide. The element isolation layers 24 linearly extend in the column direction, and have a regular striped shape as a whole. Both width and pitch (or the width of each element region) of each element isolation layer 24 are set to F (Feature size representing the minimum value of a design rule; ditto for the following description).

A buffer layer 25 is formed on the p-type well region (silicon substrate) 23 and element isolation layers 24. The ferroelectric films 26 are formed on the buffer layer 25. The buffer layer 25 is formed to prevent interdiffusion of atoms between the p-type well region (silicon substrate) 23 and the ferroelectric films 26. The ferroelectric films 26 are independently formed on the channels of the respective transistors (memory cells and select gate transistors).

In each MFSFET, a data value ("0" or "1") is determined according to the polarization state of the ferroelectric film 26 on the channel. If, therefore, the ferroelectric film 26 is present on each channel, the memory can function as a NAND Ferroelectric RAM.

That is, the above two embodiments (FIGS. 11 to 14, FIGS. 16 to 19) have different device structures, but the MFSFETs in the two embodiments have the same function.

Note that the cell array structure of the first embodiment (FIGS. 11 to 14) demands a smaller number of steps in the manufacturing process than the cell array structure of the second embodiment (FIGS. 16 to 19).

This will be described in detail in the description of a method of manufacturing an Ferroelectric RAM according to the present invention.

Gate electrodes 27 are formed on the ferroelectric films 26. The gate electrodes 27 linearly extend in the row direction and have a regular striped shape as a whole. For example, both width and pitch (excluding a drain contact portion A and source contact portion B) of each gate electrode 27 are set to F.

Source/drain regions 28 are formed on the surface of the p-type well region (silicon substrate) 23 at space portions between the gate electrodes 27. Drain regions 28d are formed on the surface of the p-type well region 23 at the drain contact portion A. Source regions 28s are formed on the surface of the p-type well region 23 at the source contact portion B.

In this embodiment, cell units, i.e., 18 MFSFETS, are connected in series between the drain region 28d and the source region 28s. These 18 MFSFETs have substantially the same structure and substantially the same characteristics. In this embodiment, however, one MFSFET located nearest to the drain region 28d and one MFSFET located nearest to the source region 28s function as select gate transistors. The 16 remaining MFSFETs serve as memory cells. That is, gate electrodes 27(SSL) and 27(GSL) become select gate lines, and gate electrodes 27(WL0), 27(WL1), . . . , 27(WL15) become word lines.

A method of making MFSFETs having the same structure function as select gate transistors or memory cells will be described in detail later in the description of the basic operation of the NAND Ferroelectric RAM.

The number of MFSFETs connected between the drain region 28d and the source region 28s is not specifically limited except for three or more. That is, it suffices if at least two select gate transistors and at least one memory cell are present between the drain region 28d and the source region 28s.

An interlevel dielectric film (e.g., silicon oxide) 29 is formed on the ferroelectric films 26 and gate electrodes 27 to completely cover the gate electrodes 27. The interlevel dielectric film 29 has a flat surface. A contact hole 30d reaching the drain region 28d and a contact hole 30d reaching the source region 28s are formed in the interlevel dielectric film 29, ferroelectric films 26, and buffer layer 25. A contact plug 31d is formed in the contact hole 30d. A contact plug 31s is formed in the contact hole 30s. The contact plugs 31d and 31s are made of, for example, polysilicon or tungsten.

An interlevel dielectric film (e.g., silicon oxide) 32 is formed on the interlevel dielectric film 29. Interconnection trenches are formed in the interlevel dielectric film 32. An interconnection 33d connected to the contact plug 31d and a source line 33(SL) connected to the contact plug 31s are formed in these interconnection trenches. The interconnection 33d and source line 33(SL) are made of tungsten, aluminum, or the like.

An interlevel dielectric film (e.g., silicon oxide) 34 is formed on the interlevel dielectric film 32, interconnection 33d, and source line 33(SL) to cover the interconnection 33d and source line 33(SL). A via hole reaching the interconnection 33d is formed in the interlevel dielectric film 34. An interlevel dielectric film (e.g., silicon oxide) 35 is formed on the interlevel dielectric film 34. An interconnection trench is formed in the interlevel dielectric film 35. A bit line 36(BL) is formed in this interconnection trench and connected to the interconnection 33d through the via hole. The bit line 36(BL) is made of, for example, aluminum.

A passivation film 37 is formed on the bit line 36(BL).

According to the cell array structures of the above two embodiments (FIGS. 11 to 14, FIGS. 16 to 19), plural (three or more) MFSFETs having substantially the same structure are connected in series between a bit line and a source line. Of these MFSFETS, the MFSFET located nearest to the bit line and the MFSFET located nearest to the source line function as select gate transistors, and the remaining MFSFETS function as memory cells.

That is, according to the cell array structure of each semiconductor memory of the present invention, in a NAND flash EEPROM (including a structure having one memory cell connected between two select gate transistors), the memory cells and select gate transistors are constituted by MFSFETs (NAND Ferroelectric RAM).

In this case, the following effects can be obtained.

① Reduction in Cell Size

Figure 9:
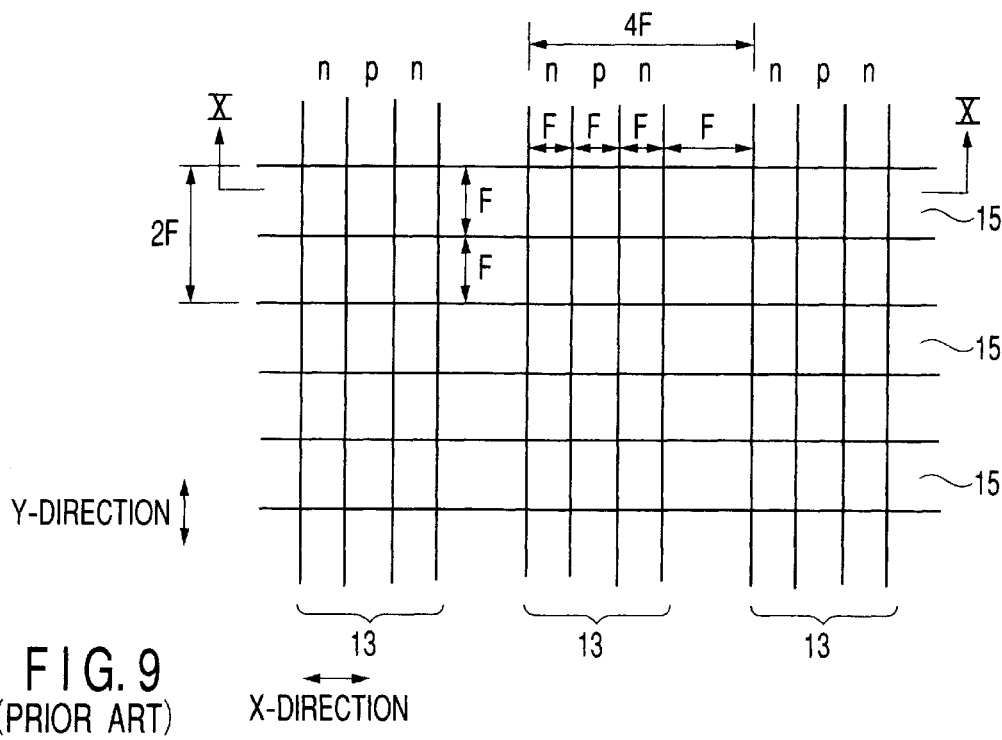
FIG. 9 is a plan view of a conventional Ferroelectric RAM.
Figure 10:
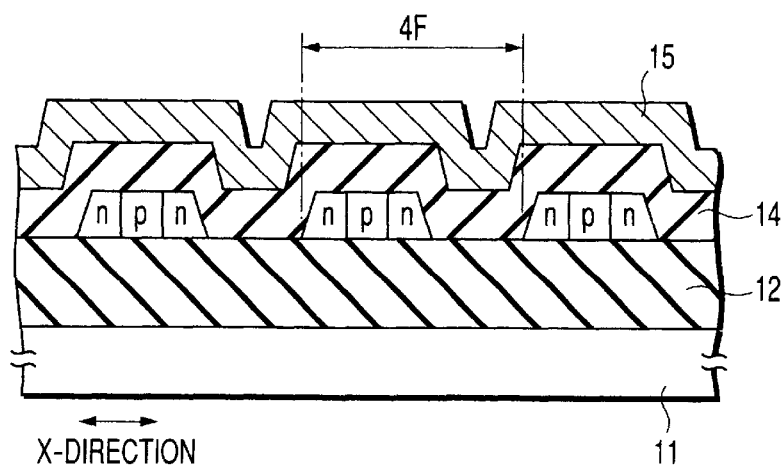
FIG. 10 is a sectional view taken along a line X—X in FIG. 9.

In the conventional Ferroelectric RAM (FIG. 9) having MFSFETs, if the interval between silicon stripes (element isolation width) is set to F (Feature size representing the minimum value of a design rule), the size (or bit line pitch) of each memory cell in the X-direction becomes 4F, and the size of each memory cell in the Y-direction (or word line pitch) becomes 2F. That is, the size of one memory cell is $8F^2$ (=4F×2F).

Figure 20:
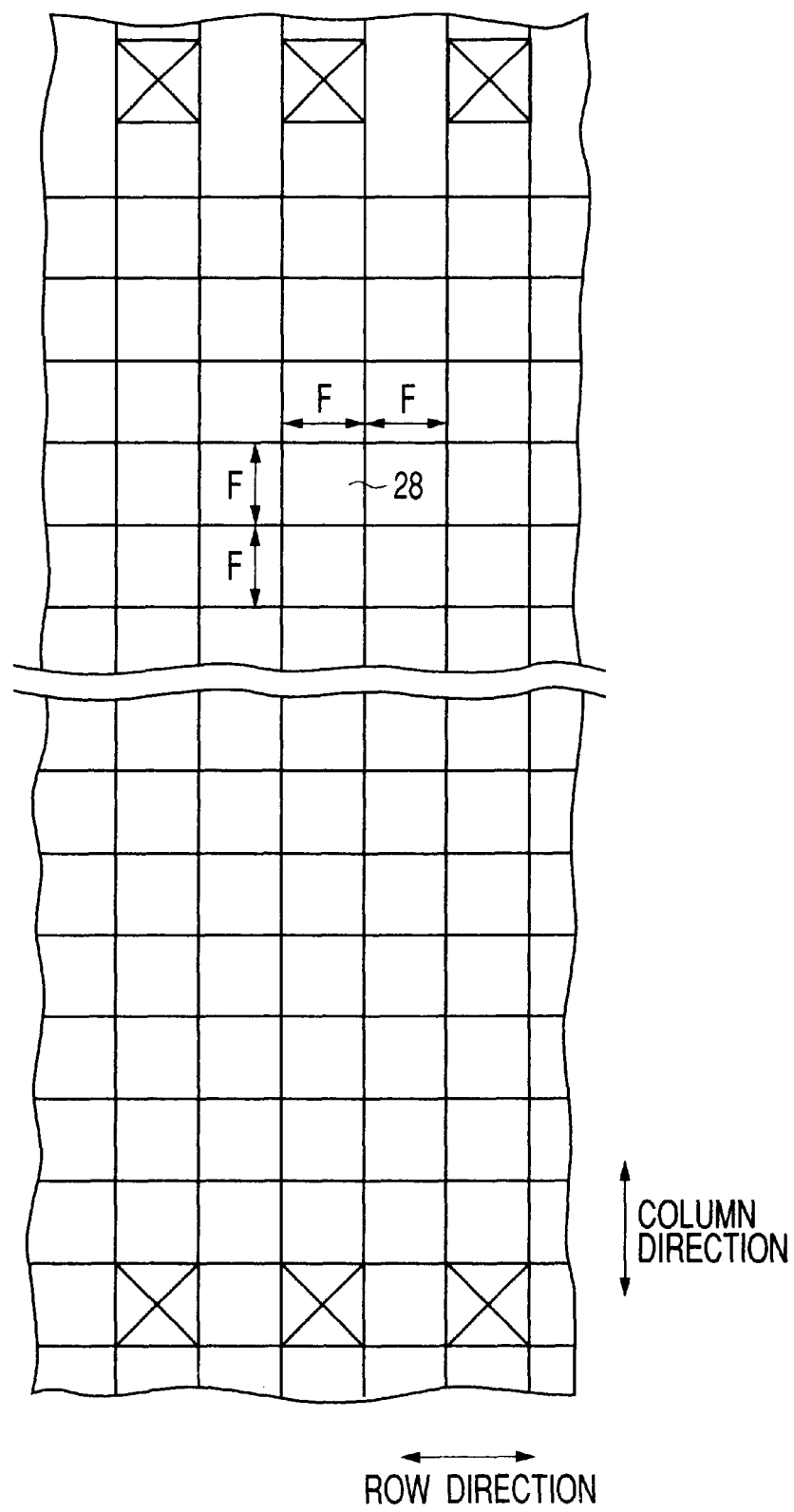
FIG. 20 is a plan view showing a NAND flash EEPROM.

In contrast to this, the cell size of a NAND Ferroelectric RAM can be considered almost equal to the cell size of a NAND flash EEPROM. This is because the layout of the cell array portion of an Ferroelectric RAM according to the present invention is substantially the same as that of a NAND flash EEPROM. FIG. 20 shows the layout of the cell array portion of a NAND flash EEPROM. This layout is substantially the same as that of each of the NAND Ferroelectric RAM shown in FIGS. 11 and 16.

More specifically, the size (or bit line pitch) of each memory cell in the X-direction is 2F, and the size (or word line pitch) of each memory cell in the Y-direction is 2F. The size of one memory cell is therefore $4F^2$ (=2F×2F). In addition, in the Ferroelectric RAM of the present invention, select gate transistors and contact portions (drain contact portion and source contact portion) are provided on the two ends of a NAND string. The actual cell size of the Ferroelectric RAM of the present invention is $4F^2+\alpha$ (an increase in area per cell due to select gate transistors and contact portions).

Assume that a NAND string is made up of 16 memory cells, and the memory capacity is 256 megabits. In this case, a is about $0.5F^2$. In this case, therefore, the size of one cell in the Ferroelectric RAM of the present invention is $4.5F^2$. This cell size is sufficiently smaller than the cell size ($8F^2$) of the conventional Ferroelectric RAM having MFSFETs.

As described above, the NAND Ferroelectric RAM of the present invention is suited to reducing the size of each memory cell, and hence can contribute to an increase in memory capacity and a reduction in chip size.

② Decrease in Re-write Voltage

It is known that the re-write voltage (program/erase voltage) in an NAND flash EEPROM is difficult to decrease. The reason for this difficulty will be briefly described. In a NAND flash EEPROM, the lateral size (design rule) of each memory cell can be reduced on the basis of the scaling law, but the longitudinal size (the thickness of a gate insulating film) of each memory cell cannot be reduced on the basis of the scaling law because of problems posed in the process technique.

More specifically, as the memory capacity increases from 16 megabits to 32, 64, and 256 megabits, the lateral size of each memory cell decreases, but the longitudinal size of each cell remains the same (e.g., the thickness of the gate oxide film is always set to about 10 nm). As a consequence, the voltage (write/erase voltage) required to output/input charge from/in each floating gate electrode cannot be decreased in accordance with an increase in memory capacity or a reduction in the lateral size of each memory cell.

In the NAND flash EEPROM, the write/erase voltage is also influenced by the ratio (coupling ratio) between a capacitance C1 between a control gate electrode and a floating gate electrode and a capacitance C2 between the floating gate electrode and the silicon substrate. More specifically, as the capacitance C1 increases (assuming that the capacitance C2 is constant), the voltage applied between the floating gate electrode and the silicon substrate occupies a larger proportion of the voltage (write/erase voltage) applied between the control gate electrode and the silicon substrate. As a consequence, the write/erase voltage can be decreased.

In order to increase the capacitance C1 (assuming that the material is not changed), however, the insulating film between the control gate electrode and the floating gate electrode must be thinned. That is, in order to decrease the write/erase voltage, the insulating film (gate insulating film) between the floating gate electrode and the silicon substrate must be thinned to facilitate outputting/inputting of charge from/to the floating gate electrode, or the insulating film between the control gate electrode and the floating gate electrode must be thinned to increase the capacitance C1.

In any case, a process technique for forming a thin insulating film (e.g., about 5 nm) with good film quality to decrease the write/erase voltage is required. Unless such a technique is developed, it is difficult to decrease the write/erase voltage (the write/erase voltage in current use is as high as about 20V).

In contrast to this, the NAND Ferroelectric RAM of the present invention uses MFSFETs as memory cells. Each MFSFET stores data as the polarization state of the ferroelectric film, the voltage (critical voltage) required to cause polarization inversion in the ferroelectric film will suffice as a re-write voltage. This critical voltage is sufficiently lower than the voltage required to output/input charge from/to the floating gate electrode using a tunnel effect or hot electrons. More specifically, a voltage of about several V (e.g., about 5V) will suffice as a write/erase voltage.

According to the NAND Ferroelectric RAM of the present invention, therefore, a decrease in write/erase voltage can be attained.

③ Reduction in Chip Size (Facilitation of Layout of Word Line Driving Circuit)

In the NAND flash EEPROM, as described in ②, it is difficult to decrease the write/erase voltage, and a high write/erase voltage of about 20V is required. This NAND flash EEPROM therefore needs to have a voltage generating circuit (booster) for generating a high write/erase voltage, and a word line driving circuit for applying this write/erase voltage to each word line must be formed by using a high breakdown voltage transistor.

In general, the size of a high breakdown voltage transistor is larger than that of a general transistor (to which no high voltage is applied). For example, in the case of a 256-megabit NAND flash EEPROM designed by the 0.25 $\mu$m rule, the size (design rule) of a high breakdown voltage transistor is several times larger than the size (design rule) of a general transistor. An increase in the size of the high breakdown voltage transistor can weaken the electric field produced by a high voltage, thus preventing breakdown in the transistor.

As the size of the high breakdown voltage transistor increases, however, the area of the row decoder or word line driving circuit increases. In addition, since the row decoder and word line driving circuit are provided for each block of memory cell arrays, an increase in the sizes of these components will increase the areas occupied by the row decoder and word line driving circuit on the memory chip. As a consequence, the chip size increases. Furthermore, since the chip size cannot be increased without limitation, an increase in the areas occupied by the row decoder and word line driving circuit is disadvantageous in terms of an increase in memory capacity.

Figure 21:
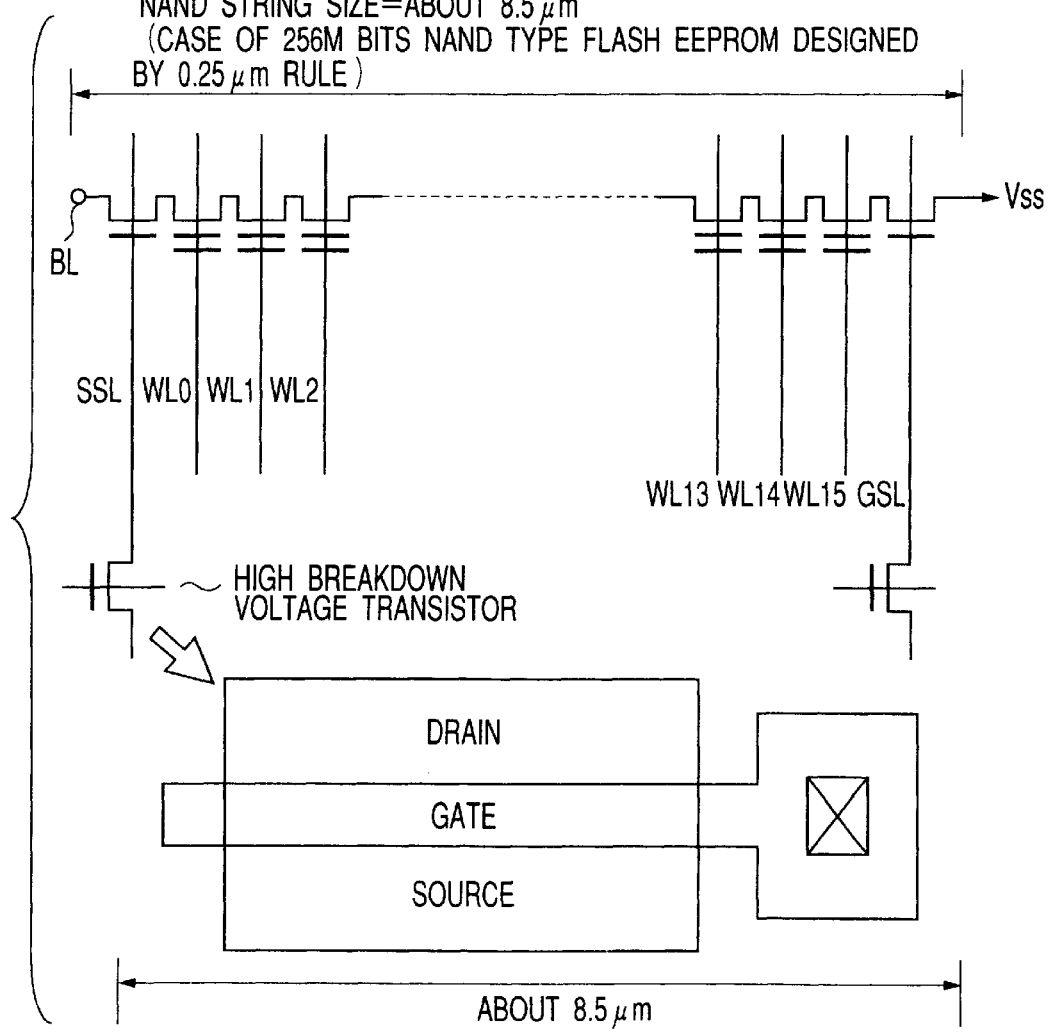
FIG. 21 is a view for comparing the size of a NAND string with the size of a high breakdown voltage transistor.

More specifically, assume that in a NAND flash EEPROM having a memory capacity of 256 megabits and designed by the 0.25 $\mu$m rule, one NAND string is made up of 16 memory cells and two select gate transistors. In this case, as shown in FIG. 21, the pitch of NAND strings is about 8.5 $\mu$m. In this NAND flash EEPROM, the size of a high breakdown voltage transistor, e.g., the length in the gate width direction, is 8 to 9 $\mu$m. Therefore, only one high breakdown voltage transistor can be disposed within the pitch of NAND strings. This makes it very difficult to lay out row decoders and word line driving circuits.

In a next-generation 1-gigabit NAND flash EEPROM, for example, the 0.15 $\mu$m design rule is applied to each memory cell. In this case, if one NAND string is made up of 16 memory cells and two select gate transistors, the pitch of NAND strings becomes about 5 $\mu$m. The size of each high breakdown voltage transistor cannot be reduced to ensure reliability even if each memory cell is reduced in size. For example, the length in the gate width direction is kept to 8 to 9 $\mu$m. Therefore, no high breakdown voltage transistor can be disposed within the pitch of NAND strings, and row decoders and word line driving circuits cannot be laid out.

To lay out row decoders and word line driving circuits, the number of memory cells constituting one NAND string may be increased. That is, if the number of memory cells in each NAND string increases, the pitch of NAND strings increases, and a high breakdown voltage transistor can be accommodated within the pitch of NAND strings. If, for example, the number of memory cells in one NAND string is increased from 16 to 32, the pitch of NAND strings is almost doubled.

A characteristic feature of a NAND flash EEPROM is that the data in plural memory cells are simultaneously erased in units of erase blocks. The erase block size (the number of memory cells from which data are simultaneously erased) is proportional to the number of memory cells constituting each NAND string. Therefore, to increase the number of memory cells constituting each NAND string is to increase the erase block size. According to the history of the development of NAND flash EEPROMs, every time the memory capacity increases, the number of memory cells in each NAND string increases, and the erase block size increases.

More specifically, the erase block size of a 16-megabit NAND flash EEPROM is four kilobytes; the erase block size of a 32-megabit NAND flash EEPROM, eight kilobytes; and the erase block size of a 256-megabit NAND flash EEPROM, 16 kilobytes.

Recently, however, many users do not want an increase in erase block size. For example, a user using a NAND flash EEPROM as the memory of a digital camera does not want an abrupt change (increase) in erase block size to maintain compatibility between old and new products.

Under the circumstances, in a next-generation 1-gigabit NAND flash EEPROM, there is a need to set its erase block size to 16 kilobytes as in a 256-megabit NAND flash EEPROM.

Figure 22:
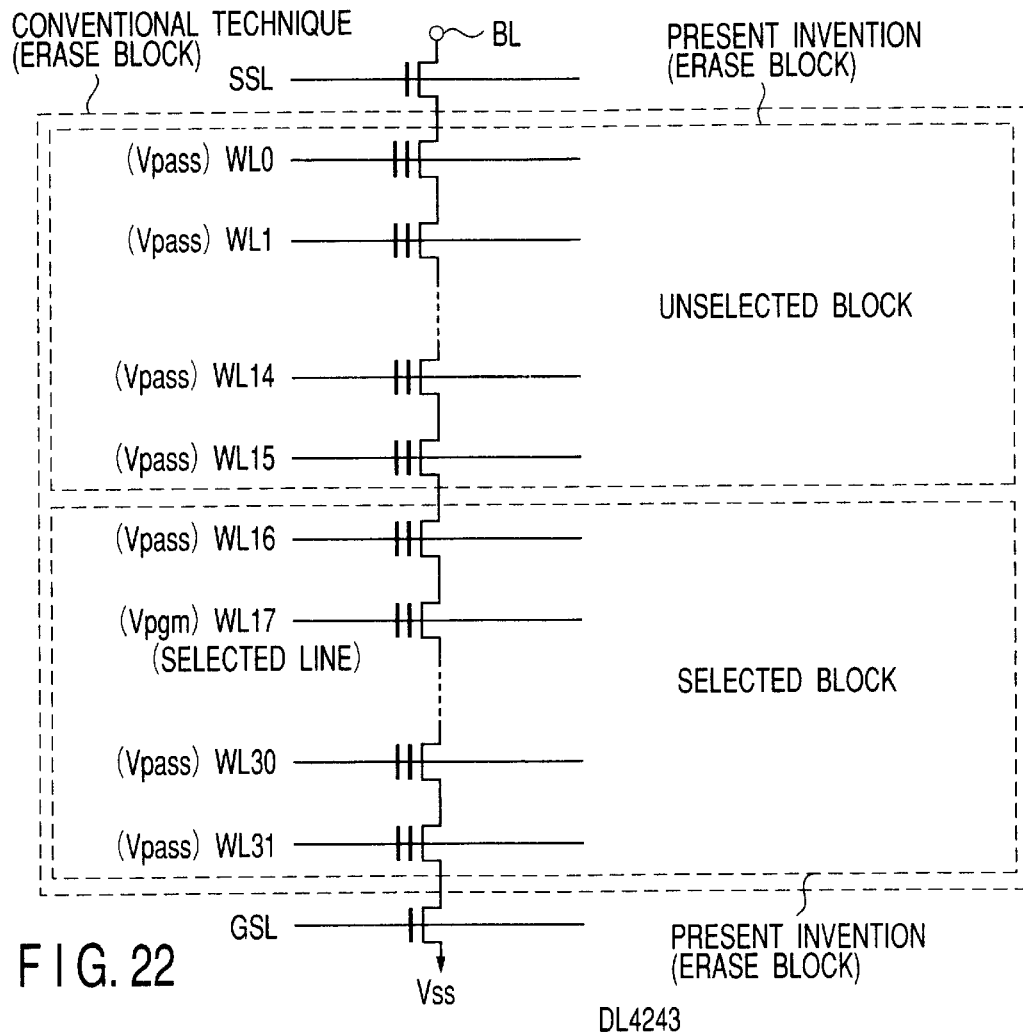
FIG. 22 is a view showing blocks in the present invention and a block in the prior art in comparison with each other.

As a technique of laying out row decoders and word line driving circuits without increasing the erase block size, a technique of reducing the erase block size by dividing each memory cell in a NAND string into two parts in terms of operation is available. Consider a 1-gigabit NAND flash EEPROM. For example, as shown in FIG. 22, the number of memory cells constituting each NAND string is 32. In this case, according to the conventional scheme, the erase block size is 32 kilobytes. In contrast to this, in this scheme, the erase block size remains 16 kilobytes (as in a 256-megabit NAND EEPROM).

In this case, however, if the data in the memory cells in one erase block (selected block) are re-written (cell data are changed) repeatedly, a predetermined voltage stress Vpass is applied to the memory cells in the other erase block (unselected block) during this re-write operation (program/erase operation). If, therefore, the number of re-write (write/erase) cycles increases, the threshold value of the memory cells in the unselected block gradually changes. In the worst case, the data in the memory cells in the unselected block may be inverted.

The technique of dividing each memory cell in the NAND string in FIG. 22 into two parts in terms of operation is not therefore practical.

As described above, as for a 1-gigabit NAND flash EEPROM, the problem of how to determine the layout of row decoders and word line driving circuits without increasing the erase block size (keeping 16 kilobytes) still remains unsolved. Unless this problem is solved, a 1-gigabit NAND flash EEPROM does not become feasible.

In contrast to this, according to the NAND Ferroelectric RAM of the present invention, as described in ②, the write/erase voltage can be decreased (to about 5V). In the NAND Ferroelectric RAM, therefore, there is no need to use a voltage generating circuit (booster) for generating a write/erase voltage, and a word line driving circuit for applying the write/erase voltage to each word line can be formed by using general transistors.

This memory can therefore contribute to a reduction in chip size without increasing the sizes of row decoders and word line driving circuits. In addition, since no high breakdown voltage transistor is required, for example, in a 1-gigabit NAND flash EEPROM, a layout of row decoders and word line driving circuits can be easily determined without increasing the erase block size (keeping 16 kilobytes) and applying the voltage stress Vpass to the memory cells in the unselected block.

According to the NAND Ferroelectric RAM of the present invention, since the write/erase voltage can be decreased, for example, the width of each element isolation region for ensuring electric isolation between memory cells can be decreased. The voltage (breakdown voltage) at which insulation between two memory cells that must be electrically isolated from each other cannot be ensured is proportional to the width of each element isolation region. In this case, decreasing the write/erase voltage means that a low breakdown voltage can be set. As a consequence, the width of each element isolation region can be decreased. This is also advantageous in reducing the chip size.

④ Simplification of Cell Array Structure and Manufacturing Process

In a NAND flash EEPROM, one select gate transistor must be connected to each of the two ends (bit line side and source line side) of an array of series-connected memory cells. These select gate transistors are used to raise the potential of the channels of memory cells in a NAND string including non-write cells ("1"-programming cells) in a selected block to a program inhibit potential in write (program) operation.

More specifically, in a selected block, at the time of program operation, first of all, all the select gate transistors on the source line side are turned off, and a power supply potential VCC is applied to the gate of the select gate transistor and all word lines on the bit line side. A ground potential VSS is then applied to the channels of memory cells in the NAND string including write cells ("0"-programming cells), and an initial potential (e.g., the power supply potential VCC) is applied from the bit line to the channels of the memory cells in the NAND string including non-write cells ("1"-programming cells).

At this time, the channels of the memory cells in the NAND string including the non-write cells ("1"-programming cells) are precharged to VCC–Vth (the threshold value of the select gate transistor), and the select gate transistor on the bit line side in the NAND string is cut off.

Subsequently, in the selected block, when, for example, the potential of the selected word line is raised to a program potential Vprog, and the potential of each unselected word line is raised to a transfer potential Vpass, the potential of the channel of each memory cell in the NAND string including non-write cells ("1"-programming cells) is raised to the program inhibit potential owing to the capacitive coupling between the word line and the channel.

As described above, the two select gate transistors in the NAND string play an important role in setting the channels of memory cells in a floating state and generating a program inhibit potential by capacitive coupling in program operation.

In program operation, the power supply potential VCC is applied to the gate of each select gate transistor to apply the ground potential VSS to the channel of each memory cell in the NAND string including write cells ("0"-programming cells). For each select gate transistor, therefore, a positive voltage (e.g., about 0.7V) lower than (VCC–VSS)/2 needs to be a threshold value. For this reason, each select gate transistor demands additional processes. For example, each select gate transistor is formed in a process different from that for memory cells, and ion implantation for threshold value controlling operation is performed for a channel portion before the formation of a gate electrode.

If, however, memory cells and select gate transistors are formed in different processes, the manufacturing process is prolonged and complicated. In addition, since the number of heating steps increases, a deterioration in reliability occurs.

A current NAND flash EEPROM therefore has a so-called stack gate structure, in which each memory cell and each select gate transistor are formed by stacking two polysilicon layers, and memory cells and select gate transistors are formed in the same manufacturing process.

In a NAND flash EEPROM, however, a memory cell and select gate transistor do not have the same structure, and also differ in function and performance. For example, as is known well, each memory cell of a NAND flash EEPROM has a floating gate electrode and control gate electrode (word line), whereas a select gate transistor has no floating gate electrode. Each select gate transistor uses, for example, a two-layer polysilicon structure is used as a gate electrode (select gate line), and shunt areas for connecting the upper and lower polysilicon layers are formed at predetermined intervals.

The purpose of the shunt areas is to decrease the resistance of each select gate line. In general, the resistivity of the first polysilicon layer (lower layer) is higher than that of the second polysilicon layer (upper layer) (or a multilayer structure consisting of a polysilicon layer and a silicide layer). For this reason, shut areas are formed at predetermined intervals (e.g., intervals of 32 columns) to reduce the resistance of each select gate line.

In each shunt area, however, the upper and lower silicon layers are exposed and are electrically connected to each other with a low-resistance material such as aluminum, resulting in an increase in layout area. For example, in a 256-megabit NAND flash EEPROM designed by the 0.25 μm rule, the distance between two select gate lines sandwiching a bit line contact portion is limited to the size of each shunt area and cannot be reduced more.

In contrast to this, in the NAND Ferroelectric RAM of the present invention, the memory cells and select gate transistors have substantially the same structure and substantially the same function and characteristic features. Both memory cell and select gate transistor are formed by using MFSFETs. In actual operation (to be described later), however, each memory cell is made to function as a memory cell and each select gate transistor is made to function as a select gate transistor by controlling the polarization states of ferroelectric films.

In the NAND Ferroelectric RAM of the present invention, therefore, memory cells and select gate transistors can be simultaneously formed in the same manufacturing process, and hence the manufacturing process is simplified. In the NAND flash EEPROM, if each select gate transistor has a stack gate structure, each memory cell and select gate transistor can be partly formed in the same process. However, this memory requires a slit formation process for forming a floating gate electrode, a process for forming shunt areas, and the like, and hence each select gate transistor and memory cell cannot be formed completely in the same process unlike the NAND Ferroelectric RAM.

In the NAND Ferroelectric RAM of the present invention, since each select gate transistor is formed by using an MFSFET (having no stack gate structure), there is no need to form shunt areas. Therefore, the distance between two select gate lines sandwiching a bit line contact portion can be reduced to about the distance between word lines on the basis of the scaling law.

As described above, according to the NAND Ferroelectric RAM of the present invention, the cell array structure is simplified to contribute to a reduction in the size of each memory cell, an increase in packing density, and simplification of the manufacturing process.

⑤ Unnecessariness of Program Verify

One of the important characteristic features of the NAND Ferroelectric RAM of the present invention is that no program verify is required.

In a memory cell array having memory cells connected in a NAND form (NAND flash EEPROM), a write (program) is performed in units of pages (rows). However, since write characteristics vary depending on memory cells, one program operation may sufficiently increase the threshold values of some memory cells to complete "0"-programming, whereas even several program operations may not sufficiently increase the threshold values of other memory cells, resulting in incomplete "0"-programming.

If, therefore, write (program) operation is performed for all memory cells under the same condition, the threshold values of some memory cells may exceed the pass voltage applied to an unselected word line in read operation (over program) upon completion of the write of all the memory cells. As a consequence, each unselected cell is turned off in read operation which must be ON, and hence data cannot be accurately read out from the selected cell (a NAND cell has the problem of over program like a NOR cell having the problem of over erase).

Program verify operation is therefore indispensable to the NAND flash EEPROM. In this operation, after write (program) operation is performed, it is checked whether the write ("0"-programming) is completed. In addition, re-write is performed for only cells that are determined as NG (write incomplete) cells by the program verify, thereby preventing over program in memory cells (so-called bit-by-bit verify).

The basic operation of the NAND flash EEPROM will be described below for reference.

For example, as NAND flash EEPROMs, those disclosed in the following references are known:

reference 4 (K. -D. Suh et al., "A 3.3V 32 Mb NAND flash Memory with Incremental Step Pulse Programming Scheme" IEEE J. Solid-State Circuits, vol. 30, pp. 1149–1156, November 1995), and reference 5 (Y. Iwata et al., "A 35 ns Cycle Time 3.3V Only 32 Mb NAND flash EEPROM" IEEE J. Solid-State Circuits, vol. 30, pp. 1157–1164, November 1995).

Since the basic operation of the NAND flash EEPROM is described in detail in reference 4, the basic operation disclosed in reference 4 will be briefly described below.

Figure 23:
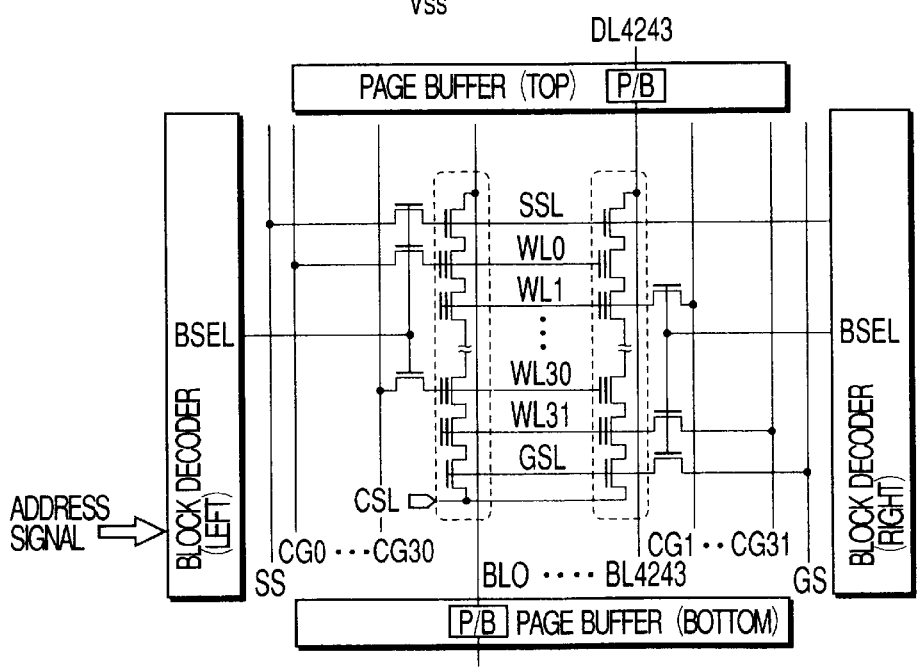
FIG. 23 is a view showing a circuit that forms the cell array portion of a memory.
Figure 24:
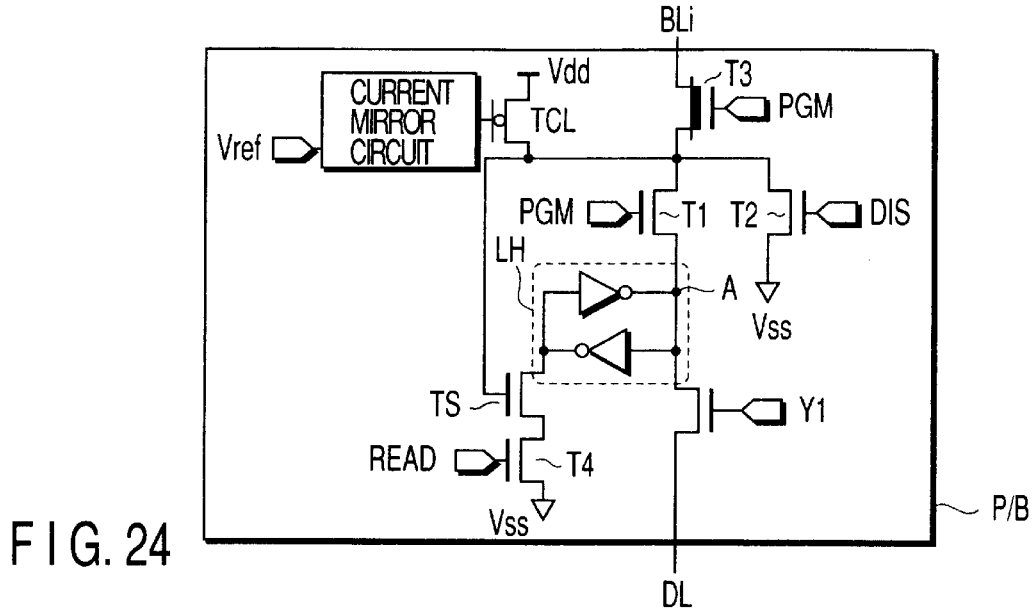
FIG. 24 is a view showing the details of a page buffer in FIG. 23.
Figure 25:
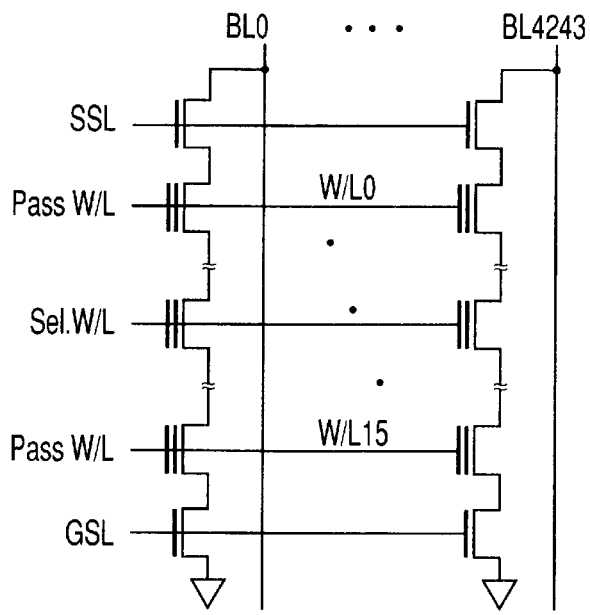
FIG. 25 is a view showing potentials applied to memory cells and select gate transistors.

Note that a memory cell array portion is formed by a circuit like the one shown in FIGS. 23, 24, and 25. In this case, memory cells and select gate transistors are biased in the respective operations, i.e., erase operation (Erase), read operation (Read), and write operation (program), in the manner indicated by Table 1.

TABLE 1

|         | ERASE | READ  | PROGRAM   |
|---------|-------|-------|-----------|
| Sel.W/L | 0     | 0     | 15.5~20 V |
| PassW/L | 0     | 4.5 V | 10 V      |
| SSL     | F     | 4.5 V | Vcc       |
| GSL     | F     | 4.5 V | 0         |
| "0" B/L | F     | 1.8 V | 0         |
| "1" B/L | F     | 0.7 V | Vcc       |
| Bulk    | 21 V  | 0     | 0         |

F: Floating

Reference symbol BSEL denotes a block select signal; WL0, . . . , WL15, word lines; BL0, . . . , BL4223, bit lines; SSL, a select gate line on the bit line side; GSL, a select gate line on the source line side; Sel. W/L, a selected word line in a selected block; Pass W/L, an unselected word line in the selected block, "0" B/L, a bit line to which a memory cell that is to perform "0"-programming is connected; "1" B/L, a bit line to which a memory cell that is to perform "1"-programming is connected; and Bulk, a substrate (channel).

Erase Operation

In erase operation, first of all, all the word lines WL0, . . . , WL15 are set to the ground potential Vss (Sel. W/L, Pass W/L=0V). Thereafter, the block select signal BSEL in the selected block is set at "H (e.g., the power supply potential Vcc)", and the block select signal BSEL in each unselected block is maintained at "L (ground potential Vss)".

The word lines WL0, . . . , WL15 in the selected block are maintained at the ground potential Vss, and the word lines WL0, . . . , WL15 in each unselected block are set in the floating state at the ground potential Vss.

Subsequently, an erase pulse (e.g., 21V, 3 ms) is supplied to a bulk (e.g., cell p-well) Bulk. As a result, in the selected block, an erase voltage (21V) is applied to the bulk Bulk and the word lines WL0, . . . , WL15, and charges (electrons) in the floating gate electrodes move to the bulk owing to an F-N (Fowler-Nordheim) tunnel current.

In a NAND flash EEPROM, since no problem arises in terms of over erase, the data in the memory cells in a selected block can be sufficiently erased up to about −3V by one erase pulse, unlike a NOR flash EEPROM.

In each unselected block, when an erase pulse is supplied to the bulk, the potential of the word lines WL0, . . . , WL15 are simultaneously raised by capacitive coupling between the word lines WL0, . . . , WL15 and the bulk. For this reason, an erase voltage high enough to cause an FN tunnel effect is not applied between the word lines WL0, . . . , WL15 and the bulk, and the data in the memory cells in the unselected block are not erased.

The coupling ratio between the word lines WL0, . . . , WL15 and the bulk will be examined.

The coupling ratio is calculated from the capacitance produced in the word lines WL0, . . . , WL15 in the floating state. Assume that the word lines WL0, . . . , WL15 in the floating state are connected to the source of a MOS transistor controlled by the block select signal BSEL, and the source and the word lines WL0, . . . , WL15 are connected to each other through metal interconnections.

In this case, the coupling ratio is determined by the junction capacitance of the source of the MOS transistor controlled by the block select signal BSEL, the overlap capacitance between the source and gate of the MOS transistor, the capacitance (the capacitance in the field region, in particular) produced in the metal interconnections connecting the source of the MOS transistor and the word lines WL0, . . . , WL15, the capacitance produced between the word lines (polysilicon layers) WL0, . . . , WL15 and the bulk (cell-p well), and the like.

Of these capacitances, the capacitance produced between the word lines WL0, . . . , WL15 and the bulk, in particular, greatly influences the coupling ratio. The coupling ratio obtained from an experimental result is about 0.9. when, therefore, an erase pulse is supplied to the bulk, the potential of the word lines WL0, . . . , WL15 sufficiently rises, the occurrence of an FN tunnel current is prevented.

In erase verify operation, for example, it is verified whether the threshold values of all the memory cells in a s elected block become −1V or less. Erase operation is repeatedly executed until the threshold values of all the memory cells become −1V or less. If the threshold values of all the memory cells in the selected block do not become −1V or less after a predetermine d number of erase operations, erase NG is determined, and the erase operation is terminated.

In the NAND flash EEPROM, as described above, no problem arises in term of over erase, it suffices if the threshold values of memory cells are set to a predetermined value (upper limit) or less. The lower limit of the threshold value of each memory cell does not exit. Therefore, erase verify need not be performed in units of bits (bit-by-bit verify need not be performed).

Read Operation

Read operation is performed by continuously output data, for example, bit by bit from a page buffer after simultaneously transferring the data in memory cells corresponding to one page (one row) to the latch circuit of the page buffer.

Figure 26:
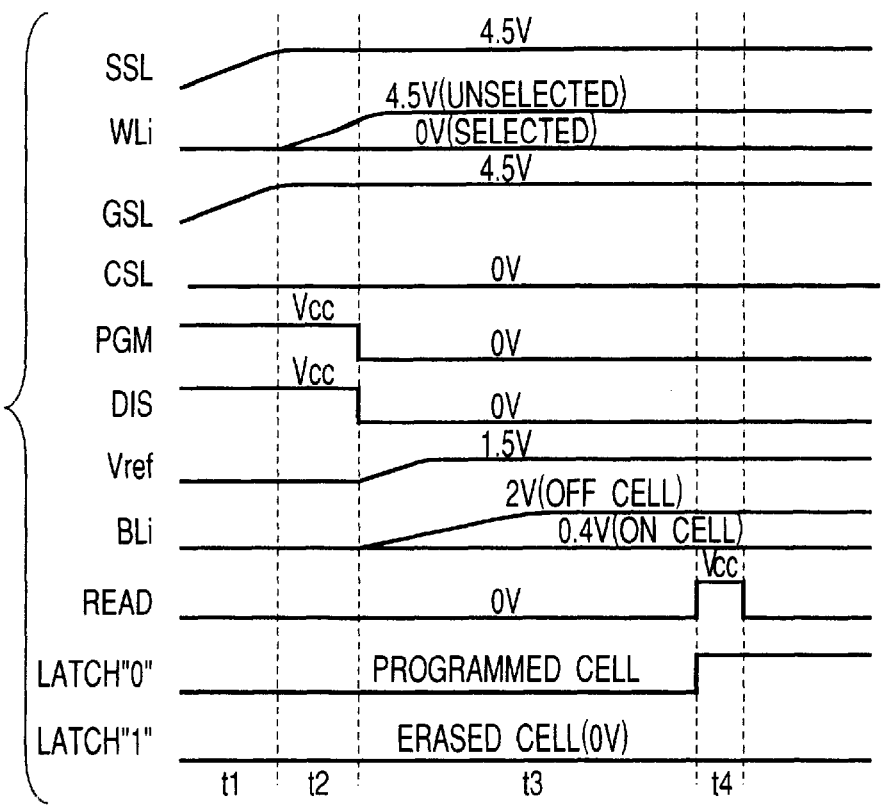
FIG. 26 is a view showing the waveforms of signals in read operation.

FIG. 26 shows the operating waveforms of main signals in read operation.

First of all, page buffers P/B are initialized to "0". That is, since signals PGM and DIS are at the power supply potential Vcc, nodes A of latch circuits LH in all the page buffers P/B are short-circuited to a ground point GND through MOS transistors T1 and T2. As a consequence, the value of each node A is set to "0" (Latch "0"="0", LATCH "1"="0"). In addition, all the bit lines BL0, . . . , BL4243 are set to the ground potential Vss, and all the word lines WL0, . . . , WL15 are set to the ground potential Vss. The select gate lines SSL and GSL are set to about 4.5V (time t1).

Subsequently, the unselected word lines Pass W/L in the selected block are set to about 4.5V, and the selected word line Sel. W/L in the selected block is maintained at the ground potential Vss (time t2).

The potential of about 4.5V applied to the unselected word line Pass W/L is determined on condition that it is higher than the threshold value of an erase cell ("1"-programming cell) and the threshold value of a "0"-programming cell. That is, in read operation, the unselected memory cells connected to the unselected word lines Pass W/L are turned on regardless of the value of data ("1" or "0"), i.e., function as so-called pass transistors.

The selected word line Sel. W/L is set to the ground potential (0V) Vss. The threshold value of each memory cell (erase cell) in which data "1" is stored is set to a negative value, and the threshold value of each memory cell (write cell) in which "0" is stored is set to a positive value. Each memory cell connected to the selected word line Sel. W/L is turned on when the data is "1"(erase cell), and turned off when the data is "0" (write cell).

A bit line BLi to which the data in each erase cell ("1"-programming cell) is read out is electrically connected to the source line (ground potential Vss) through a NAND string. The bit line BLi to which the data in each write cell ("0"-programming cell) is read out is-disconnected from the source line to be set in an open state (one end is electrically connected to nowhere).

Subsequently, PGM and DIS change from the power supply potential Vcc to the ground potential Vss, and Vref changes from 0V to about 1.5V (time t3). At this time, the MOS transistors T1 and T2 are turned off, and the node A of the latch circuit LH of the page buffer P/B is disconnected from the ground point GND. In addition, the current mirror circuit is activated by Vref, and a load current of about 2 $\mu$A flows in a MOS transistor TCL.

A MOS transistor T3 is of a depletion type, and hence is ON even when PGM is at 0V.

In the page buffer connected to the bit line BLi to which the data in an erase cell ("1"-programming cell) is read out, this load current flows to the ground point GND, and the potential of the bit line BLi decreases (to about 0.4V). For this reason, a sensing MOS transistor TS is turned off. In the page buffer connected to the bit line BLi to which the data in a write cell ("0"-programming cell) is read out, since the bit line BLi is in the open state, the potential of the bit line BLi increases (to about 2V). For this reason, the MOS transistor TS is turned on.

When READ changes from 0V to the power supply potential Vcc afterward, a MOS transistor T4 is turned on, and hence the data in the latch circuit LH is determined in accordance with the potential of the bit line BLi (time t4).

More specifically, since the potential of the bit line BLi to which the data in an erase cell ("1"-programming cell) is read out is at a low level (about 0.4V), the MOS transistor TS in the page buffer connected to the bit line BLi is OFF. Even if, therefore, READ is set at the power supply potential Vcc to turn on the MOS transistor T4, the data in the latch circuit LH (the value at the node A) remains "0".

Since the potential of the bit line BLi to which the data in a write cell ("0"-programming cell) is read out is at a high level (about 2V), the MOS transistor TS in the page buffer connected to the bit line BLi is ON. When, therefore, READ is set at the power supply potential Vcc to turn on the MOS transistor T4, the data in the latch circuit LH (the data at the node A) is inverted to "1".

In this manner, the data in memory cells corresponding to one page (one row) are simultaneously transferred to the latch circuits of the page buffers and latched. Thereafter, Y1 is controlled for each page buffer P/B to transfer, for example, the data in the latch circuit LH in the selected page buffer to a data line DL.

Program Operation

In program operation, first of all, programming data is loaded. Loading of the programming data is completed by serially and continuously inputting the programming data into the memory chip and latching the programming data in the latch circuits in all or plural page buffers.

When "0"-programming is to be performed for a selected cell, data "0" is latched in the latch circuit LH (node A="0"). When "1-programming is to be performed for a selected cell, data "1" is latched in the latch circuit LH (node A="1").

Subsequently, 1-page data are simultaneously written in 1-page selected cells. This write is repeated until "0"-programming is completed for selected cells for which "0"-programming is to be performed. If, however, "0"-programming is not completed for any selected cell even after a predetermined number of write operations, write NG is determined, and the program operation is terminated.

One write cycle is constituted by write (program) operation and program verify operation. In program operation, a program pulse is supplied to a selected word line. In program verify operation, it is verified whether the threshold value of a selected cell for which "0"-programming is to be performed has fallen within a predetermined range. In program verify operation, in particular, bit-by-bit verify is executed to prevent over program.

More specifically, program operation is comprised of the following steps. Assume that one write cycle completes in about 40 $\mu$s.

a. Setup for Bit line (about 8 $\mu$s)

In this step, the potential of a bit line is set up in accordance with the data in the latch circuit in a page buffer. If, for example, "0"-programming is performed for a selected cell, since the data in the latch circuit becomes "0", the level of the bit line BLi is set at Vss (write execution level). If "1"-programming (maintenance of an erase state) is performed for a selected cell, since the data in the latch circuit becomes "1", the level of the bit line BLi is set at Vcc (write inhibit level).

b. Data Write (about 20 $\mu$s)

GSL and SSL are set at the ground potential Vss and power supply potential Vcc, respectively, to transfer the potential of a bit line to the channels of memory cells constituting a NAND string in a selected block. At this time, the channel of a selected cell (program execution cell) for which "0"-programming is to be executed is set at the ground potential (equal to the potential of the bit line) Vss, and the channel of a selected cell (program inhibit cell) for which "1"-programming is to be executed is charged to Vcc–Vth and then set in the floating state. Thereafter, in the selected block, a pulse-like program potential (15.5 to 20V) is applied to one selected word line Sel. W/L, and a transfer potential (about 10V) is applied to all the remaining unselected words Pass W/L. As a result, in the program execution cell, charges (electrons) are injected into the floating gate electrode owing to an FN tunnel current, thereby executing "0"-programming. In the program inhibit cell, since the potential of the channel rises due to capacitive coupling, "0"-programming is inhibited (in other words, "1"-programming is executed or the erase state is maintained).

c. Discharge of Word Lines (bout 4 $\mu$s)

Charges are removed from all the word lines in a selected block (Sel. W/L, Pass W/L=Vss) to prepare for program verify to be performed afterward.

d. Program Verify (about 8 $\mu$s)

In program verify, it is verified whether the threshold value of a write cell ("0"-programming cell), of the selected cells connected to a selected word line, becomes a target value (lower limit) or more. Program verify is executed by reading out data from the selected cells corresponding to one page and connected to the selected word line (program verify read).

In normal read operation, as described above, for example, 0V is applied to a selected word line, and about 4.5V is applied to each unselected word line. In a program verify read, about 0.7V is applied to a selected word line, and about 4.5V is applied to each unselected word line. That is, in program verify, when the threshold value of a memory cell exceeds 0.7V, it is determined that "0"-programming is completed.

In program verify, the data in the latch circuit in the page buffer to which a memory cell for which "0"-programming has been completed (having a threshold value exceeding 0.7V) is connected changes from "0" to "1". Therefore, program operation is not performed for a memory cell for which "0"-programming has been completed afterward, thereby preventing over program.

In program verify, control is performed such that the data in the latch circuit in the page buffer changes only from "0" to "1" but does not change from "1" to "0". As a consequence, the data in the latch circuit in the page buffer to which a "1"-programming cell (program inhibit cell) is connected is maintained at "1 (write inhibit)", whereas the data in the latch circuit in the page buffer to which a "0"-programming cell is connected changes from "0(write execution)" to "1 (write inhibit)" in accordance with the threshold value of the "0"-programming cell.

Program operation and program verify operation are repeated until the data in the latch circuits in all the page buffers become "1". Note that if the time required for program operation (including program verify operation) reaches a maximum time (e.g., 10 cycles), write NG is determined, and the program operation is terminated.

Figure 28:
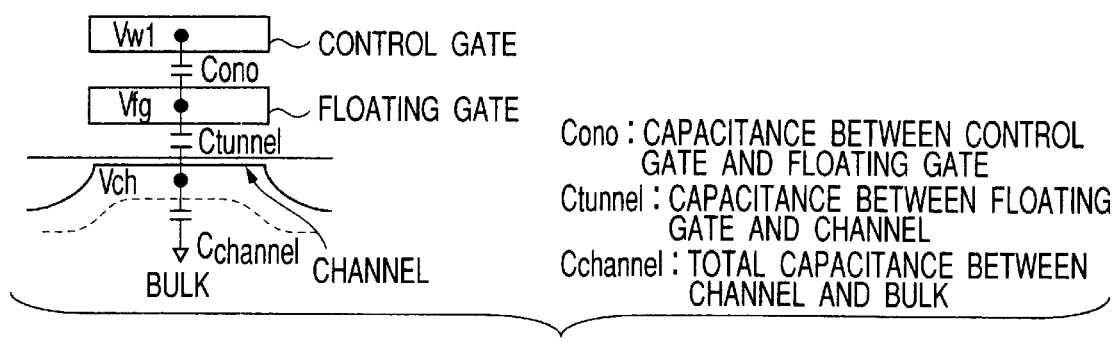
FIG. 28 is a view showing capacitances generated in a memory cell.
Figure 27:
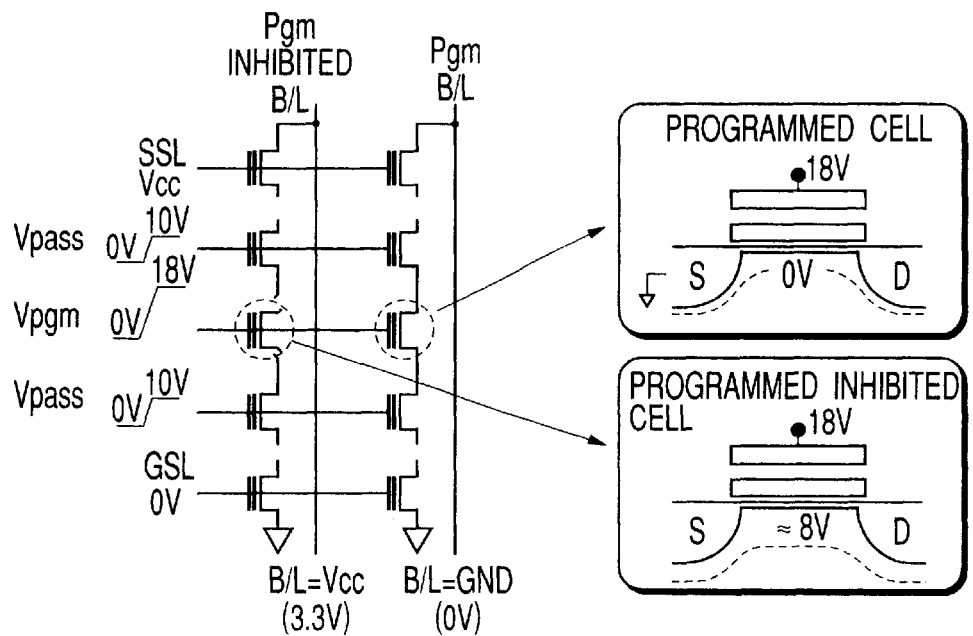
FIG. 27 is a view showing the states of cells in program operation.

FIGS. 27 and 28 show a bias condition for the selected cells (a program execution cell and program inhibit cell) connected to a selected word line in program operation. GSL and SSL are set to the ground potential Vss and power supply potential Vcc, respectively, to transfer the potential of the bit line to the channels of memory cells constituting a NAND string in a selected block. At this time, the channel of a selected cell (program execution cell) for which "0"-programming is to be executed is set to the ground potential (equal to the potential of the bit line Vss, and the channel of a selected cell (program inhibit cell) for which "1"-programming is to be executed is charged to Vcc–Vth and then set in the floating state.

Subsequently, in the selected block, a pulse-like program potential (e.g., 18V) Vpgm is applied to one selected word line, and a transfer potential (about 10V) Vpass is applied to all the remaining unselected word lines. As a result, in each program execution cell, a large potential difference is produced between the floating gate electrode and the channel, and charges (electrons) are injected from the channel to the floating gate electrode owing to an FN tunnel current, thus executing "0"-programming.

In each program inhibit cell, when the program potential Vpgm or transfer potential Vpass is applied to the word line, the potential of the channel rises due to the capacitive coupling between the word line (control gate electrode) and the channel. For this reason, in each program inhibit cell, no large potential difference is produced between the floating gate electrode and the channel, and "0"-programming is inhibited (in other words, "1"-programming is executed or the erase state is maintained).

If the channel potential (program inhibit potential) of a program inhibit cell is sufficiently raised in program operation, a program error ("0"-programming) in the program inhibited cell can be prevented. In addition, the program inhibit potential can be sufficiently raised by sufficiently charging the channel in initial charge operation and increasing the coupling ratio between the word line and the channel.

Note that a coupling ratio B between a word line and a channel can be given by $$B=Cox/(Cox+Cj)$$

where Cox is the total gate capacitance between the word line and the channel, and Cj is the total junction capacitance between the source and drain of the memory cell.

The channel capacitance of the NAND string is the sum of Cox and Cj. In addition to these capacitances, there are an overlap capacitance between the select gate line and the source (or drain), a capacitance between the bit line and the source line, and the like. However, these capacitances are very small as compared with Cox and Cj, and hence can be neglected.

In contrast to this, the NAND Ferroelectric RAM of the present invention is constituted by MFSFETs. An MFSFET is designed to store data as the polarization state of the ferroelectric film. When a voltage (or electric field) equal to or higher than the critical voltage is applied to the ferroelectric film, its polarization is inverted. When the voltage (or electric field) becomes zero, the ferroelectric film always has a predetermined polarization amount (remanent polarization amount), i.e., a predetermined threshold value. That is, if memory cells are formed from MFSFETs, it can be assumed that the write characteristics of all the memory cells are almost the same. For one write, therefore, no variation in threshold value occurs among the memory cells (since the threshold values do not gradually change unlike the memory cells of a flash memory, the threshold distribution curve does not have long tails).

In the NAND Ferroelectric RAM of the present invention, therefore, there is no need to perform plural write operations in consideration of the write characteristics of cells, and only one write operation using a voltage equal to or higher than the critical voltage will suffice, unlike the NAND flash EEPROM. In addition, in the NAND Ferroelectric RAM of the present invention, when the voltage applied to the ferroelectric film is changed from the critical voltage or higher to zero, the ferroelectric film always produces a predetermined polarization amount (remanent polarization amount). Since the threshold value of each memory cell is set to a predetermined value by one program operation, no program verify is required (obviously, no over program occurs).

According to the NAND Ferroelectric RAM of the present invention, therefore, only one program operation is required, and no program verify is required. This makes it possible to simplify the sequence of program operation, facilitate control in program operation, and eliminate the necessity to use any verify circuit. Furthermore, since the data program time is greatly shortened, high-speed programming can be realized.

⑥ Capability of Re-write (program/erase operation) in Unit of Pages and Bytes (bits)

A flash memory such as a NAND flash EEPROM is designed to store data as the amounts of charges (amounts of electrons) in floating gate electrodes and erase data in units of blocks. For this reason, re-write (cell data change) on a page-by-page basis cannot be performed. Data re-write operation on a page-by-page basis can be implemented by changing only part of the data in a block without changing the remaining part of the data. In a flash memory, however, data cannot be directly overwritten on memory cells, and all the data in a block are simultaneously erased in erase operation. This makes it impossible to change part of data.

In contrast to this, in the NAND Ferroelectric RAM of the present invention, data are stored as the polarization states of ferroelectric films. The polarization state (data in each memory cell) of each ferroelectric film can be maintained or changed by applying a voltage equal to or higher than the critical voltage or a voltage less than the critical voltage to the ferroelectric film.

According to the NAND Ferroelectric RAM of the present invention, therefore, re-write operation on a page-by-page basis can be implemented by erasing the data in memory cells corresponding to one page and connected to a selected word line and then writing new data in them.

⑦ Other Effects

In the NAND Ferroelectric RAM of the present invention, memory cells are formed from MFSFETS. The characteristic features of each MFSFET can be regarded as the characteristic features of the NAND Ferroelectric RAM of the present invention.

The first characteristic feature of the NAND Ferroelectric RAM of the present invention is that nondestructive read operation can be performed, i.e., the data in memory cells are not destroyed in read operation. In an Ferroelectric RAM obtained by forming the cell capacitors of a DRAM using ferroelectric films, data is destroyed in read operation, and hence a data re-write step is required in read operation. In contrast to this, in the NAND Ferroelectric RAM of the present invention, since the threshold values of memory cells (MFSFETS) change in accordance with the polarization states of ferroelectric films, the data in the memory cells can be detected as the values of drain currents obtained when a read potential is applied to the gates. In the NAND Ferroelectric RAM of the present invention, therefore, data is not destroyed in read operation.

The second characteristic feature of the NAND Ferroelectric RAM of the present invention is that high-speed programming can be performed, i.e., the program time is short. The NAND flash EEPROM is designed to write data by injecting a predetermined amount of charge (electrons) into a floating gate electrode. For this reason, verify operation is required to verify the amount of charge (threshold value) in the floating gate electrode. This makes the program time longer (about 10 µs) than that in a memory such as a DRAM or SRAM. In contrast to this, in the NAND Ferroelectric RAM of the present invention, since a predetermined polarization amount (threshold value) can be obtained by one write operation, the program time is about 10 ns, which is almost equal to that in a memory such as a DRAM or SRAM.

The third characteristic feature of the NAND Ferroelectric RAM of the present invention is that many write (program/erase cycle) operations can be ensured. In the NAND flash EEPROM, a tunnel oxide film is formed between a floating gate electrode and a channel, and an FN tunnel current is flowed into the tunnel oxide film to execute a data erase and write. If, therefore, re-write operation is repeated, the tunnel oxide film gradually deteriorates, and accurate re-write operation cannot be performed. For this reason, the number of re-write cycles (program/erase cycles) in the NAND flash EEPROM is limited in consideration of reliability. More specifically, the number of re-write cycles is limited to about $10^6$. In contrast to this, the NAND Ferroelectric RAM of the present invention is designed to perform a data erase and write by changing the polarization state of each ferroelectric film. Therefore, the ferroelectric film itself hardly deteriorates, and the number of re-write cycles in the NAND Ferroelectric RAM is substantially infinite. More specifically, about $10^{16}$ re-write operations can be performed.

As described above, according to the NAND Ferroelectric RAM of the present invention, each memory cell is formed from an MFSFET, and memory cells are connected in a NAND from (in series) between a bit line and a source line. In addition, each select gate transistor is formed from an MFSFET having substantially the same structure as a memory cell. With this arrangement, noticeable effects like ① to ⑦ described above can be obtained.

A method of manufacturing the cell array portion of the NAND Ferroelectric RAM of the present invention will be described in detail below.

Figure 29:
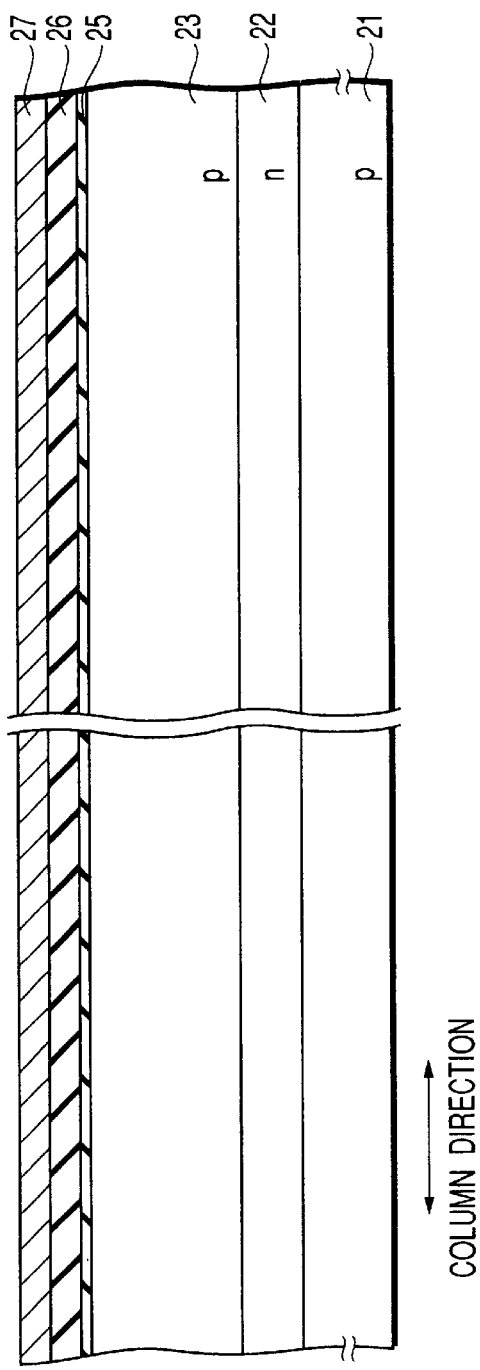
FIG. 29 is a sectional view showing one step in a method of manufacturing a NAND Ferroelectric RAM.

First of all, as shown in FIG. 29, an n-type impurity is implanted into the p-type silicon substrate 21 by the ion implantation method to form the n-type well region 22. In addition, a p-type impurity is implanted into the n-type well region 22 to form the p-type well region 23. Element isolation layers linearly extending in the column direction are formed on the silicon substrate 21. The element isolation layers may be field oxide films formed by the LOCOS method or layers having an STI (Shallow Trench Isolation) structure.

Subsequently, the buffer layer 25 is formed on the silicon substrate 21 by the epitaxial growth method. As a material for the buffer layer 25, for example, $SrTiO_3$, $CeO_2$, $ZrO_2$, $HfO_2$, or the like is used. The thickness of the buffer layer 25 is set to a value within in the range of 0.5–20 nm. The ferroelectric film 26 made of a ferroelectric material such as PZT ($PbZr_{1-x}Ti_xO_3$) or SBT ($SrBi_2Ta_2O_9$) is formed on the buffer layer 25 by the epitaxial growth method. The thickness of the ferroelectric film 26 is set to a value within the range of 1–500 nm.

The polysilicon film 27 doped with an impurity is formed on the ferroelectric films 26 by the LPCVD method.

On the ferroelectric film 26 a metal film made of TiN, TaN, W or the like may be formed in place of the polysilicon film 27. In the following description of the steps, the thickness of films to be formed will not be specified. The numerical values will be later described in Detailed Description 2.

Figure 30:
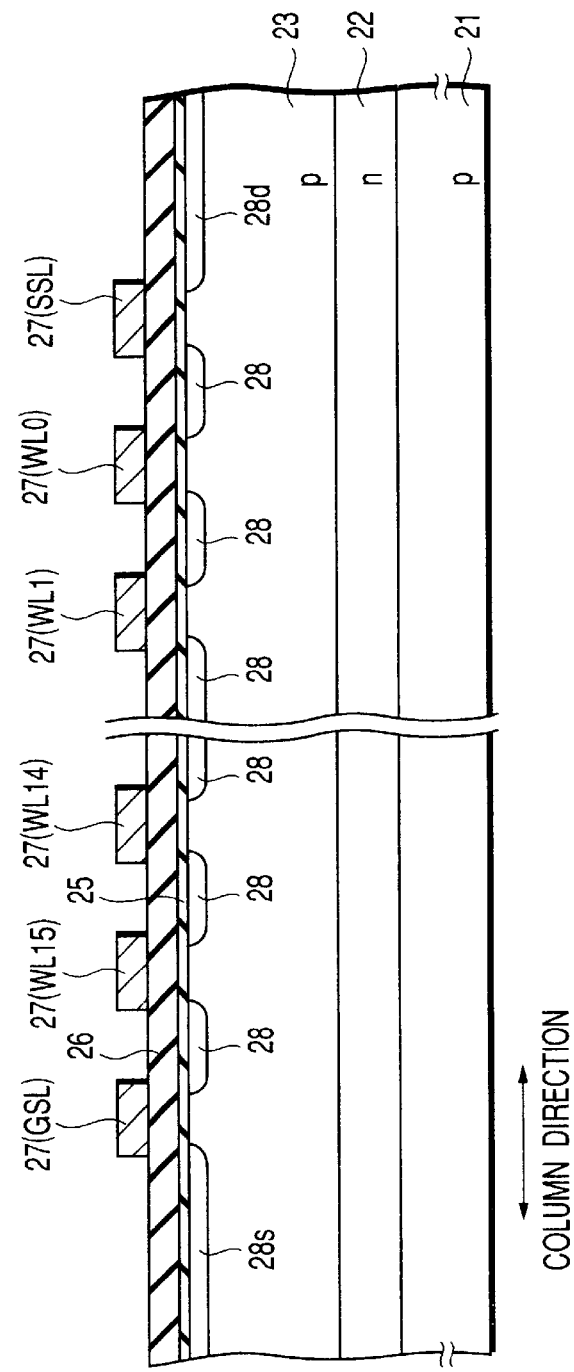
FIG. 30 is a sectional view showing one step in the method of manufacturing the NAND Ferroelectric RAM.

As shown in FIGS. 29 and 30, a resist pattern is formed on the polysilicon film 27 by PEP (Photo Engraving Process). The polysilicon film 27 is then etched by RIE (Reactive Ion Etching) using this resist pattern as a mask to from the plural word lines (the gate electrodes of the memory cells) 27(WL0), 27(WL1), . . . , 27(WL15) extending in the row direction and the plural select gate lines (the gate electrodes of the select gate transistors) 27(GSL) and 27(SSL) extending in the row direction.

At the same time, the gate electrodes of transistors constituting a peripheral circuit located around a cell array portion are formed.

In this embodiment, when the gates of transistors (memory cells and select gate transistors) are processed, only the gate electrode 27 is etched. Therefore, the ferroelectric films 26 are arranged on almost the entire surface of the cell array portion (obviously, no ferroelectric film 26 is present in the portion where the peripheral circuit is formed).

Alternatively, however, after the gate electrode 27 is etched, the ferroelectric film 26 may be consecutively etched to form the ferroelectric films 26 immediately under only the word 27(WL0), 27(WL1), 27(WL15) and the select gate line 27(GSL) and 27(SSL).

In addition, for example, the ferroelectric films 26 may be arranged on only the channels of the transistors. In this case, before the gate electrode 27 is formed, slits extending in the column direction are formed in the ferroelectric film 26 on the element isolation layers in advance. With this process, when the gates of transistors are processed, the ferroelectric films 26 are left on only the channels of the transistors.

An n-type impurity is implanted into the silicon substrate 21 (actually, the p-type well region 23) in a self-aligning manner by the ion implantation method to form the source/drain regions 28, 28s, and 28d. In this ion implantation process, ion implantation using high acceleration energy, so-called high acceleration ion implantation, is used to implant the impurity (ions) into the silicon substrate 21 through the ferroelectric films 26 and buffer layer 25.

Figure 31:
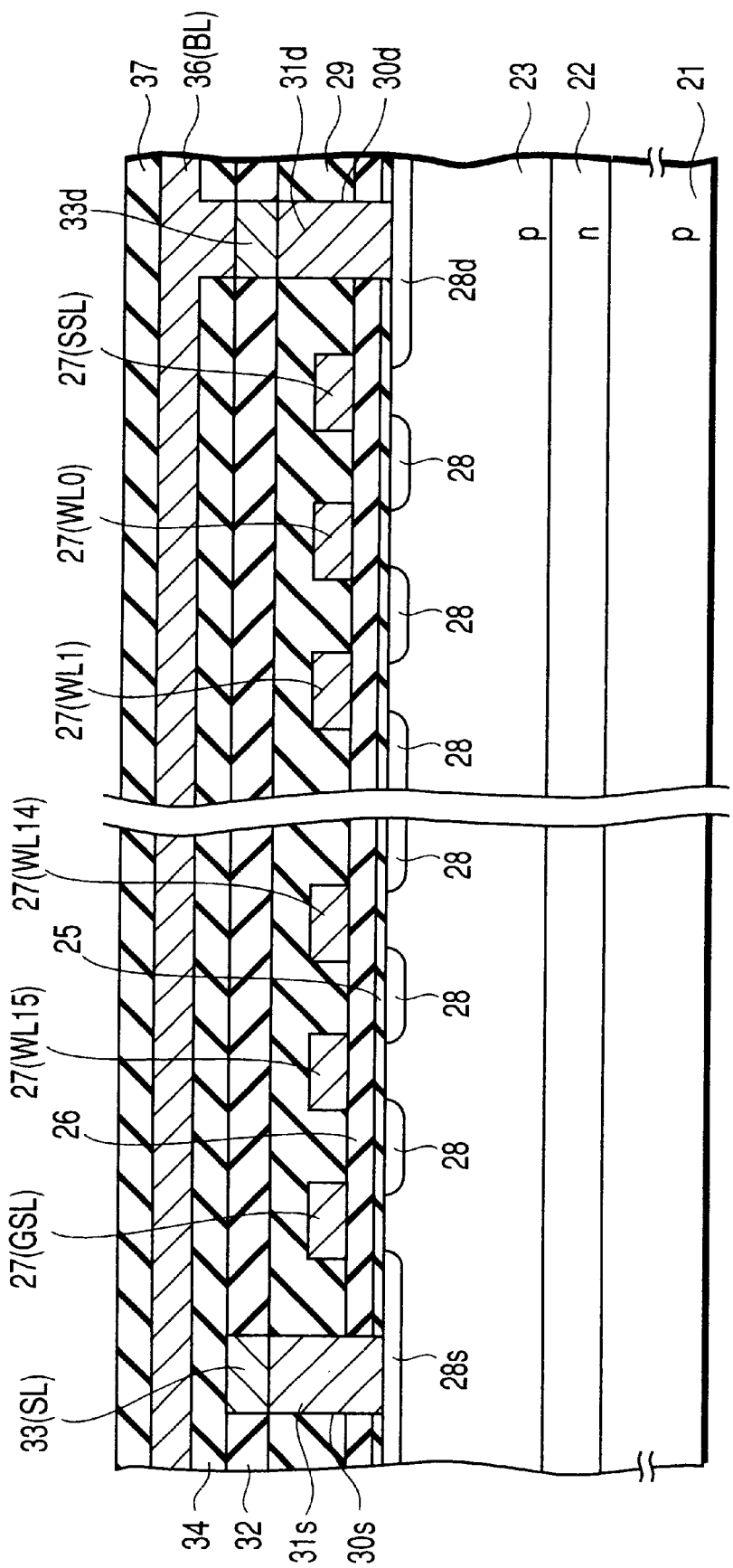
FIG. 31 is a sectional view showing one step in the method of manufacturing the NAND Ferroelectric RAM.

As shown in FIG. 31, the interlevel dielectric film (e.g., silicon oxide) 29 is formed on the ferroelectric films 26 and gate electrodes 27 to completely cover the gate electrodes 27. Thereafter, the contact hole 30d reaching the drain region 28d and the contact hole 30s reaching the source region 28s are formed in the interlevel dielectric film 29, ferroelectric films 26, and buffer layer 25. The contact plug 31d is formed in the contact hole 30d. The contact plug 31s is formed in the contact hole 30s. The contact plugs 31d and 31s are made of polysilicon, tungsten, or the like.

The interlevel dielectric film (e.g., silicon oxide) 32 is formed on the interlevel dielectric film 29 by the LPCVD method. Interconnection trenches are formed in the interlevel dielectric film 32, and the interconnection 33d connected to the contact plug 31d and the source line 33(SL) connected to the contact plug 31s are formed in the interconnection trenches. The interconnection 33d and source line 33(SL) are made of tungsten, aluminum, or the like.

The interlevel dielectric film (e.g., silicon oxide) 34 is formed on the interlevel dielectric film 32, interconnection 33d, and source line 33(SL) to cover the interconnection 33d and source line 33(SL). A via hole reaching the interconnection 33d is formed in the interlevel dielectric film 34. In addition, the bit line 36(BL) is formed on the interlevel dielectric film 34. The bit line 36(BL) is connected to the interconnection 33d through the via hole. The bit line 36(BL) is made of, for example, aluminum.

Finally, the passivation film 37 is formed on the bit line 36(BL) by the LPCVD method.

An example of the method of manufacturing the NAND Ferroelectric RAM of the present invention has been described above. However, a method other than the above method, e.g., a method of manufacturing a NAND flash EEPROM, may be directly used for the NAND Ferroelectric RAM of the present invention.

The basic operation of the NAND Ferroelectric RAM of the present invention will be described next.

The basic operation of the NAND Ferroelectric RAM of the present invention is similar to that of the NAND flash EEPROM. However, the NAND Ferroelectric RAM demands unique operation that is not required in the conventional Ferroelectric RAM and NAND flash EEPROM because the memory cells and select gate transistors of the NAND Ferroelectric RAM are formed from MFSFETs.

Erase operation, program operation, and read operation will be sequentially described below.

Assume that a cell array portion is formed from the circuit shown in FIG. 32, and memory cells and select gate transistors are formed from n-channel MFSFETs. Assume also, for the sake of descriptive convenience, that the electric field produced when a low potential is applied to a channel and a high potential is applied to a gate electrode is under-direction electric field, and the electric field produced when a high potential is applied to the channel and a low potential is applied to the gate electrode is an upper-direction electric field. In addition, assume that polarization which is positive on the channel side and negative on the gate electrode side is under-direction polarization, and polarization which is negative on the channel side and positive on the gate electrode side is upper-direction polarization. Furthermore, assume that under-direction polarization (remanent polarization point) corresponds to a "1"-state ("1"-programming state), and upper-direction polarization (remanent polarization point) corresponds to a "0"-state ("0"-programming state or erase state).

Erase Operation (Block Erase)

Assume that a selected block for which data erase is to be executed is block 0, and an unselected block for which no data erase is to be executed is block 1.

TABLE 2

Block or Chip Erase
(Memory Cell, Select Gate Transistor)

| | Selected Block | Unselected Block |
|---|---|---|
| WL0, ... WL15 SSL, GSL | Vss | Vss→Vera × α (Floating) |
| BL0, BL1, ... | Vera-Vf | Vera-Vf |
| SL | Vera-Vf | Vera-Vf |
| Silicon Substrate (P-well) | Vera | Vera |

Note: In chip erase operation, all blocks are selected

Figure 33:
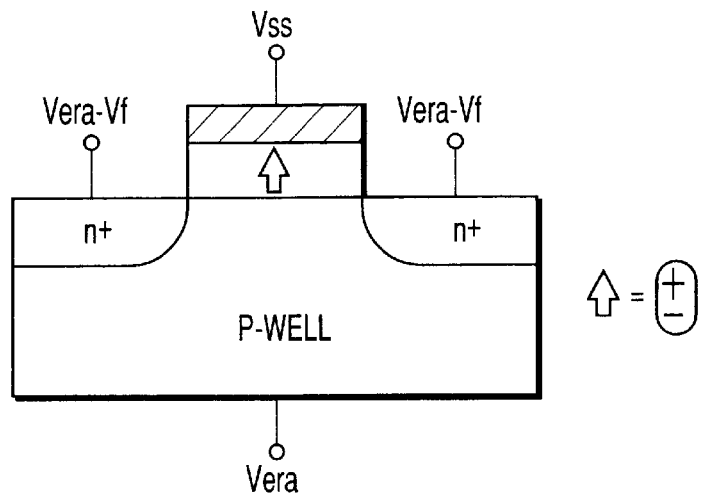
FIG. 33 is a view showing the polarization state of a selected cell after erase operation.
Figure 34:
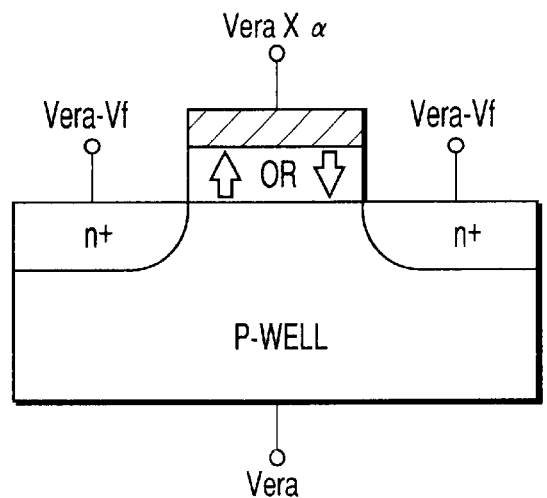
FIG. 34 is a view showing the polarization state of an unselected cell after erase operation.

As shown in Table 2 and FIGS. 33 and 34, all the word lines WL0, WL1, ..., WL15 and all the select gate lines GSL and SSL are set to the ground potential Vss. The ground potential Vss is kept applied to the word lines WL0, WL1, ..., WL15 and select gate lines GSL and SSL in selected block 0, whereas the word lines WL0, WL1, ..., WL15 and select gate lines GSL and SSL in unselected block 1 are set in the floating state. Subsequently, an erase voltage (e.g., about 5V) Vera is applied to the silicon substrate (e.g., cell-p well).

At this time, the source region (n type) of the select gate transistor on the source line side in selected block 0 and the silicon substrate (p type) are set in the forward-biased state, and the potential of the source line SL rises to Vera−Vf (Vf is the built-in potential of a p-n junction; about 0.7V). In addition, the drain region (n type) of the select gate transistor on the bit line side in selected block 0 and the silicon substrate (p type) are set in the forward-biased state, and the potentials of the bit lines BL0, BL1, BL2, ... also rise to Vera−Vf. That is, the potentials of all the source line SL and bit lines BL0, BL1, BL2, ... become Vera−Vf (=about 4.3V).

As a consequence, in selected block 0, the erase voltage (Vera−Vss) is applied between the silicon substrate and the word lines WL0, WL1, ..., WL15 and between the silicon substrate and the select gate lines GSL and SSL. This erase voltage is set to be higher than the lowest voltage (critical voltage) required to cause polarization inversion in the ferroelectric film of each MFSFET. However, this erase voltage (about 5V) is sufficiently lower than the voltage (about 15V to about 21V) required to execute a write or erase with respect to memory cells in the NAND flash EEPROM by using an FN tunnel phenomenon.

Figure 35:
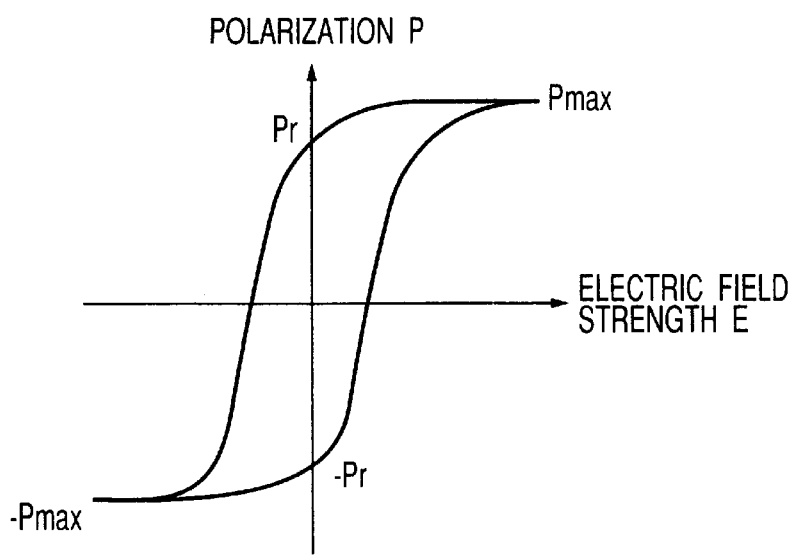
FIG. 35 is a graph showing the hysteresis characteristics of the ferroelectric film of an MFSFET.

In selected block 0, since upper-direction electric fields strong enough to cause polarization inversion in ferroelectric films are generated between the silicon substrate and the word lines WL0, WL1, ..., WL15 and between the silicon substrate and the select gate lines GSL and SSL, upper-direction polarization is generated in all memory cells and all select gate transistors in selected block 0, and the polarization value becomes a saturated polarization value Pmax (FIG. 35).

In unselected block 1, when the erase potential (e.g., bout 5V) Vera is applied to the silicon substrate (e.g., cell-p well), the potentials of the word lines WL0, WL1, ..., WL15 and the potentials of the select gate lines GSL and SSL rise to α×Vera owing to the capacitive coupling between the silicon substrate and the word lines WL0, WL1, ..., WL15 and the capacitive coupling between the silicon substrate and the select gate lines GSL and SSL.

In this case, α represents the coupling ratio between the capacitive coupling between the silicon substrate and the word lines WL0, WL1, ..., WL15 and the capacitive coupling between the silicon substrate and the select gate lines GSL and SSL, and is about 0.9. Therefore, the potentials of the word lines WL0, WL1, ..., WL15 and the potentials of the select gate lines GSL and SSL become α×Vera (=about 4.5V).

As a consequence, in unselected block 1, a voltage sufficiently lower than the critical voltage, i.e., a voltage (about 0.5V) almost equal to Vera (1—α), is applied between the silicon substrate and the word lines WL0, WL1, ..., WL15 and between the silicon substrate and the select gate lines GSL and SSL. That is, the polarization states of the ferroelectric films of all memory cells and all select gate transistors in unselected block 1 remain unchanged.

Figure 36:
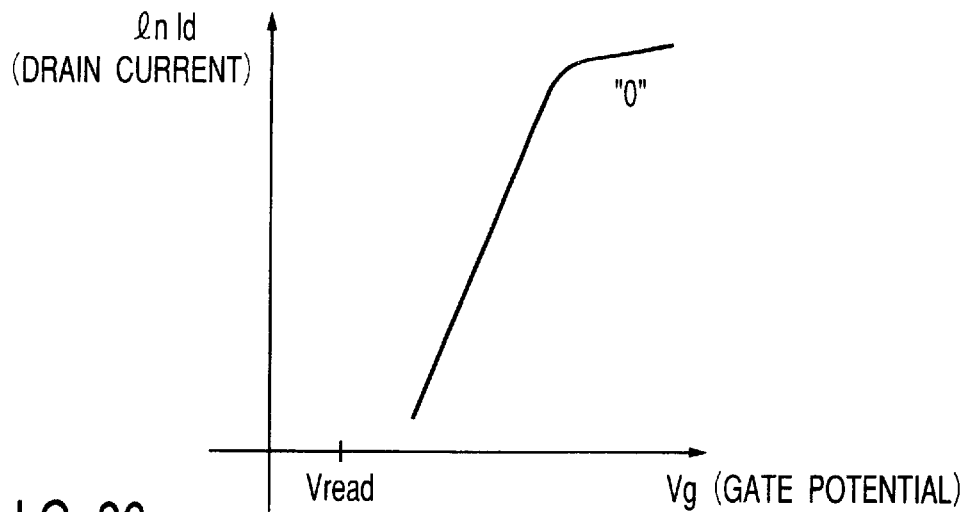
FIG. 36 is a graph showing the relationship between the gate potential and drain current of a memory cell after erase operation.

Subsequently, when the potential applied to the silicon substrate is changed from Vera to Vss, the electric fields in the ferroelectric films of all memory cells and select gate transistors becomes 0. At this time, the amounts of upper-direction polarization in the ferroelectric films of the memory cells and select gate transistors in selected block 0 become a remanent polarization value Pr (FIG. 35). That is, as shown in FIG. 36, all memory cells and all select gate transistors in selected block 0 are set in the "0"-state (in which the threshold value is high), i.e., the erase state.

In the above erase operation, data erase targets are the memory cells and select gate transistors in selected block 0.

However, data erase targets may be the memory cells alone or the select gate transistors alone in selected block 0.

If, for example, the data in only the memory cells in selected block 0 are to be erased, the ground potential Vss is applied to the select gate lines SSL and GSL in selected block 0, and the select gate lines SSL and GSL in selected block 0 are then set in the floating state. When the erase potential Vera is applied to the silicon substrate (p-well) afterward, the potentials of the select gate lines SSL and GSL in selected block 0 rise to Vera×α due to capacitive coupling. That is, any electric field strong enough to cause polarization inversion is not generated in the ferroelectric films of the select gate transistors in selected block 0.

TABLE 3

Block or Chip Erase (Memory Cell)

|  | Selected Block | Unselected Block |
|---|---|---|
| WL0, ... WL15 | Vss | Vss→Vera × α (Floating) |
| SSL, GSL | Vss→Vera × α (Floating) | Vss→Vera × α (Floating) |
| BL0, BL1, ... | Vera-Vf | Vera-Vf |
| SL | Vera-Vf | Vera-Vf |
| Silicon Substrate (P-well) | Vera | Vera |

Note: In chip erase operation, all blocks are selected

When the data in only the select gate transistors in selected block 0 are to be erased, the ground potential Vss is applied to the word lines WL0, WL1, ... , WL15 in selected block 0, and the word lines WL0, WL1, ... , WL15 are then set in the floating state, as indicated in Table 4. When the erase potential Vera is applied to the silicon substrate (p-well), the potentials of the word lines WL0, WL1, ... , WL15 in selected block 0 rise to Vera×α owing to capacitive coupling. That is, any electric field strong enough to cause polarization inversion is not generated in the ferroelectric film of each memory cell in selected block 0.

TABLE 4

Erase (Select Gate Transistor)

|  | Selected Block | Unselected Block |
|---|---|---|
| WL0, ... WL15 | Vss→Vera × α (Floating) | Vss→Vera × α (Floating) |
| SSL, GSL | Vss | Vss→Vera × α (Floating) |
| BL0, BL1, ... | Vera-Vf | Vera-Vf |
| SL | Vera-Vf | Vera-Vf |
| Silicon Substrate (P-well) | Vera | Vera |

In the NAND Ferroelectric RAM of the present invention, memory cells corresponding to one page or plural pages in selected block 0 can be set as data erase targets.

Assume that the data in only memory cells corresponding to one page or plural pages in selected block 0 are to be erased. In this case, as indicated in Table 5, the ground potential Vss is applied to only one selected word line in selected block 0, and all the remaining unselected word lines and select gate lines are set to the ground potential Vss and set in the floating state. When the erase potential Vera is applied to the silicon substrate (p-well), the potentials of all unselected word lines and select gate lines in selected block 0 rise to Vera×α owing to capacitive coupling. That is, any electric field strong enough to cause polarization inversion is not generated in the ferroelectric fields of the unselected memory cells and select gate transistors in selected block 0.

TABLE 5

Page Erase (Memory Cell)

|  | Selected Block | Unselected Block |
|---|---|---|
| WL0~WL15 |  |  |
| Select | Vss | — |
| Unselect | Vss→Vera × α (Floating) | Vss→Vera × α (Floating) |
| SSL, GSL | Vss→Vera × α (Floating) | Vss→Vera × α (Floating) |
| BL0, BL1, ... | Vera-Vf | Vera-Vf |
| SL | Vera-Vf | Vera-Vf |
| Silicon Substrate (P-well) | Vera | Vera |

In the NAND Ferroelectric RAM of the present invention, no problem arises in erase operation in terms of over erase. This is because in the NAND Ferroelectric RAM of the present invention, the erase characteristics of each memory cell are not influenced by the coupling ratio between the gate electrode and the channel, and the threshold values of the respective memory cells are uniformly determined by applying a predetermined voltage equal to or higher than the critical voltage to the ferroelectric films.

Program Operation (for memory cells)

Assume that a selected block for which data write is to be executed is block 0, and an unselected block for which no data write is to be executed is block 1. Assume also that the word line WL1 is selected, and the remaining word lines WL0, WL2, ... , WL15 are not selected in the following description.

TABLE 6

PROGRAM (Memory Cell)

|  | Selected Block | Unselected Block |
|---|---|---|
| WL0~WL15 |  |  |
| Select | Vprog | — |
| Unselect | Vpass | Vss |
| SSL | Von | Voff |
| GSL | Voff | Voff |
| BL0, BL1, ... |  |  |
| "1"-programming | Vss | — |
| "0"-programming (Maintain Erase State) | Vcc | — |
| SL | Vcc | Vcc |
| Silicon Substrate (P-well) | Vcc | Vss |

First of all, the data in all the memory cells in selected block 0 are erased. The data are erased by the above erase operation. The select gate transistors may be set in the "0"-programming state (erase state) or the "1"-programming state. Program operation for the select gate transistors will be described later.

Figure 37:
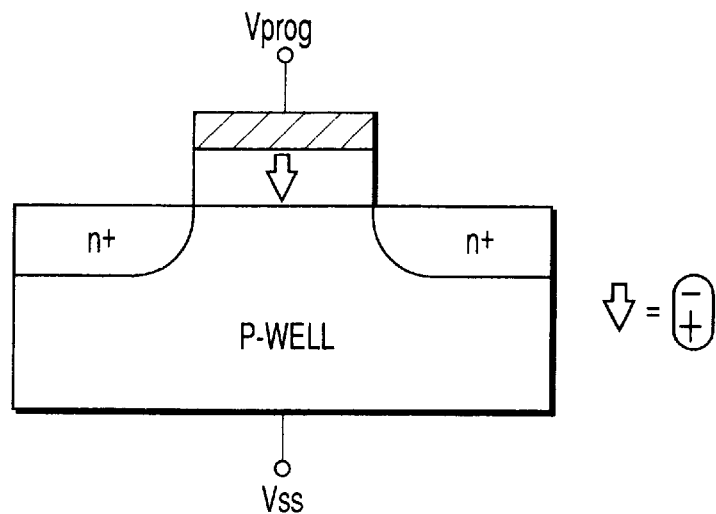
FIG. 37 is a view showing the polarization state of a selected cell after program operation.
Figure 38:
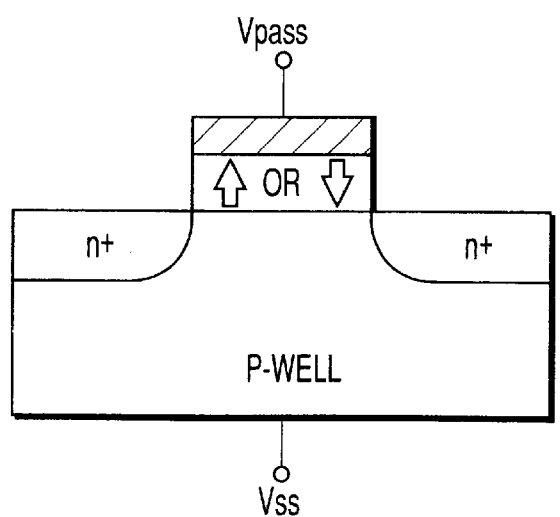
FIG. 38 is a view showing the polarization state of an unselected cell after program operation.

As indicated in Table 6 and FIGS. 37 and 38, a bit line to which a selected cell for which "1"-programming is performed is connected is set to the ground potential Vss, and a bit line to which a selected cell for which "0"-programming is performed (erase state is maintained) is connected is set to the power supply potential (e.g., about 3V) Vcc. Note that when programming data is "1", the potential of the bit line is set to "0" (=Vss), whereas when programming data is "0", the potential of the bit line is set to "1" (=Vcc).

In addition, the source line SL is set to the power supply potential Vcc, and the silicon substrate (p-well) is set to the ground potential Vss.

The select gate line SSL on the bit line side in selected block 0 is set to an ON potential Von at which the select gate transistor on the bit line side in selected block 0 is turned on. A select gate line GSL on the source line side in selected block 0 is set to an OFF potential Voff at which the select gate transistor on the source line side in selected block 0 is turned off. The two select gate lines SSL and GSL in unselected block 1 are set to the OFF potential Voff at which the select gate transistors are turned off.

The ON potential Von and OFF potential Voff change depending on the polarization states of the ferroelectric films of the select gate transistors (MFSFETs). When the select gate transistor is in the "0"-programming state (erase state), i.e., the polarization of the ferroelectric film of the select gate transistor is in the upper direction, its threshold value is high. For example, therefore, the ON potential Von becomes about 3V, and the OFF potential Voff becomes 0V. When the select gate transistor is in the "1"-programming state, i.e., the polarization of the ferroelectric film of the select gate transistor is in the under direction, its threshold value is low. For example, therefore, the ON potential Von becomes 0V, and the OFF potential Voff becomes about −3V.

According to such a relationship in potential, the channel potential of each memory cell in an NAND string including a selected cell for which "1"-programming is to be performed is set to the ground potential Vss. The channel potential of each memory cell in a NAND string including a selected cell for which "0"-programming is to be performed (erase state is to be maintained) is pre-charged to Vcc−Vth (Vth is the threshold value of an MFSFET (memory cell or select gate transistor)). In addition, the select gate transistor on the bit line side in the NAND string including the selected cell for which "0"-programming is to be performed is set in the cutoff state.

Subsequently, the selected word line WL1 in selected block 0 is set to the program potential (e.g., about 5V) Vprog, the unselected word lines WL0, WL2, ..., WL15 in selected block 0 are set to the transfer potential (e.g., 3V) Vpass, and all the word lines WL1, WL2, ..., WL15 in unselected block 1 are set to the ground potential Vss.

At this time, a voltage Vprog-Vss (=about 5V) equal to or higher than the critical voltage is applied to the ferroelectric film of a selected cell, of the memory cells connected to the selected word line WL1 in selected block 0, for which "1"-programming is to be performed. Therefore, an under-direction electric field strong enough to cause polarization inversion is generated in the ferroelectric film of the selected cell for which "1"-programming is to be performed. As a consequence, under-direction polarization is produced, and its polarization value becomes a saturated polarization value −Pmax (FIG. 35).

The program potential (e.g., about 5V) Vprog is applied to the word line WL1 for the selected cell, of the memory cells connected to the selected word line WL1 in selected block 0, for which "0"-programming is to be performed (erase state is to be maintained). In addition, the transfer potential (e.g., about 3V) Vpass is applied to the word lines WL0, WL2, ..., WL15. As a consequence, owing to the capacitive coupling between the channel (floating) and the word lines WL0, WL1, ..., WL15, the potential of the channel rises to $\beta \times (\text{Vpass}-\text{Vread})+(\text{Vcc}-\text{Vth})$.

In this case, $\beta$ represents the coupling ratio between the channel and the word lines WL0, WL1, ..., WL15 and is about 0.5.

Since a voltage equal to or higher than the critical voltage is not applied to the ferroelectric film of the selected cell, of the memory cells connected to the selected word line WL1 in selected block 0, for which "0"-programming is to be performed (erase state is to be maintained), the polarization state of the ferroelectric film does not change ("1"-programming is inhibited).

When the potentials of all the word lines WL0, WL1, ..., WL15 are changed to the ground potential Vss afterward, the amount of under-direction polarization of the ferroelectric film of the selected cell ("1"-programming cell) becomes a remanent polarization value —Pr, and the amount of upper-direction polarization of the ferroelectric film of the selected cell ("0"-programming cell) becomes a remanent polarization value Pr (FIG. 35).

Figure 39:
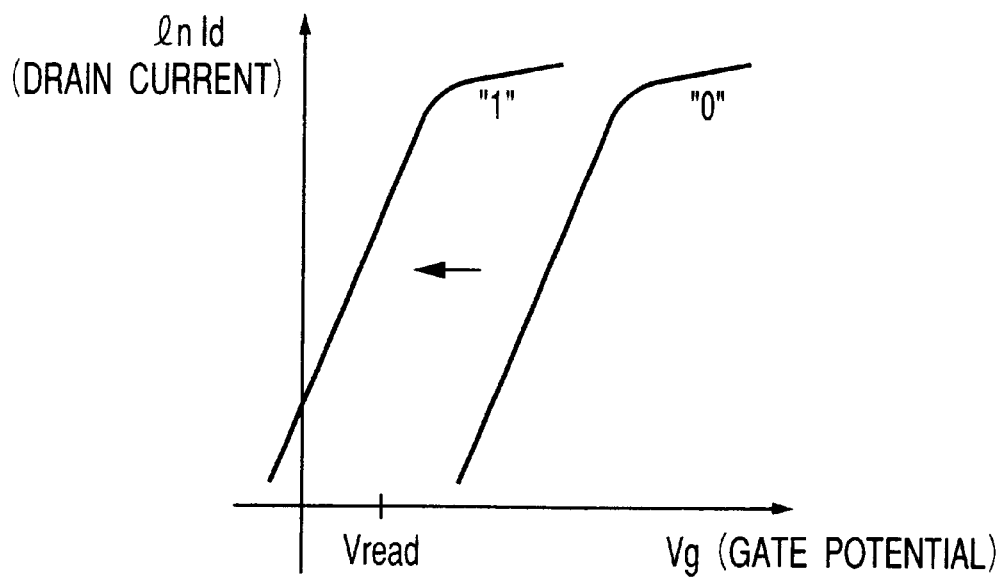
FIG. 39 is a graph showing the relationship between the gate potential and drain current of a memory cell after program operation.

That is, as shown in FIG. 39, the threshold value of the selected cell ("1"-programming cell) of the memory cells connected to the selected word line in selected block 0 becomes low, whereas the threshold value of the selected cell ("0"-programming cell) is kept high.

In the NAND Ferroelectric RAM of the present invention, no problem arises in program operation in terms of over program. This is because in the NAND Ferroelectric RAM of the present invention, the write characteristics of each memory cell are not influenced by the coupling ratio between the gate electrode and the channel, and the threshold value of each memory cell is uniformly determined by applying a predetermined voltage equal to or higher than the critical voltage to the ferroelectric film.

Program Operation (for select gate transistors)

The polarization of the ferroelectric film of each select gate transistor may be either in the upper direction (a state wherein the threshold value is high) or in the under direction (a state wherein the threshold value is low). The polarization of the ferroelectric film of each select gate transistor can be set in the upper direction by performing the above erase operation for the select gate transistor.

A method of setting the polarization of each select gate transistor in the under direction will be described below.

TABLE 7

PROGRAM (Select Transistor)

| | All Blocks |
|---|---|
| WL0~WL15 | Vss |
| SSL, GSL | Vprog |
| BL0, BL1, ... | |
| "1"-programming | Vss |
| "0"-programming | — |
| SL | Vss |
| Silicon Substrate (P-well) | Vss |

First of all, all the word lines WL0, WL1, ..., WL15, all the select gate transistors SSL and GSL, all the bit lines BL0, BL1, ..., the source line SL, and the silicon substrate (p-well) are set to the ground potential Vss. Thereafter, the gate electrode (select gate line) of the select gate transistor for which "1"-programming is to be performed is set to the program potential (e.g., about 5V). In general, in order to equalize the threshold values of all the select gate transistors in all the blocks, the potentials of all the select gate lines SSL and GSL are raised from the ground potential Vss to the program potential Vprog.

At this time, a voltage equal to or higher than the critical voltage is applied to the ferroelectric films of all the select gate transistors to cause polarization inversion due to under-direction electric fields, thereby generating under-direction polarization (saturated polarization value -Pmax). When all the select gate transistors SSL and GSL are restored to the ground potential Vss after ward, the under-direction polarization of the ferroelectric film of each select gate transistor has the saturated polarization Value -Pr.

Re-write operation (re-write on page-by-page basis)

The NAND Ferroelectric RAM of the present invention can perform re-write operation (changing cell data) in units of pages. With the above erase operation, the data in one-page memory cells as re-write targets are erased. Thereafter, a data write is executed for the one-page memory cells as re-write targets by the above program operation. Since the NAND Ferroelectric RAM of the present invention can perform erase operation and program operation in units of pages in this manner, it can also perform re-w rite operation in units of pages.

Read Operation

Figure 40:
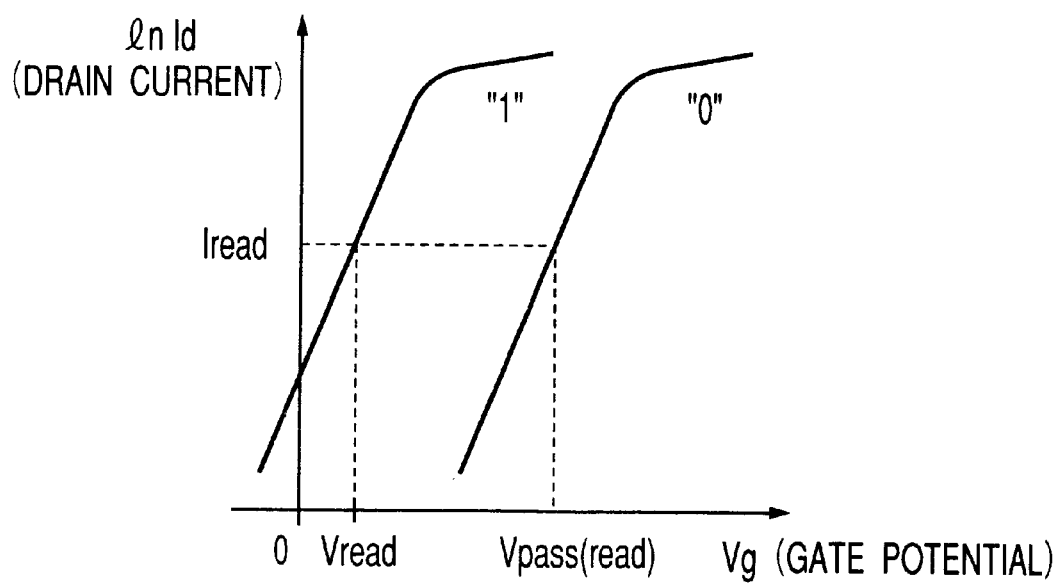
FIG. 40 is a graph showing the relationships between the gate potentials and drain currents of a "1"-cell and "0"-cell.

In a memory cell (n-channel MFSFET) in the "1"-programming state, negative charge is induced in the surface of the channel (silicon substrate), i.e., the surface of the p-type well region, owing to the under-direction remanent polarization of a ferroelectric film 14. As shown in FIG. 40, therefore, a memory cell in the "1"-programming state is lower in threshold value than a memory cell in the "0"-programming state.

In a memory cell (n-channel MFSFET) in the "0"-programming state, positive charge is induced in the surface of the channel (silicon substrate), i.e., the surface of the p-type well region, owing to the upper-direction remanent polarization of the ferroelectric film 14. As shown in FIG. 40, therefore, a memory cell in the "0"-programming state is higher in threshold value than a memory cell in the "1"-programming state.

TABLE 8

READ (Memory Cell)

| | Selected Block | Unselected Block |
|---|---|---|
| WL0~WL15 | | |
| Select | Vread | Vss |
| Unselect | Vpass (read) | Vss |
| SSL, GSL | Von | Voff |
| | Vpass (read) | |
| BL0, BL1, . . . | | |
| "1"-read | VBL→Vss | — |
| "0"-read | VBL→VBL | — |
| SL | Vss | Vss |
| Silicon substrate (P-well) | Vss | Vss |

As indicated in Table 8, therefore, all the bit lines BL0, BL1, . . . are pre-charged to an initial potential (e.g., about 1.5V) VBL first, and are then set in the floating state. Thereafter, a read potential Vread is applied to a selected word line in a selected block, and a transfer potential Vpass(read) is applied to each unselected word line in the selected block.

The read potential Vread is set to a value, e.g., about 1V, at which a drain current Id flows in a memory cell in the "1"-programming state, and no drain current Id flows in a memory cell in the "0"-programming state. The transfer potential Vpass(read) is set to a value, i.e., about 3V, at which the drain current Id flows in both a memory cell in the "1"-programming state and a memory cell in the "0"-programming state.

Note that the ground potential Vss is applied to each word line in an unselected block.

Von is applied to the select gate lines SSL and GSL in a selected block. Von is equal to Von used in program operation. If, for example, a select gate transistor is in the "0"-programming state (erase state), Von is set to Vpass (read). If a select gate transistor is in the "1"-programming state, Von is set to the ground potential Vss. Note that if Von is set to Vpass(read), the select gate transistor is kept ON regardless of its state.

Voff is applied to the select gate lines SSL and SL in an unselected block. Voff is equal to Voff used in program operation. If, for example, a select gate transistor is in the "0"-programming state (erase state), Voff is set to the ground potential Vss. If the select gate transistor is in the "1"-programming state, Voff is set to a negative potential, e.g., about -3V.

In addition, the source line SL and silicon substrate (p-well) are set to the ground potential Vss.

At this time, all the memory cells connected to each unselected word line in a selected block are turned on. Of the memory cells connected to a selected word line in the selected block, a memory cell in the "0"-programming state is turned on, and a memory cell in the "0"-programming state is-turned off.

The potential of a bit line through which data in the memory cell in the "1"-programming state is read out changes from VBL to Vss. The potential of a bit line through which the data in the memory cell in the "0"-programming state is read out is maintained at VBL.

The potential difference (Vss, VBL) between the bit lines, which is produced in accordance with the data in each memory cell, is amplified by the latch circuit having the function of a sense amplifier and held therein. For example, Vss corresponding to data "1" is maintained at Vss, and VBL corresponding to data "0" is amplified to Vcc (e.g., about 3V).

The data in the latch circuit having the sense amplifier function is output outward from the memory chip through the output buffer. Note that if the readout data is "1", the potential of the bit line is set to "0" (=Vss), whereas if the readout data is "0", the potential of the bit line is set to "1" (=VBL).

In the above erase, write, and read operations, for example, the states of the select gate transistors are preferably kept fixed. For example, all the select gate transistors are set in the "0"-programming state or "1"-programming state in advance, and erase operation, program operation, or read operation is performed for the memory cells. In this case, since Von and Voff are fixed, each operation can be easily controlled.

As described above, according to the semiconductor memory of the present invention, i.e., the NAND Ferroelectric RAM using MFSFETs, effects more than those obtained by the conventional Ferroelectric RAM and conventional NAND flash EEPROM can be obtained. For example, 1) the NAND Ferroelectric RAM is excellent at reducing the size of a memory cell, reducing the chip size, decreasing the re-write voltage, reducing power consumption, and simplifying the manufacturing process, 2) can increase the operation speed (shortening the re-write time) and attain high reliability (an increase in the number of re-write operations), and 3) can perform a nondestructive read and page re-write without requiring verify.

(2) Detailed Description 2
[First embodiment]

Figure 43:
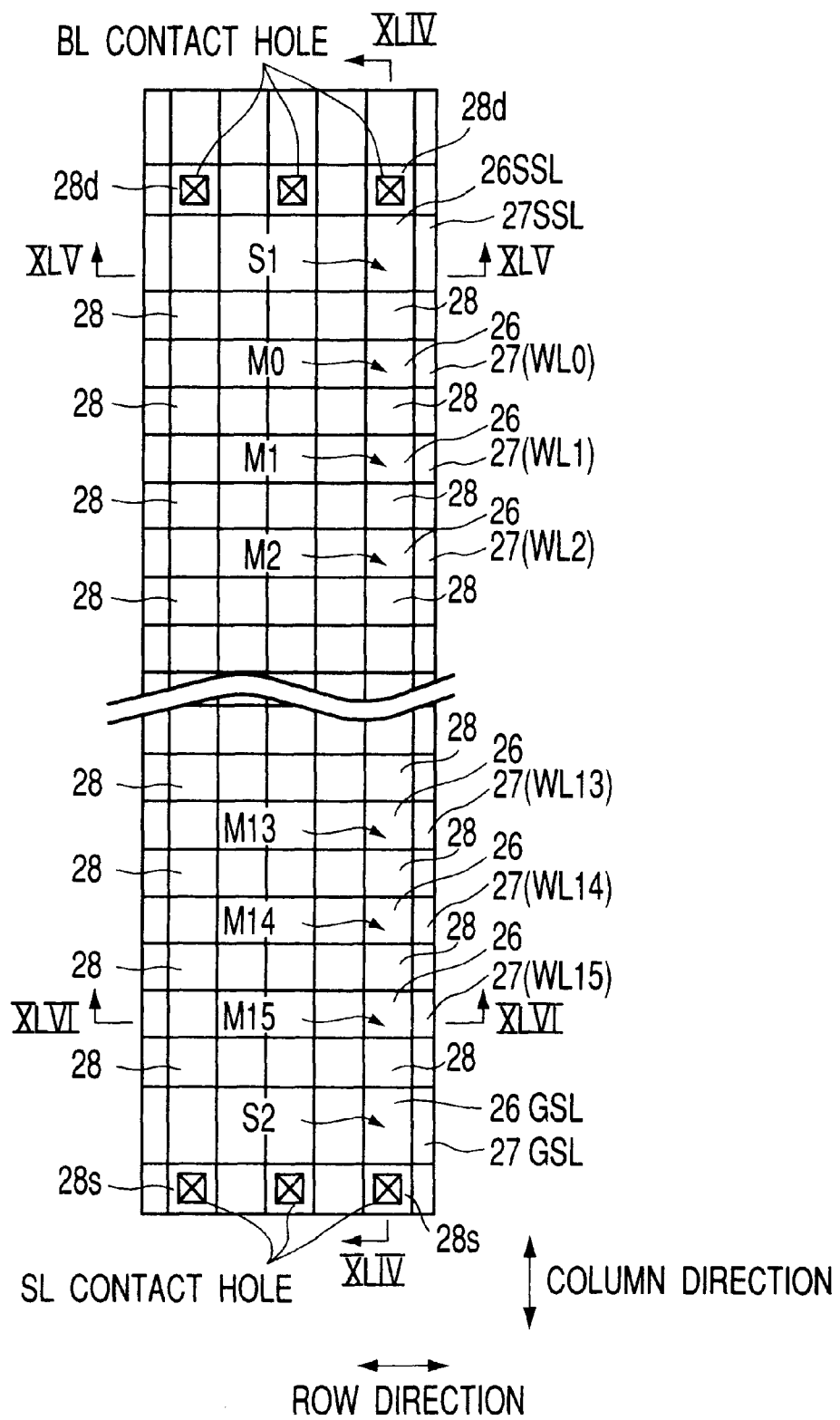
FIG. 43 is a plan view showing the first embodiment of an EEPROM according to the present invention.
Figure 44:
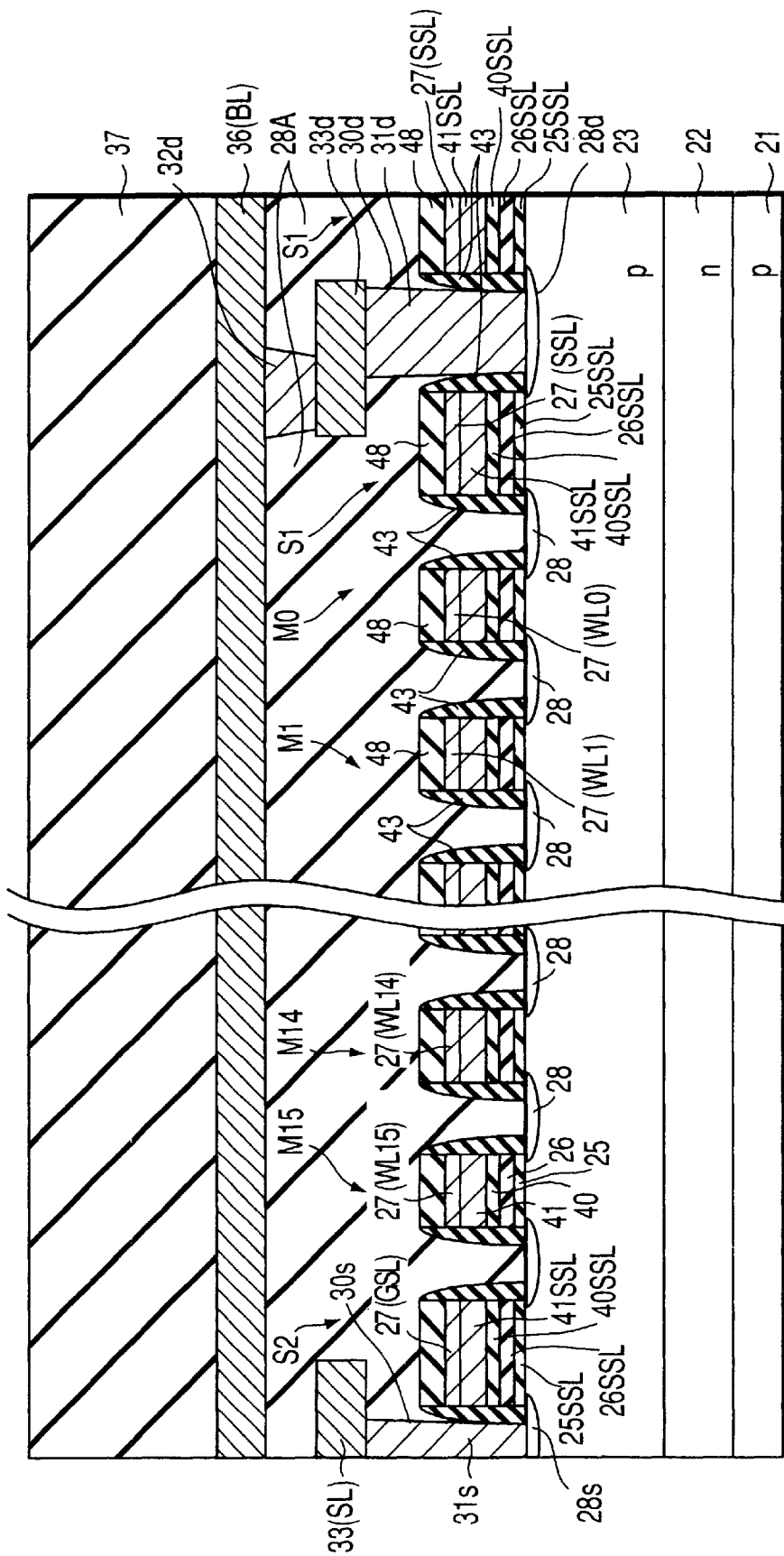
FIG. 44 is a sectional view taken along a line XLIV—XLIV in FIG. 43.
Figure 47:
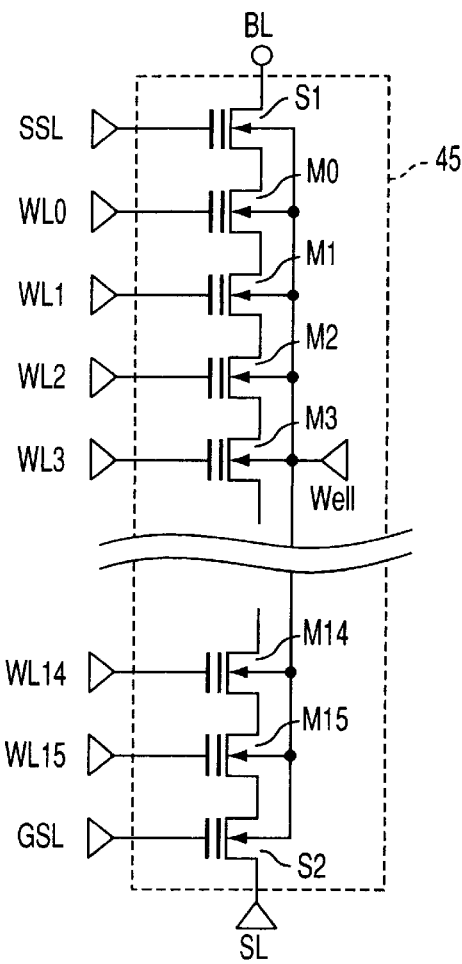
FIG. 47 is an equivalent circuit of one cell unit of the device in FIGS. 43 to 46.

FIG. 43 is a plan view showing the cell array structure of a NAND EEPROM of the present invention. FIG. 44 is a sectional view taken along a line XLIV—XLIV in FIG. 43. FIG. 45 is a sectional view taken along a line XLV—XLV in FIG. 43. FIG. 46 is a sectional view taken along a line XLVI—XLVI in FIG. 43. FIG. 47 is an equivalent circuit of one cell unit of the device shown in FIGS. 43 to 46.

Figure 41:
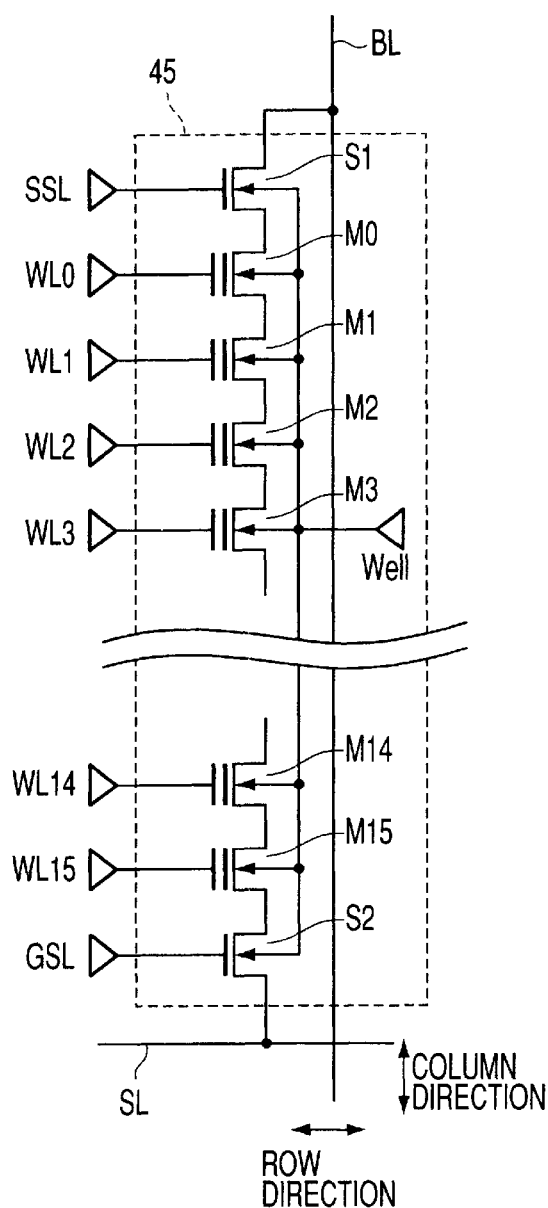
FIG. 41 is an equivalent circuit of a NAND cell unit.
Figure 42:
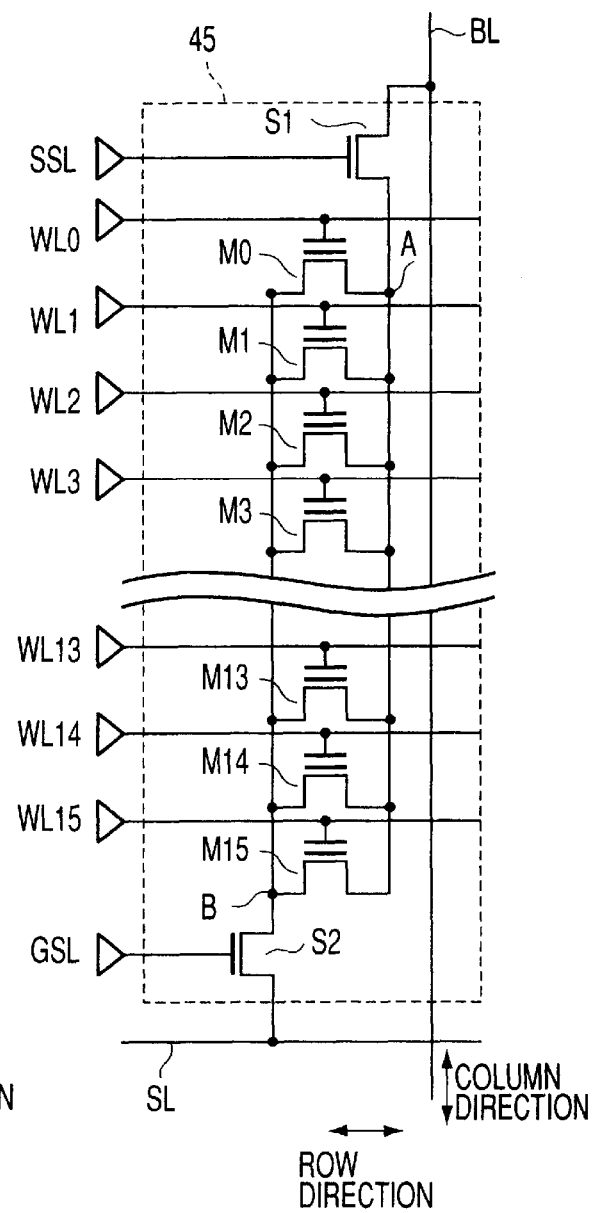
FIG. 42 is an equivalent circuit of an AND cell unit.

The same reference numerals as in FIG. 41 denote the same parts in FIGS. 43 to 47, and a detailed description thereof will be omitted. Note that the subscripts of symbols represent positional differences between the elements or components represented by the symbols, and elements or components represented by identical main symbols are formed in the same process.

The first characteristic feature of this cell array structure is that select gate transistors S1 and S2 have charge storing layers (e.g., silicon nitride) 26SSL and 26GSL. The second characteristic feature of this structure is that the structure of each of the select gate transistors S1 and S2 is substantially the same as that of each of memory cells M0, M1, . . . , M15. The third characteristic feature of the structure is that select gate lines SSL and GSL and control gate lines WL0, WL1, . . . , WL15 are arranged in the same interconnection layer.

One NAND cell unit is comprised of a NAND string constituted by plural (16 in this embodiment) series-connected memory cells M0, M1, . . . , M15, and the two select gate transistors S1 and S2 respectively connected to the two ends of the NAND string.

Each of memory cells M0, M1, . . . , M15 is formed by using a MOS transistor having a charge storing layer 26. The drain-side select gate transistor S1 is connected to a bit line (data transfer line) BL. The source-side select gate transistor S2 is connected to a common source line SL.

The memory cells M0, M1, . . . , M15 and select gate transistors S1 and S2 are formed in a p-type well region 23. The control gate electrodes of the memory cells M0, M1, . . . , M15 linearly extend in the row direction to form control gate lines (data select lines, i.e., word lines) CG1, CG2, . . . , CG15.

The select gate transistors S1 and S2 have the function of selecting one of plural cell units arranged in the column direction. The select gate lines (block select lines) SSL and GSL of the select gate transistors S1 and S2 are commonly connected to plural cell units (one block) arranged in the row direction. This makes it possible to select a cell unit in one block.

In this embodiment, the structure of each of the select gate transistors S1 and S2 is substantially the same as that of each of the memory cells M0, M1, . . . , M15, unlike in the prior art. More specifically, the select gate transistors S1 and S2 have the charge storing layers (e.g., silicon nitride) 26SSL and 26GSL directly under the select gate lines SSL and GSL. In addition, the select gate lines SSL and GSL and control gate lines WL0, WL1, . . . , WL15 have the same structure and are arranged in the same interconnection layer.

With this structure, memory cells can be arranged at a high packing density, and a reduction in the resistance of the select gate lines SSL and GSL and control gate lines WL0, WL1, . . . , WL15 can be attained. In addition, from the viewpoint of a manufacturing process, there is no need to separately perform photolithography and processes on the memory cell side and select gate transistor side, and so-called backside sub wire is not required. This makes it possible to reduce the area of a chip and the manufacturing cost.

In this embodiment, the two select gate lines SSL and GSL are connected to one cell unit 45 (or one block). It suffice, however, that at least one select gate line is connected to one cell unit 45. In addition, the s elect gate lines SSL and GSL. In addition, the select gate lines SSL and GSL are linearly arranged in the same direction as that of the control gate lines (word lines) WL0, WL1, . . . , WL15 (i.e., the row direction) to attain an increase in the packing density of memory cells.

In this embodiment, the cell unit 45 is comprised of 16 (=$2^4$) memory cells. The cell unit 45 may be comprised of at least one memory cell. That is, the cell unit 45 including plural memory cells is a general NAND EEPROM, and the cell unit 45 including one memory cell is a so-called 3-Tr NAND.

In a NAND EEPROM, the number of memory cells in the cell unit 45 is preferably $2^n$ (n is a positive integer). This is because $2^n$ memory cells can be selected by decoding an n-bit digital address signal.

The device structure of the semiconductor memory shown in FIGS. 43 to 46 will be described in detail next.

An n-type well region (n-type silicon region) 22 is formed in a p-type silicon substrate 21. A p-type well region (p-type silicon region) 23 is formed in the n-type well region 22. Such a well structure is called a double well structure or twin well structure.

The p-type well region 23 contains a p-type impurity (e.g., boron), whose concentration is set to a predetermined value within the range of $1\times10^{14}$ to $1\times10^{19}$ atoms/cm$^3$. For example, gate insulating films 25, $25_{SSL}$, and $25_{GSL}$ each having a thickness of 0.5 to 10 nm are formed on the p-type well region 23. The gate insulating films 25, $25_{SSL}$, and $25_{GSL}$ are formed from silicon oxide films or oxynitride films.

Charge storing layers 26, $26_{SSL}$, and $26_{GSL}$ each having, for example, a thickness of 4 nm to 50 nm are formed on the gate insulating films 25, $25_{SSL}$, and $25_{GSL}$. In this embodiment, the charge storing layers 26, $26_{SSL}$, and $26_{GSL}$ are formed from silicon oxide films.

Block insulating films 40, $40_{SSL}$, and $40_{GSL}$ each having, for example, a thickness of 2 nm to 30 nm are formed on the charge storing layers 26, $26_{SSL}$, and $26_{GSL}$. The block insulating films 40, $40_{SSL}$, and $40_{GSL}$ are formed from silicon oxide films or oxynitride films.

Polysilicon layers 41, $41_{SSL}$, and $41_{GSL}$ are formed on the block insulating films 40, $40_{SSL}$, and $40_{GSL}$. The polysilicon layers 41, $41_{SSL}$, and $41_{GSL}$ contain an n-type impurity (e.g., phosphorus or arsenic) or p-type impurity (e.g., boron), whose concentration is set to a predetermined value within the range of $1\times10^{17}$ to $1\times10^{21}$ atoms/cm$^3$. Each of the polysilicon layers 41, $41_{SSL}$, and $41_{GSL}$ has, for example, a thickness of 10 nm to 500 nm.

The gate insulating films 25, $25_{SSL}$, and $25_{GSL}$, charge storing layers 26, $26_{SSL}$, and $26_{GSL}$, block insulating films 40, $40_{SSL}$, and $40_{GSL}$, and polysilicon layers 41, $41_{SSL}$, and $41_{GSL}$ are formed on element regions (p-type silicon region) surrounded by element isolation layers 24 to be self-aligned with the element regions (or element isolation layers 24).

In this embodiment, after the formation of the gate insulating films 25, $25_{SSL}$, and $25_{GSL}$, charge storing layers 26, $26_{SSL}$, and $26_{GSL}$, block insulating films 40, $40_{SSL}$, and $40_{GSL}$, and polysilicon layers 41, $41_{SSL}$, and $41_{GSL}$, these layers are processed (etched) to form edge portions in the row direction (at this time, no process for forming edge portions in the column direction is performed).

In this etching (RIE), for example, the p-type well region 23 is also etched to form trenches therein. Each trench has, for example, a depth of 0.05 to 0.5 $\mu$m from the surface. The element isolation layers 24 are then buried in these trenches, and CMP or etchback is executed with respect to the element isolation layers 24 to partition element regions and element isolation regions.

As described above, the gate insulating films 25, $25_{SSL}$, and $25_{GSL}$, charge storing layers 26, $26_{SSL}$, and $26_{GSL}$, block insulating films 40, $40_{SSL}$, and $40_{GSL}$, and polysilicon layers 41, $41_{SSL}$, and $41_{GSL}$ are formed on the element regions surrounded by the element isolation layers 24 formed from silicon oxide films to be self-aligned with the element regions or element isolation regions. Since the gate insulating films 25, $25_{SSL}$, and $25_{GSL}$, charge storing layers 26, $26_{SSL}$, and $26_{GSL}$, block insulating films 40, $40_{SSL}$, and $40_{GSL}$, and polysilicon layers 41, $41_{SSL}$, and $41_{GSL}$ are formed the p-type well region 23 having a flat surface, the uniformity of the memory cell structure improves, thus equalizing the characteristics of the memory cells.

Control gate lines 27(WL0), . . . , 27(WL15) that electrically connect the polysilicon layers 41 of the memory cells M0, M1, . . . , M15 which are arranged in the row direction are formed on the polysilicon layers 41. The control gate lines 27(WL0), . . . , 27(WL15) are made of a low-resistance material, e.g., a metal silicide such as WSi (tungsten silicide), NiSi, MoSi, TiSi, or CoSi.

Likewise, select gate lines 27(SSL) and 27(GSL) that electrically connect the polysilicon layers $41_{SSL}$ and $41_{GSL}$ of the select gate transistors S1 and S2 which are arranged in the row direction are formed on the polysilicon layers $41_{SSL}$ and $41_{GSL}$. The select gate lines 27(SSL) and 27(GSL) are made of a low-resistance material , e.g., a metal silicide such as WSi (tungsten silicide), NiSi, MoSi, TiSi, or CoSi.

In this embodiment, the control gate electrode of each memory cell and the control electrode of each select gate transistor each have a stacked structure constituted by the polysilicon layer 41 with an impurity concentration of $1 \times 10^{17}$ to $1 \times 10^{21}$ atoms/cm$^3$ and a metal silicide such as WSi (tungsten silicide), NiSi, Mosi, TiSi, or CoSi.

Note that the thickness of each of the control gate lines 27(WL0), . . . , 27(WL15) and select gate lines 27(SSL) and 27(GSL) is set to, for example, 10 nm to 500 nm. The control gate lines 27(WL0), . . . , 27(WL15) and select gate lines 27(SSL) and 27(GSL) extend from one end to the other end of one block, in the row direction, which is constituted by plural cell units arranged in the row direction.

Cap insulting films 48 serving as a mask in a gate process are formed on the control gate lines 27(WL0), . . . , 27(WL15) and select gate lines 27(SSL) and 27(GSL).

When the gate insulating films 25, $25_{SSL}$, and $25_{GSL}$, charge storing layers 26, $26_{SSL}$, and $26_{GSL}$, block insulating films 40, $40_{SSL}$, and $40_{GSL}$, polysilicon layers 41, $41_{SSL}$, and $41_{GSL}$, and control lines (control gate lines and select gate lines) 27(WL0), . . . , 27(WL15), 27(SSL), and 27(GSL) are etched by using the cap insulting films 48 as a mask, the edge portions of these components are formed in the column direction.

Side wall insulating films 43 are formed on the edge portions (side walls) of the gate insulating films 25, $25_{SSL}$, and $25_{GSL}$, charge storing layers 26, $26_{SSL}$, and $26_{GSL}$, block insulating films 40, $40_{SSL}$, and $40_{GSL}$, polysilicon layers 41, $41_{SSL}$, and $41_{GSL}$, and control lines (control gate lines and select gate lines) 27(WL0), . . . , 27(WL15), 27(SSL), and 27(GSL) in the column direction.

The side wall insulating films 43 are formed from silicon nitride films, silicon oxide films, or the like. The thickness of each side wall insulating film 43 is set to a predetermined value within the range of 5 nm to 200 nm. In addition, n-type diffusion layers (source/drain regions) 28, $28_s$, and $28_d$ are formed in the p-type well region 23.

Each MONOS EEPROM cell (memory cell) is constituted by the n-type diffusion layer 28, charge storing layer 26, polysilicon layer 41, and control gate lines 27(WL0), . . . , 27(WL15). The select gate transistors are also constituted by the n-type diffusion layers 28, $28_s$, and $28_d$, charge storing layers $26_{SSL}$ and $26_{GSL}$, polysilicon layers $41_{SSL}$ and $41_{GSL}$, and select gate lines 27(SSL) and 27(GSL).

The gate length of each MONOS EEPROM cell is set to a predetermined value within the range of 0.01 $\mu$m to 0.5 $\mu$m. Each of the n-type diffusion layers 28, $28_s$, and $28_d$ contains n-type impurity (e.g., phosphorus, arsenic, or antimony), whose surface concentration is set to a predetermined value within the range of $1 \times 10^{17}$ to $1 \times 10^{21}$ atoms/cm$^3$. In addition, the depth of each of n-type diffusion layers 28, $28_s$, and $28_d$ is set to a predetermined value in the range of 10 nm to 500 nm.

One n-type diffusion layer 28 is shared by two adjacent memory cells. As a consequence, a NAND string constituted by plural series-connected memory cells is implemented. Each of n-type diffusion layers $28_s$ and $28_d$ is shared by two cell units adjacent to each other in the column direction.

The gate length of each select gate transistor is set to be larger than that of each MONOS EEPROM cell (memory cell). For example, the gate length of each select gate transistor is set to a predetermined value within the range of 0.02 $\mu$m to 1 $\mu$m. By setting the gate length of each select gate transistor to be larger than that of each memory cell, the ON/OFF ratio in block selection/nonselection can be sufficiently increased. This makes it possible to prevent write and read errors.

A characteristic feature of the device structure according to this embodiment is that both select gate transistor and memory cell are formed by using MONOS MOSFETs. Another characteristic feature of the device structure according to this embodiment is that the select gate lines 27(SSL) and 27(GSL) of the select gate transistors are formed in the same layer as that of the control gate lines 27(WL0), . . . , 27(WL15).

In this embodiment, the thicknesses of the insulating layer 25 and charge storing layer 26 of each memory cell are substantially the same as those of the insulating films $25_{SSL}$ and $25_{GSL}$ and charge storing layers $26_{SSL}$ and $26_{GSL}$ of each select gate transistor. That is, since the gate insulating films 25, $25_{SSL}$, and $25_{GSL}$ and charge storing layers 26, $26_{SSL}$, and $26_{GSL}$ of each memory cell and each select gate transistor can be formed at once, the manufacturing process can be shortened, and the process cost can be reduced.

The charge storing layers 26, $26_{SSL}$, and $26_{GSL}$ are not formed between the side wall insulating films 43 of two MOSFETs (each including a memory cell and select gate transistor) adjacent to each other in the column direction. For this reason, no electron is stored in the insulating film between two MOSFETs adjacent to each other in the column direction, and an increase in the resistance of the source/drain region can be prevented.

The n-type diffusion layer (drain electrode) $28_d$ located nearest to the bit line side in a cell unit is connected to an intermediate layer $33_d$ through a contact plug $31_d$ made of conductive polysilicon containing an impurity. For example, the intermediate layer $33_d$ is formed to increase the pitch of bit line contact portions in the row direction.

The intermediate layer $33_d$ is connected to a bit line (data transfer line) BL through a contact plug $32_d$ made of conductive polysilicon containing an impurity. A bit line 36(BL) is made of a low-resistance material such as tungsten, tungsten silicide, titanium, titanium nitride, or aluminum.

The n-type diffusion layer (source electrode) 28S located nearest to the source line side in each cell unit is connected to a source line 33(SL) through a contact plug 31s made of conductive polysilicon containing an impurity. The source line 33(SL) linearly extends in the row direction and is shared by cell units in the row direction.

Note that contact plugs $31_d$, 31s, and $32_d$ may be made of a low-resistance material such as tungsten, tungsten silicide, Al, TiN, or Ti instead of conductive polysilicon.

The memory cells and select gate transistors are covered with the interlayer insulating films 28. The bit line 36(BL) is formed in an interconnection trench formed in the interlayer insulating film 28 by, for example, a damascene process. Likewise, the source line 33(SL) and intermediate layer $33_d$ are also formed by, for example, a damascene process. The interlayer insulating film 28 is made of, for example, $SiO_2$ or SiN.

An upper interconnection made of a metal such as W, Alm, or Cu is formed on the bit line 36(BL). The bit line 36(B) and upper interconnection are covered with a protective film (passivation film) 37 formed from an insulating film made of, for example, $SiO_2$, SiN, or polyimide.

In this device structure, the n-type well region 22 is interposed between the p-type well region 23 and p-type silicon substrate 21. For this reason, the potential of the p-type well region 23 can be set independently of the p-type silicon substrate 21. As a consequence, for example, the power consumption of a boosting circuit (booster) can be reduced.

Figure 1:
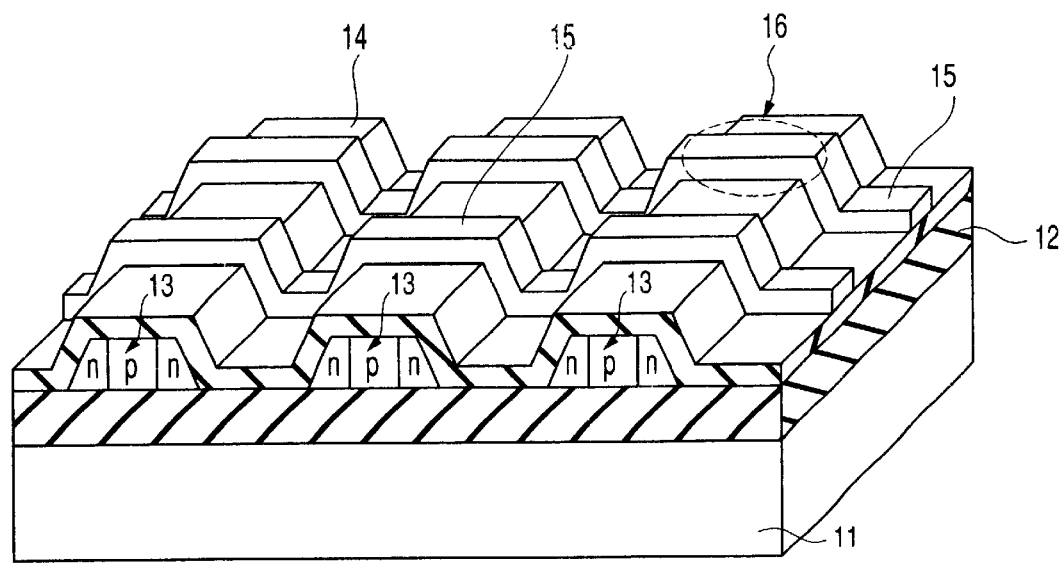
FIG. 1 is a view showing an embodiment of the device structure of a conventional Ferroelectric RAM.
Figure 2:
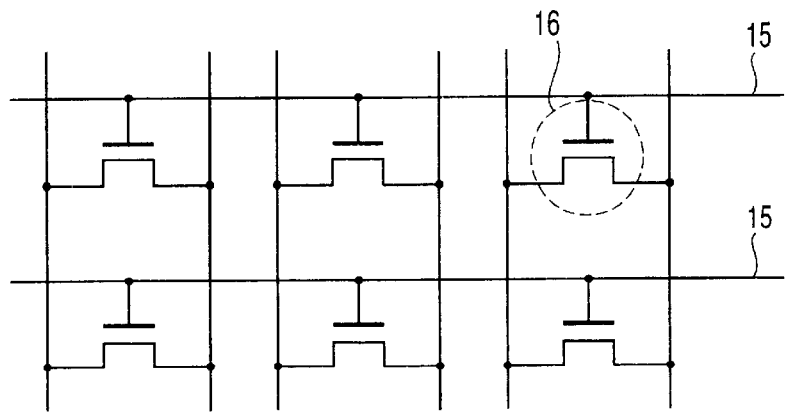
FIG. 2 is an equivalent circuit of the Ferroelectric RAM in FIG. 1.
Figure 3:
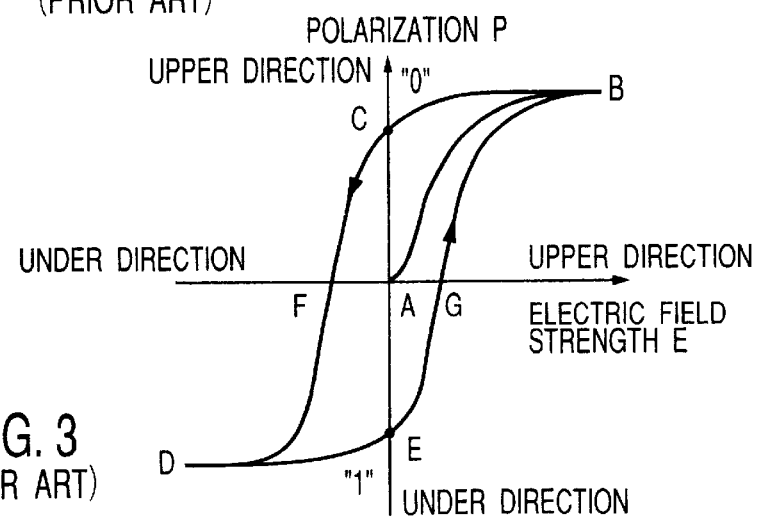
FIG. 3 is a graph showing the hysteresis characteristics of a ferroelectric film.
Figure 8:
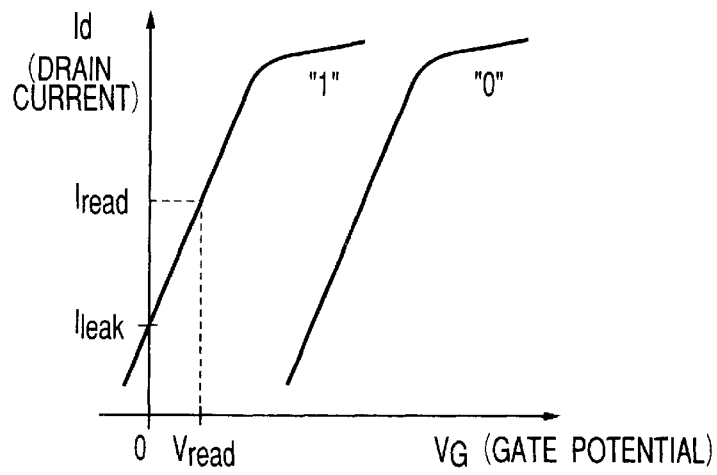
FIG. 8 is a graph showing the relationships between the gate potentials and drain currents of a "1"-cell and "0"-cell.

In this embodiment, the edge portions of the polysilicon layers 41, $41_{SSL}$, and $41_{GSL}$ are formed in the row direction, and trenches are formed in the p-type well region 23. The element isolation layers 24 are buried in these trenches. Thereafter, the control gate lines 27(WL0), . . . , 27(WL15) and select gate lines 27(SSL) and 27(GSL) extending in the row direction are formed. As shown in FIGS. 3 and 4, therefore, the control gate lines 27(WL0), . . . , 27(WL15) and select gate lines 27(SSL) and 27(GSL) are always formed on the p-type well region 23 but are not formed near or under the p-type well region 23.

In the device structure according to this embodiment, electric field concentration does not easily occur in the boundary between the p-type well region 23 and the element isolation layer 24, and a parasitic transistor having a small threshold value is not easily formed either. In addition, since a phenomenon in which a write threshold value decreases due to electric field concentration, i.e., a sidewalk phenomenon, doe not easily occur, highly reliable transistors (memory cells and select gate transistors) can be formed.

Figure 48:
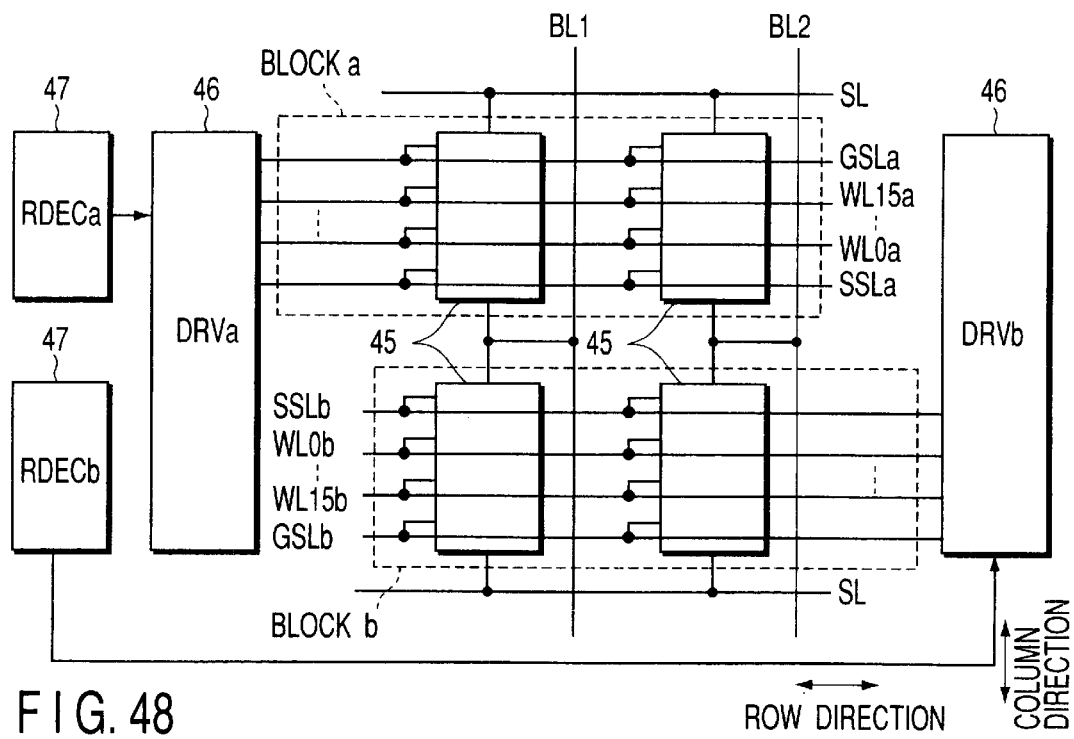
FIG. 48 is a block diagram showing an example of the layout of a memory cell array and drivers.

FIG. 48 shows an example of the block layout of a memory cell array and word line driver.

Reference numeral 45 denotes a cell unit. Each cell unit 45 is formed from, for example, a NAND cell unit or AND cell unit. Plural (16 in this embodiment) word lines (data select lines) WL0x to WL15x (x is a subscript representing a block index a or b) are connected to each cell unit 45 in one block.

Plural (two in this embodiment) select gate lines (block select lines) SSLX and GSLX are connected to each cell unit 45 in one block. The select gate lines SSLX and GSLX have the function of selecting one block from plural blocks and connecting the cell units 45 in one selected block to bit lines (data transfer lines) BL1 and BL2.

Word lines (data select lines) WL0x to WL15x extend in the row direction. The bit lines (data transfer lines) BL1 and BL2 extend in the column direction. The word and bit lines are perpendicular to each other. In the cell unit 45, memory cells are arranged at the intersections of the word lines WL0x to WL15x and the bit lines BL1 and BL2 and can independently write and read digital bit data.

Plural cell units 45 are arranged in the row and column directions to form a memory cell matrix. FIG. 6 shows a memory cell matrix of two cell units (in the row direction)× two cell units (in the column direction), i.e., a total of four cell units. Obviously, however, three or more cell units 45 may be arranged in the row direction, and three or more cell units 45 may be arranged in the column direction.

Considering that the cell units 45 arranged in the row and column directions are selected by decoding an i-bit address signal, the number of cell units 45 arranged in the row or column direction is preferably $2^i$ (i is a positive integer).

One end of each of the word lines WL0x to WL15x and select gate lines SSLX and GSLX is connected to a data select line driver 46. The data select line driver 46 receives a decoding result from a row decoder 47 (RDCa, RDCb) and drives the word lines WL0x to WL15x and select gate lines SSLX and GSLX.

In this embodiment, the data select line drivers 46 are respectively arranged on the two end portions of each memory cell array in the row direction. That is, each memory cell array (block) is located between the data select line drivers 46. Such a layout is used for the following reasons. First, the data select line drivers 46 can be easily laid out. Second, driving timing errors, i.e., skews, between the plural word lines WL0x to WL15x in one cell unit can be eliminated.

In this embodiment, one data select line driver 46 is provided for one block. That is, word lines WL0a, . . . , WL15a in a block a are controlled independently of word lines WL0b, . . . , WL15b in a block b. The data select line driver 46 is formed by using a switch circuit (e.g., a MOS transistor) for applying a program potential Vprog or erase potential Vera to a predetermined word line in a predetermined block on the basis of a decoding result (output) from the row decoder 47.

A method of setting the threshold value of each select gate transistor will be described next.

The select gate transistor S1 connected to the bit line BL will be described below. Like a memory cell, each select gate transistor is formed from a MONOS transistor.

Figure 49:
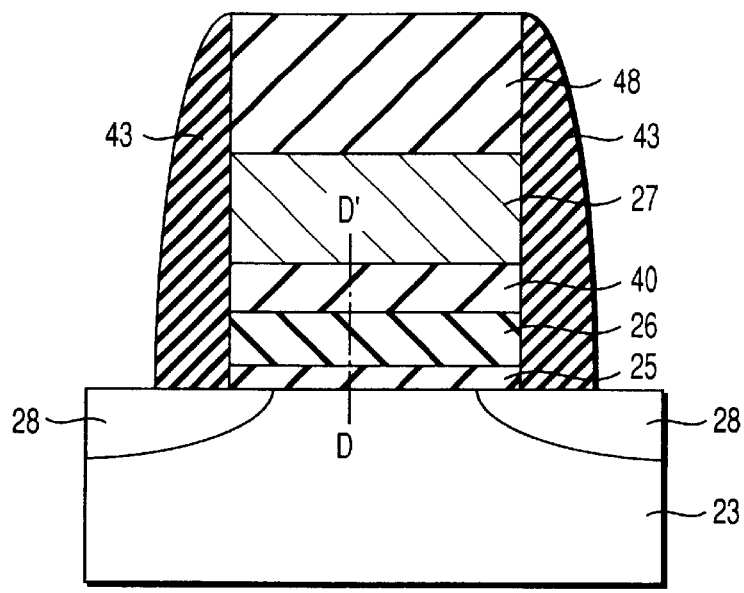
FIG. 49 is a sectional view showing the device structure of a transistor according to the present invention.
Figure 50:
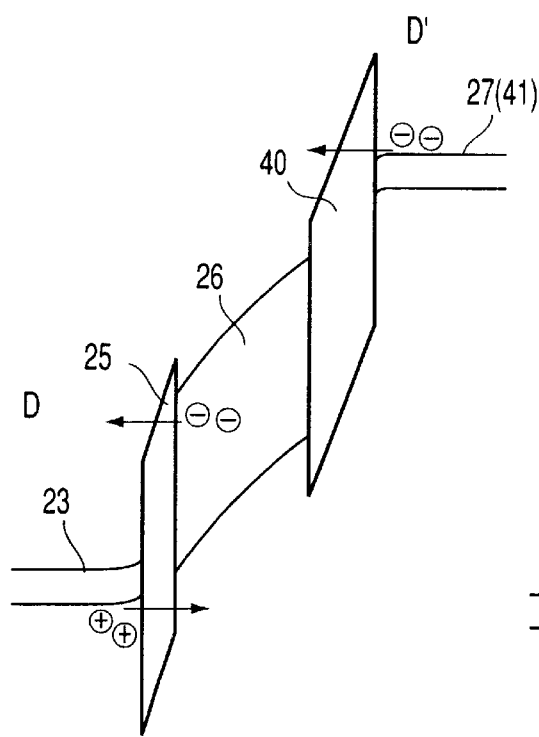
FIG. 50 is a view showing a band state during erase operation of the device in FIG. 49.
Figure 51:
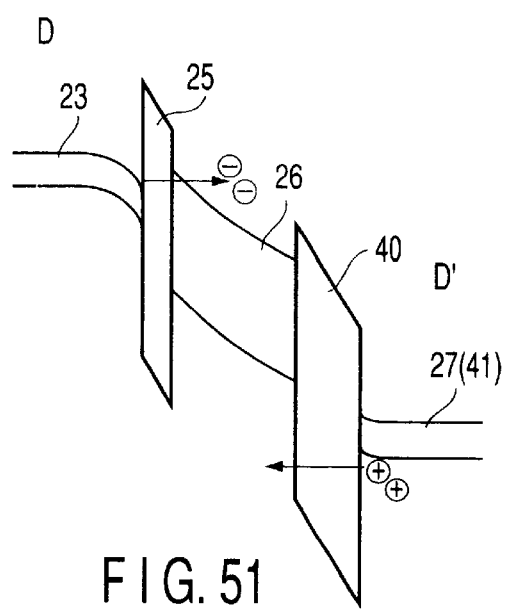
FIG. 51 is a view showing a band state during write operation of the device in FIG. 49.

FIG. 49 shows the device structure of a MONOS transistor according to the present invention. FIG. 50 is a band diagram on a cross-section taken along a line D–D' in FIG. 49 in erase operation. FIG. 51 is a band diagram on the cross-section taken along the line D–D' in FIG. 49 in write operation.

As shown in FIG. 50, the negative charge in the charge storing layer 26 of the MONOS transistor increases/ decreases depending on holes that move from the p-type well region 23 to the charge storing layer 26 or electrons that move from the charge storing layer 26 to the p-type well region 23 owing to a tunnel effect.

When positive charge is stored in the charge storing layer 26 by a predetermined amount or more, the electric field produced in a block insulating film 40 increases in strength. As a consequence, electrons are injected from the control gate electrode 27 into the charge storing layer 26. That is, in erase operation, as electrons in the charge storing layer 26 are extracted to the channel to decrease the threshold value of the MONOS transistor, electrons are injected from the control gate electrode 27 to the charge storing layer 26 from a certain point of time. Consequently, the threshold voltage of the MONOS transistor converges to a value that the voltage has when the current flowing in the gate insulating film 25 is equal to the current flowing in the block insulating film 40.

For this reason, even if the erase time is prolonged, the threshold value of the MONOS transistor does not become lower than a predetermined value and always stays at a value higher than the predetermined value. Therefore, a so-called over erase phenomenon does not occur.

As shown in FIG. 51, in the write operation the negative charge in the charge storing layer 26 will increase if electrons move from an inversion layer formed in the p-type well region 23 to the charge storing layer 26 owning to tunnel effect. The negative charge will increase, too, if the hot electrons are generated in the source, drain or substrate. If the hot holes are generated in the source, drain or substrate, the negative charge will decrease.

When, however, negative charge is stored in the charge storing layer 26 by a predetermined amount or more, the gradient of the band of the block insulating film 40 increases. As a result, holes are injected from the gate electrode 27 into the charge storing layer 26. That is, in write operation, as electrons are injected into the charge storing layer 26 to raise the threshold value of the MONOS transistor, holes are injected from the control gate electrode 27 into the charge storing layer 26 from a certain point of time. Consequently, the threshold voltage of the MONOS transistor converges to a value that the voltage has when the current flowing in the gate insulating film 25 is equal to the current flowing in the block insulating film 40.

For this reason, even if the write time is prolonged, the threshold value of the MONOS transistor does not become larger than the predetermined value and always stays at a value lower than the predetermined value. Therefore, a so-called over write phenomenon does not occur.

As described above, in the device according to this embodiment, the select gate transistors and memory cells are formed by using MONOS transistors, and tunnel currents are flowed into the block insulating films 40 between the charge storing layers 26 and the control gate electrodes (including select gate lines and control gate lines) 27 under a predetermined condition.

The conventional nonvolatile semiconductor memory, which is not designed to flow a current into the insulating film between each charge storing layer and a corresponding control gate electrode, does not have such a characteristic feature.

A technique of saturating the absolute values of the threshold values of the MONOS type memory cells is disclosed in, for example, T. Bohm, A. Nakamura, H. Aozawa, M. Yamagishi and Y. Komatsu, Extended Abstract of the 1995 International Conference on Solid State Devices and Materials, pp. 890–892 (see the write/erase characteristics in FIG. 4 in particular).

Figure 52:
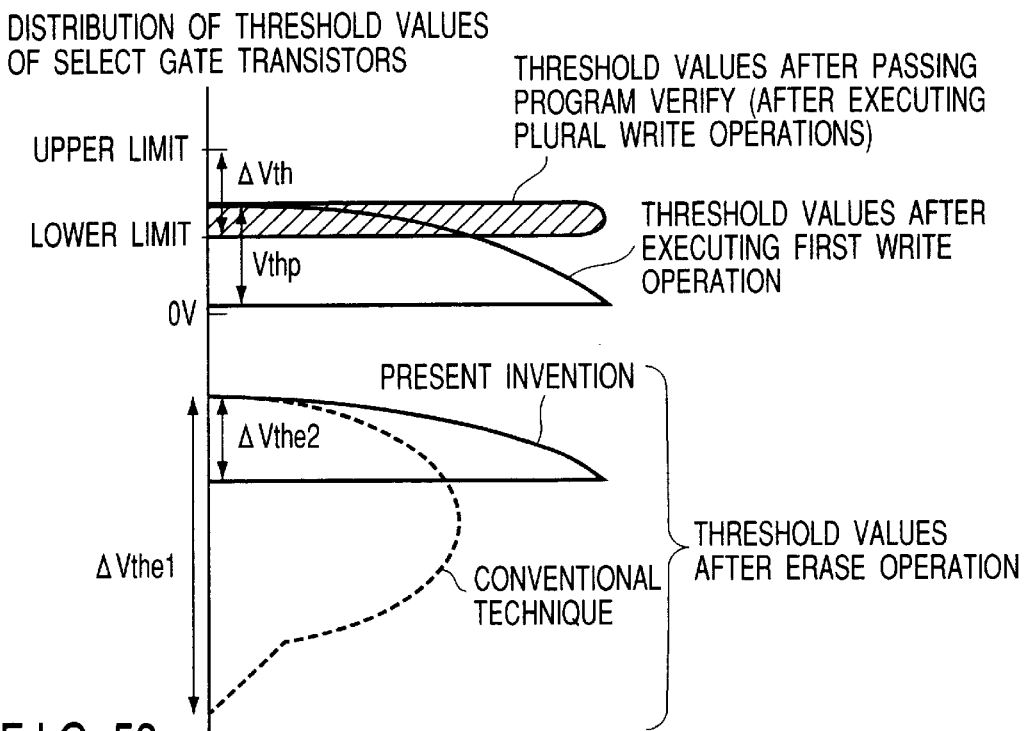
FIG. 52 is a view showing a threshold value distribution after the erase/write operation of the device according to the present invention.

FIG. 52 compares the threshold value distribution after a write/erase in the present invention with that in the prior art.

A conventional memory cell is targeted for a general floating gate type memory cell. In contrast to this, a memory cell or select gate transistor of the present invention is a MONOS transistor in which a tunnel current also flows in the block insulating film between a charge storing layer and a control gate electrode, as described above.

According to the prior art, as indicated by the dotted line, positive charge is trapped in tunnel insulating films to cause a so-called over erase phenomenon in erase operation in which electrons are extracted from charge storing layers into the p-type well region. As a consequence, a width ΔVthe1 of the threshold value distribution of memory cells after an erase operation becomes a very wide range (2V to 3V).

According to the present invention, as indicated by the solid line, even if the number of electrons extracted from the charge storing layer 26 into the p-type well region increases, electrons are injected from the control gate electrode 27 into the charge storing layer 26 to compensate for this increase.

This prevents an over erase phenomenon.

As a result, according to the present invention, a width ΔVthe2 of the threshold value distribution of memory cells or select gate transistors after erase operation can be made smaller than that in the prior art. More specifically, the width ΔVthe2 of the threshold value distribution of memory cells or select gate transistors after erase operation can be set to 1V or less. In addition, according to the present invention, since variations in the threshold values of memory cells or select gate transistors can be reduced, the erase time can be shortened, thus implementing high-speed erase operation.

Likewise, in write operation, according to the cell structure of the present invention, since no over write phenomenon occurs, even if write operation is performed without performing any program verify, the width of the threshold value distribution after the write operation can be made to fall within a very narrow range (e.g., 1V or less). In addition, if program verify is performed after write operation, the width of the threshold value distribution can be set in a narrower range.

According to the present invention, therefore, the upper limit of the threshold value of each select gate transistor can be set to a low value. In addition, even if a lower potential is applied to the select gate electrode of each select gate transistor in read or verify operation, a sufficiently large read current can be obtained. For this reason, the voltage stress produced in the gate insulating film (tunnel insulating film) of each select gate transistor can be reduced, thereby attaining an increase in the breakdown voltage of the gate insulating film and preventing fatigue (deterioration) of the gate insulating film.

A sequence of operations of setting the threshold value of the select gate transistor S1 when a MONOS transistor according to the present invention is used for the select gate transistor S1 will be described next.

Operation of setting the threshold value of the select gate transistor S1 will be described below. In the present invention, in general, after the threshold value of the select gate transistor S1 is set, the threshold value of the select gate transistor S2 is set. Thereafter, a data write/erase is performed with respect to memory cells.

A threshold value can be set for the select gate transistor S2 or memory cell by a method similar to that described below.

Write, erase, and verify operations are known techniques as disclosed in, for example, Jpn. Pat. Appln. KOKAI Publication No. 08-315590 and Japanese Patent Application No. 11-198978, and hence a detailed description thereof will be omitted.

Figure 53:
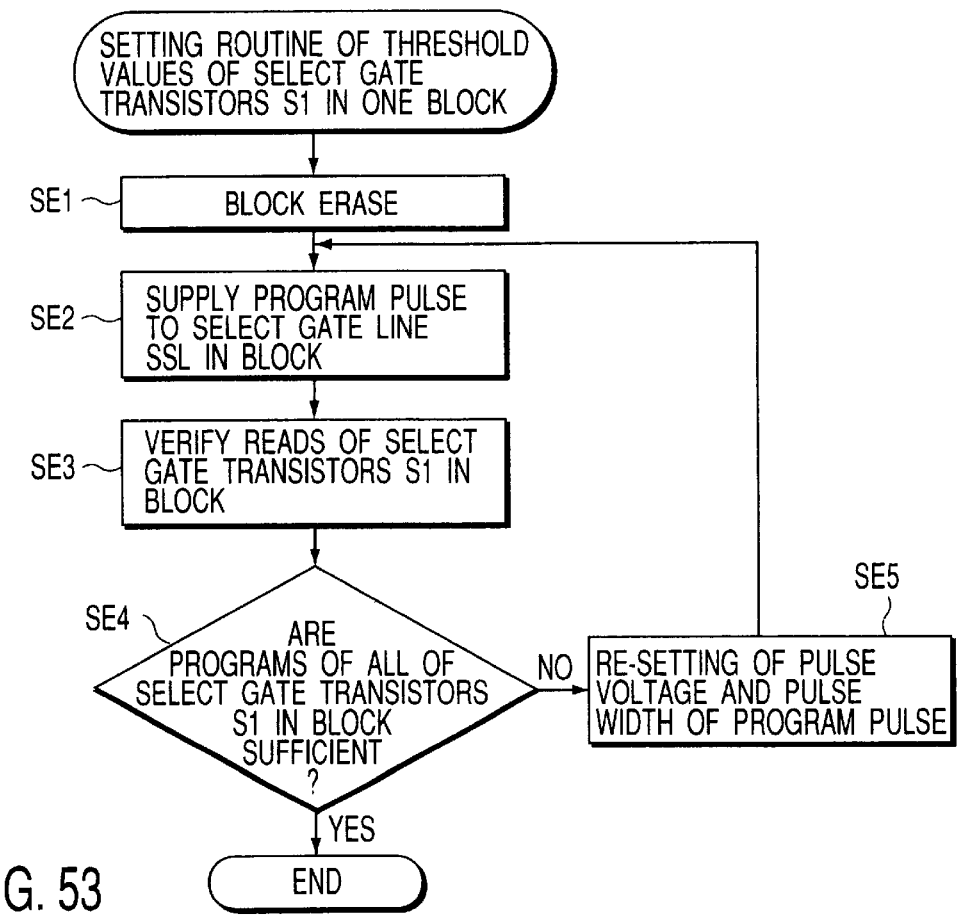
FIG. 53 is a view showing the first embodiment of a threshold value setting method for a transistor according to the present invention.

FIG. 53 shows a threshold value setting routine for the select gate transistor S1 in one block.

The threshold value setting routine is comprised of steps SE1 to SE5.

Step SE1 is a block erase step.

The block erase step aims at setting plural select gate transistors S1 connected to the select gate line SSL in one block in the erase state. The data in the select gate transistor S1 is erased by, for example, applying a positive potential vppe to the p-type well region 23 and 0V to the select gate line SSL.

In this block erase state, no erase verify is required. That is, in block erase, there is no need to use a circuit for measuring a negative threshold value and checking whether the select gate transistor S1 is reliably set in the erase state, and hence the circuit area can be reduced accordingly.

In this embodiment, on the threshold value setting method for the select gate transistor S1 is taken into consideration, and hence the above description is based on only the operation of setting only the select gate transistor S1 in the erase state. However, all the select gate transistors S1 and S2 and memory cells M0, M1, . . . , M15 in one block may be simultaneously set in the erase state. In this case, after all the select gate transistors S1 and S2 and memory cells M0, M1, . . . , M15 in one block are set in the erase state, write operation is performed with respect to the select gate transistor S1, select gate transistor S2, and memory cells M0, M1, . . . , M15 in the order named, thereby setting their threshold values.

Step SE1 is performed within the time range of 1 ns to 1 $\mu$s.

More specifically, the select gate line SSL in a selected block is set in the floating state first, and then the p-type well region 23 is set to the erase potential Vppe. The potential of the select gate line SSL in the selected block is lowered to 0V. In addition, to prevent a malerase, the word lines (data select lines) WL0, WL1, . . . , WL15 and the select gate lines SSL and SGL in each unselected block are set in the floating state.

In order to complete erase operation at a practical speed of 100 ms or less, the erase potential Vppe is set to a sufficient value for flowing a tunnel current of $1\times10^{-4}$ A/cm$^2$ or more in the tunnel insulating film. If, for example, a silicon oxide film having a thickness $t$ [nm] is used as the tunnel insulating film 25, a practical erase speed can be obtained by setting the erase potential Vppe within the range of $t$ [V] to 6t [V].

In addition, the pulse width of the erase potential (erase pulse) Vppe is set to a value within the range of 1 us to 100 $\mu$s. If this erase potential Vppe is simultaneously applied to the select gate lines SSL and GSL and word lines WL0, WL1, . . . , WL15, the erase sequence can be effectively speeded up.

After erase operation, the threshold values of all select gate transistors and all memory cells in the erase block (selected block) become negative, and the ground potential is applied to the select gate lines 27SSL and 27GSL and control gate lines 27(WL0), 27(WL1), . . . , 27(WL15) in the erase block. For this reason, the source line SL and bit line BL are rendered conductive to each other.

As a consequence, an erase threshold value distribution like the one indicated by the solid line in FIG. 52, i.e., a threshold value distribution having no threshold value equal to or less a predetermined value, can be obtained. In addition, the width $\Delta$the2 of the threshold value distribution after application of one erase pulse to the select gate line SSL can be decreased, as shown in FIG. 52.

An erase time is set to a time during which a tunnel current flows between the control gate electrode 27 and the charge storing layer 26, and the tunnel current becomes equal to or larger than a tunnel current flowing between the charge storing layer 26 and the p-type well region 23.

Step SE2 is executed next.

In this step, a program pulse is applied to the select gate line SSL in a selected block.

The program pulse is set to a potential higher than that of the p-type well region 23. If, for example, the p-type well region 23 is at 0V, the program pulse is set to a positive potential. More specifically, the potential of the p-type well region 23 is set to 0V, and the potential of the bit line (data transfer line) BL is set to be equal to that of the source line SL. In addition, the select gate line SSL in the selected block is set to the program potential Vpgm.

The select gate line SSL in each unselected block is set to a potential (e.g., 0V) sufficiently lower than the program potential Vpgm or in the floating state. In this case, to complete write operation at a practical speed of 100 ms or less, the program potential Vpgm is set to a value large enough to flow a tunnel current of $1\times10^{-4}$ A/cm$^2$ or more.

If, for example, a silicon oxide film having the thickness $t$ [nm] as a tunnel insulating film, the program potential Vpgm is set to a predetermined value within the range of $t$ [V] to 6t [V]. In addition, the pulse width of the program potential Vpgm is set to a predetermined value within the range of 1 $\mu$s to 100 ms.

While write operation is performed for the select gate transistors in the selected block, the word lines (data select lines) WL0, WL1, . . . , WL15 in the selected block are set to 0V or in the floating state to prevent write errors.

In step SE2, the lowest point of the threshold value distribution of the select gate transistor S1 on the drain side (bit line side) is set to a level higher than 0V.

As a consequence, subsequently, when 0V is applied to the select gate line SSL, the select gate transistor S1 can be set in the cutoff state. That is, for example, in program verify or verify read operation, data can be read out from the select gate transistors S1 and S2 or memory cells M0, M1, . . . , M15 in the selected block.

If the lowest point of the threshold value distribution of the select gate transistor S1 is equal to or lower than 0V, the source line SL is short-circuited to the bit line BL in some block. In this case, therefore, program verify (SE3) cannot be executed.

More specifically, the lowest point of the threshold value distribution of the select gate transistor S1 is set to 0V or more by the first program pulse (step SE2 for the first time) of the first cycle. If the threshold value distribution of the select gate transistor S1 falls within a range $\Delta$Vth of the upper limit of the threshold value to the lower limit of the threshold value, threshold value setting operation for the select gate transistor S1 may be immediately terminated.

Even if the write time is prolonged, the highest point of the threshold value distribution of the select gate transistor S1 does not exceed the upper limit of the threshold value, and the width of the threshold value distribution can be decreased. In this case, as described with reference to FIG. 51, the write time is set to a time during which a tunnel current flows between the control gate electrode 27 and the charge storing layer 26, and the tunnel current becomes equal to or larger than a tunnel current flowing between the charge storing layer 26 and p-type well region 23.

In the prior art, in order to set the lowest point of the threshold value distribution of the select gate transistor S1 to 0V or higher, for example, the difference between the upper limit of the threshold value in FIG. 52 and 0V must be larger than $\Delta$Vthe1 (e.g., a value corresponding to 2V or more). This is because, basically, the threshold value distribution in the erase state directly shifts to become a threshold value distribution in the write state. For this reason, the upper limit of the threshold value becomes excessively high, and a so-called pass voltage (the potential of an unselected word line in the selected block) in data read operation (including verify read operation) becomes high.

According to the present invention, since the width ΔVth2 of each of the select gate transistors and memory cells in the erase state can be greatly decreased, a width Vthp of the threshold value distribution in the write state which can be obtained by shifting the threshold value distribution in this erase state to the positive direction can also be decreased. Therefore, the difference between the upper limit of the threshold value and 0V can be decreased to, for example, 1V or less.

Since the upper limit of the threshold value can be decreased in this manner, a so-called pass potential in data read operation (including verify read operation) can be decreased. In addition, this can eliminate the problem of stress or fatigue in the gate insulating film of the select gate transistor S1.

According to the present invention, even if the write time is prolonged (the number of program pulses is increased), the maximum value of the threshold value of the select gate transistor S1 (set between the upper limit of the threshold value and the lower limit of the threshold value) doe not vary. For this reason, the lower limit gradually increases, and a threshold value distribution (the hatched range in FIG. 52) having a very small width can be obtained.

If ΔVth2>ΔVth and (upper limit of threshold value)—0V>ΔVth2, the threshold value distribution of the select gate transistor S1 can be further narrowed by performing program verify operation. In this case, the threshold value distribution after the first program pulse application (step SE2) may be set such that its lowest point becomes higher than 0V, as shown in FIG. 52.

Step SE3 will be described next.

In step SE3, verify read operation is performed for the select gate transistor S1 in a selected block. More specifically, the threshold value of the select gate transistor S1 in the selected block is compared with the lower limit of the threshold value. If the threshold value of the select gate transistor S1 is lower than the lower limit of the threshold value, it is determined in step SE4 that the write is insufficient. If the threshold value of the select gate transistor S1 is higher than the lower limit of the threshold value, it is determined in step SE4 that the write is sufficient.

If it is determined that writes are sufficient for all the select gate transistors S1 in the selected block, the threshold value setting operation is terminated.

Step SE3, i.e., a verify read, is performed as follows in practice.

First of all, the bit line (data transfer line) BL is charged to Vread first, and then the bit line BL is set in the floating state. The source line SL is set to 0V. Vread is a potential between the power supply potential Vcc and 0V, and is preferably set to a value of Vcc/2 or more in consideration of the sensitivity of an nMOS sense amplifier.

Vread is a pass potential to be applied to each unselected word line in a selected block, and needs to be higher than the upper limit of the threshold value.

The verify potential Vref is applied to the select gate line SSL in the selected block. Vref is set to, for example, 0V +(lower limit of threshold value) + (margin). The margin is a value that depends on the sensitivity of a sense amplifier. The value (margin) that depends on the sensitivity of the sense amplifier is about 0 to about 0.2V in consideration of array noise, variations in the threshold value of the input transistor of the sense amplifier, and the like.

If the threshold value of the select gate transistor S1 is lower than Vref, the select gate transistor S1 is turned on, and the charge in the bit line BL is discharged to the source line SL through the select gate transistor S1. The potential of the bit line BL therefore drops. In contrast to this, if the threshold value of the select gate transistor S1 is higher than Vref, the select gate transistor S1 is turned off. In this case, no current flows in the select gate transistor S1, and the potential of the bit line BL is held at Vread.

As described above, the potential of the bit line BL changed depending on the state of the threshold value of the select gate transistor S1 in the selected block.

If, therefore, the bit line BL is electrically connected to the sense amplifier, and a change in the potential of the bit line BL is detected by the sense amplifier, whether a write for the select gate transistor S1 is sufficient or insufficient can be determined (step SE4).

If the threshold value of at least one select gate transistor S1 in the selected block is lower than Vref, the pulse voltage and width of a program pulse are re-set, and the program pulse is applied to the select gate line SSL in the selected block again, thereby executing a re-write for the select gate transistor Si (step SE5).

The pulse voltage and width of the program pulse used for the re-write are set such that the shift amount of the threshold value falls within ΔVth. More specifically, the pulse voltage and width of the program pulse used for the re-write are set such that the pulse voltage is lower than the pulse voltage of the program pulse in a preceding write, and the pulse width is smaller than that of the program pulse in the preceding write.

A sequence for changing the pulse voltage and width of a program pulse in this manner is disclosed in Jpn. Pat. Appln. KOKAI Publication No. 08-315590.

After the verify operation from step SE2 to step SE5 is repeated m times, the width of the threshold value distribution of the select gate transistor S1 in the selected block can be decreased to about ΔVthe/m, as indicated by the hatched portion in FIG. 52. For example, the width of the threshold value distribution of the select gate transistor S1 can be set to 0.5V or less.

The above description is associated with the circuit operation to be performed when the threshold value of the select gate transistor S1 in one block is to be set.

After the threshold value of the select gate transistor S1 is set, the threshold value of the select gate transistor S2 in one block is set. Thereafter, data write/erase operation for the memory cells M0, M1, . . . , M15 is executed.

Circuit operation to be performed when threshold values are simultaneously set for the select gate transistors S1 in plural blocks will be described next.

Figure 54:
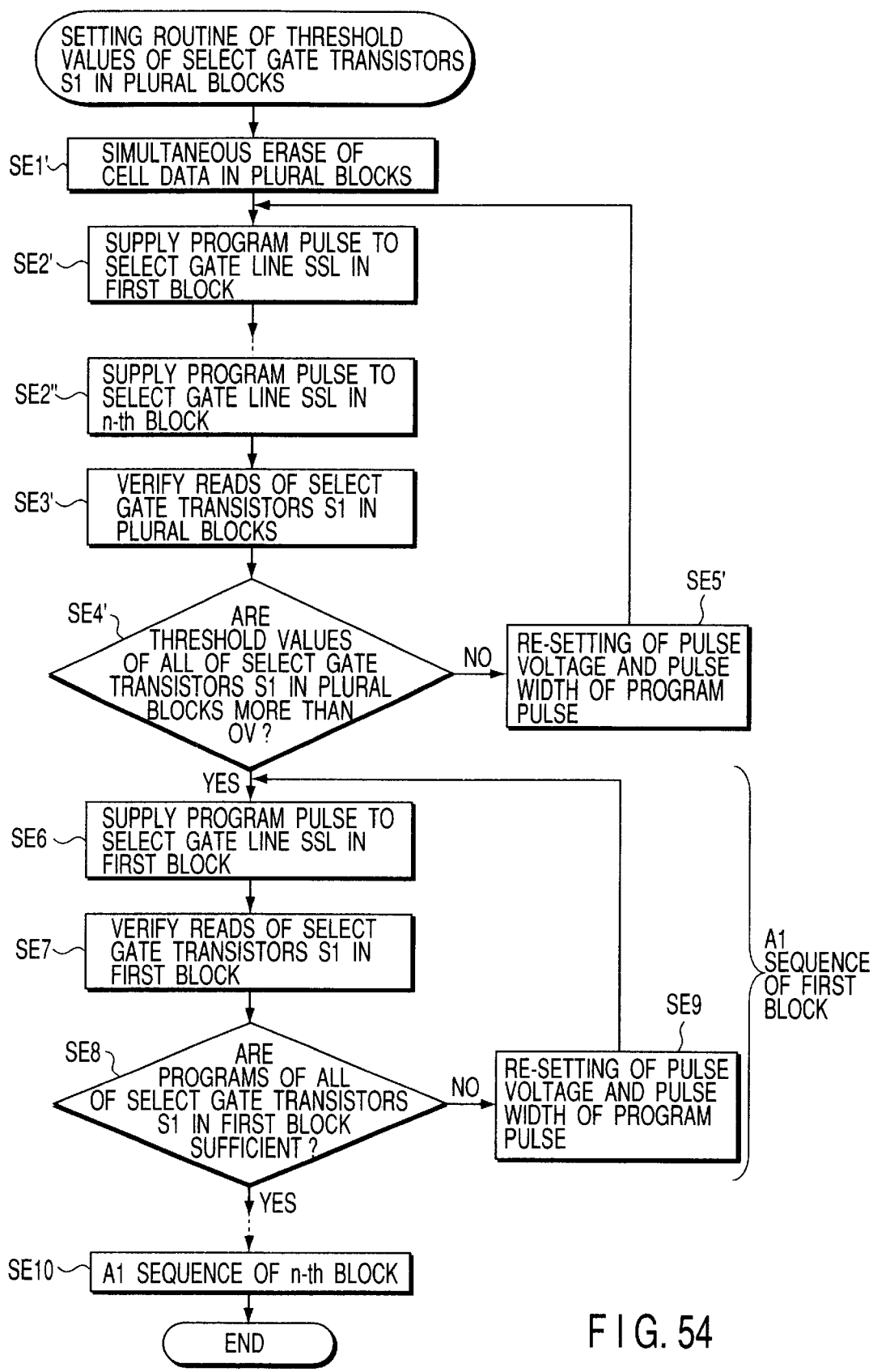
FIG. 54 is a view showing the second embodiment of the threshold value setting method for a transistor according to the present invention.

FIG. 54 shows circuit operation to be performed when threshold values are simultaneously set for the select gate transistors S1 in plural blocks.

In step SE1', the data in the select gate transistors S1 and S2 and memory cells M0, M1, . . . , M15 in plural blocks are simultaneously erased. A potential lower than that of the p-type well region 23 is applied to the select gate lines SSL in plural blocks (selected blocks). For example, 0V is applied to each select gate line SSL, and a positive potential is applied to the p-type well region 23. Likewise, 0V is applied to the select gate line GSL and control gate lines WL0, WL1, . . . , WL15.

When step SE1', i.e., erase operation for the select gate transistors S1 and S2 and memory cells M0, M1, . . . , M15 in plural blocks, is completed, all the threshold values of the select gate transistors S1 and S2 and memory cells M0, M1, . . . , M15 become negative. Therefore, the bit line (data transfer line) BL and source line SL are always rendered conductive (short-circuited).

In the flow chart in FIG. 54, plural (n) blocks are respectively assigned the numbers 1 to n.

In step SE2', a program pulse is applied to the select gate line SSL in the first block. Likewise, a program pulse is sequentially applied to the select gate lines SSL in the second block to the nth block (step SE2").

As a result, the threshold values of the select gate transistors S1 in all the blocks, from the first block to the nth block, are set to 0V or more. In this embodiment, the first write is sequentially performed for the select gate transistors S1 in unit of blocks. Instead of this operation, however, a program pulse may be simultaneously supplied to the select gate lines SSL in all the blocks (first to nth blocks) to simultaneously perform the first write for the select gate transistors S1 in all the blocks. This operation can contribute to a shorter write time.

In step SE3', verify reads are performed for the select gate transistors S1 in the plural blocks (first to nth blocks).

The verify reads can be simultaneously performed for all the select gate transistors S1 in the plural blocks. More specifically, all the bit lines BL are set to a precharge potential first, and then set in the floating state. Vref1 is simultaneously applied to all the select gate lines SSL in the plural blocks, and 0V is applied to the select gate lines GSL and control gate lines WL0, WL1, . . . , WL15.

In this case, if the threshold value of at least one of the select gate transistors S1 in the plural blocks is less than Vref1, the charge in the bit line BL is discharged to the source line S1 through the select gate transistor S1. As a consequence, the potential of the bit line BL drops. If the threshold values of all the select gate transistors S1 in the plural blocks exceed Vref1, the bit line BL is maintained at the precharge potential.

If, for example, in verify read operation, AND processing is performed for the potentials of all the bit lines BL, verify determination can be simultaneously performed with respect to all the select gate transistors S1 in the plural blocks (step SE4').

Note that the purpose of steps SE2' to SE5' is to set the threshold values of all the select gate transistors S1 in the plural blocks to be higher than 0V. Vref1 in these steps may be lower than the lower limit of the threshold value as long as it exceeds 0V.

If the threshold value of at least one of the select gate transistors S1 in the plural blocks is lower than Vref1 after the verify reads, the pulse voltage and width of the program pulse are re-set, and rewrites are executed (SE4' and SE5').

The state of a cell unit with the select gate transistor S1 having a negative threshold value will be described below.

FIG. 55 is an equivalent circuit of each cell unit after simultaneous erase of data from transistors in plural blocks.

Reference symbols Ma1, Ma2, Mb1, and Mb2 denote drain-side (bit-line-side) select gate transistors S1 in cell units. All the threshold values of the select gate transistors S2 and memory cells M0, M1, . . . , M15 are set to negative values. Therefore, the select gate transistors S2 and memory cells M0, M1, . . . , M15 in the cell units can be expressed as resistive elements.

Assume that at least one of the select gate transistors Ma1, Ma2, Mb1, and Mb2 has a negative threshold value. In this case, if select gate lines SSLa and SSLb are set to 0V, at least one of the bit lines BL1 and BL2 is short-circuited to the source line SL through the cell unit.

Assume that the threshold values of all the select gate transistors Ma1, Ma2, Mb1, and Mb2 are positive. In this case, even if the select gate lines SSLa and SSLb are set to 0V, the bit lines BL1 and BL2 are not short-circuited to the source line SL. In this case, the threshold value setting routine to be performed after step SE6 in FIG. 54 can be accurately performed.

The purpose of setting the threshold values of all the select gate transistors in the plural blocks to positive values is to accurately perform threshold value setting steps (SE6 to SE10) to be executed afterward.

It is conceivable that steps SE1' to SE5' will make the threshold value distribution of all the select gate transistors S1 in the plural blocks fall within the range $\Delta Vth$ from the lower limit of the threshold value to the upper limit of the threshold value. In this case, since the significance of the execution of steps from step SE6 reduces, the threshold value setting operation of the select gate transistors S1 may be terminated upon completion of step SE4'.

If, however, the write time (the number of times of write operations) is prolonged, the lower limit of the threshold value distribution of the select gate transistor S1 gradually rises although the highest point of the distribution does not change. In consideration of a decrease in the width of the threshold value distribution of the select gate transistor S1, the execution of steps from step SE6 is significant.

As shown in FIG. 51, the write time in this case is set to a time during which a tunnel current flows between the control gate electrode 27 and the charge storing layer 26, and the tunnel current becomes equal to a tunnel current flowing between the charge storing layer 26 and the p-type well region 23.

According to the prior art, to cut off the select gate transistors S1 in unselected blocks, the difference between the upper limit of the threshold value and 0V must be set to be larger than $\Delta Vth1$ (FIG. 25), which is 2V or more. Even if verify operation is performed and the threshold value of each select gate transistor S1 is set to be higher than the lower limit of the threshold value, the upper limit of the threshold value can not be decreased.

According to a statistical theory, when the number of blocks is $\underline{n}$, the width of the threshold value distribution of the select gate transistors S1 in plural blocks is larger than that of the select gate transistors S1 in a signal block by $n^{(1/2)}$ times. In addition, the upper limit of the threshold value increases.

If the upper limit of the threshold value increases, Vread in read operation must be set to be higher than the upper limit of the threshold. As a consequence, the value of Vread increases, fatigue or stress is produced in the gate insulating film.

In contrast to this, according to the present invention, since the $\Delta Vth2$ (see FIG. 52) of the threshold value distribution of transistors after erase operation becomes very small, the difference between the upper limit of the threshold value and 0V can be set to a very small value (e.g., 1V or less). As a consequence, the upper limit of the threshold value can be decreased. This makes it possible to reduce fatigue and stress produced in a gate insulating film.

If $\Delta Vth2 > \Delta Vth$ and (upper limit of threshold value)—$0V > \Delta Vth2$ in FIG. 52, the width of the threshold value distribution of the select gate transistors S1 can be decreased by performing program verify operation for the select gate transistors S1 in the respective blocks.

The operation from step SE6 to step SE9 may be performed in the same manner as in the operation from step SE2 to step SE5 described with reference to FIG. 53. A description of the operation from step SE6 to step SE9 will therefore be omitted.

The operation from step SE6 to step SE9 is a sequence for the first block. That is, if there are $\underline{n}$ selected blocks, the same operation as that from step SE6 to step SE9 is repeatedly performed for the first block to the nth block (step SE10).

If the operation from step SE6 to step SE9 is repeated m times for one block, the width of the threshold value distribution of the select gate transistors S1 can be reduced to about ΔVthe/m, as indicated by the hatched portion in FIG. 52. More specifically, the width of the threshold value distribution of the select gate transistors S1 can be set to 0.3V or less.

The operation shown in FIG. 54 is effective in reducing power consumption and the like because the threshold values of the select gate transistors S1 can be set at high speed, and the write/erase time can be shortened as compared with the technique of performing erase operation, threshold value setting for select gate transistors, and verify operation in units of blocks (the technique of setting threshold values for the select gate transistors in one block first, and then setting threshold values for the select gate transistors in the next block).

A detailed example of the circuit for performing write/erase operation for the select gate transistors S1 and S2 is disclosed in, for example, Jpn. Pat. Appln. KOKAI Publication No. 2000-76880.

A potential to be applied to the select gate line SSL may be determined on the basis of the potential relationship described with reference to the flow chart of FIG. 53. In addition, the potential relationship in write/erase operation for memory cells, which is disclosed in Jpn. Pat. Appln. KOKAI Publication No. 2000-76880, may be used as the potential relationship in write/erase operation for select gate transistors according to the present invention.

The device on which this embodiment is based has a MONOS structure in which each charge storing layer 26 is made of SiN. The threshold value setting method of the present invention can also be applied to a device in which each charge storing layer 26 is made of an insulating film other than an SiN film. That is, the threshold value setting method of the present invention can be applied to any structure in which the amount of charge in each charge storing layer is saturated by carriers flowing between the control gate electrode and the charge storing layer, and the write threshold value or erase threshold value is saturated.

For example, the charge storing layer 26 can be made of conductive silicon (Si). FIG. 56 shows a band diagram in erase operation. FIG. 57 shows a band diagram in write operation. In this case, for example, the thickness of the block insulating film 40 is set within the range of 1 nm (inclusive) to 20 nm (inclusive).

According to the band diagram in the erase operation in FIG. 56, the amount of negative charge in each charge storing layer 26 decreases (or the amount of positive charge increases) depending on electrons that move from the charge storing layer 26 to the p-type well region 23 owing to a tunnel effect. When the negative charge in the charge storing layer 26 decreases by a predetermined amount or more, the electric field in the block insulating film 40 increases in strength, and electrons are injected from the control gate electrode 27 into the charge storing layer 26. For this reason, the threshold value of the transistor does not decrease below a predetermined value even if the erase time is prolonged, thus preventing a so-called over erase phenomenon.

As shown in FIG. 57, in the write operation the negative charge in the charge storing layer 26 will increase if electrons move from an inversion layer formed in the p-type well region 23 to the charge storing layer 26 owning to tunnel effect. The negative charge will increase, too, if the hot electrons are generated in the source, drain or substrate. If the hot electrons are generated in the source, drain or substrate, the negative charge will decrease. When the amount of negative charge in the charge storing layer 26 increases by a predetermined amount or more, the gradient of the band of the block insulating film 40 increases, and electrons are extracted from the charge storing layer 26 into the control gate electrode 27. As a consequence, the threshold value of the transistor does not increase beyond a predetermined value even if the write time is prolonged, thus preventing a so-called over write phenomenon.

As described above, the charge storing layer 26 may be made of conductive silicon. In general, the charge storing layer 26 may be made of a conductive material such as S1, SiGe, or Ge containing an impurity (e.g., P, As, or B) or an insulating material such as SiN, titanium oxide, tantalum oxide, or alumina.

[Second embodiment]

Figure 58:
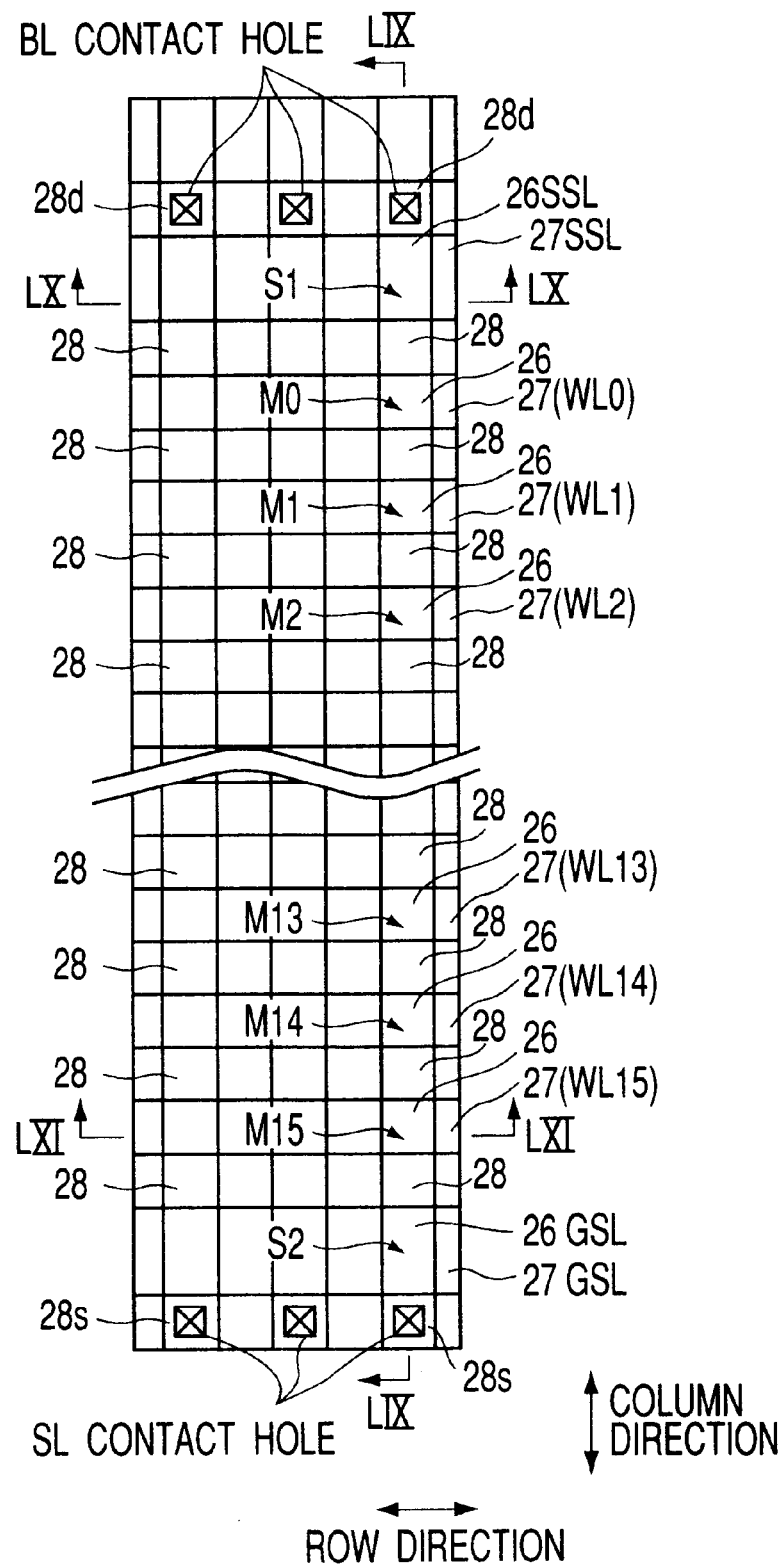
FIG. 58 is a plan view showing the second embodiment of the EEPROM according to the present invention.
Figure 60:
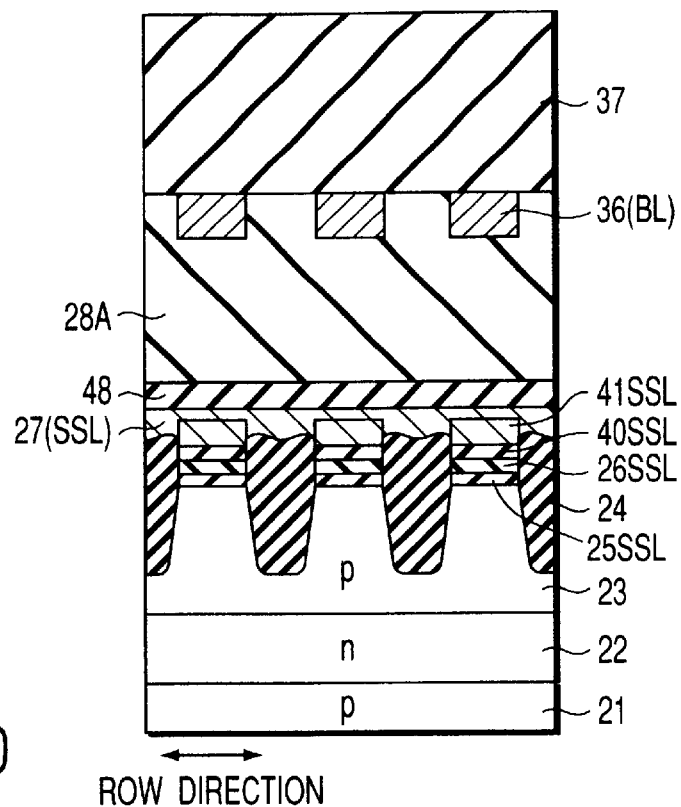
FIG. 60 is a sectional view taken along a line LX—LX in FIG. 58.
Figure 61:
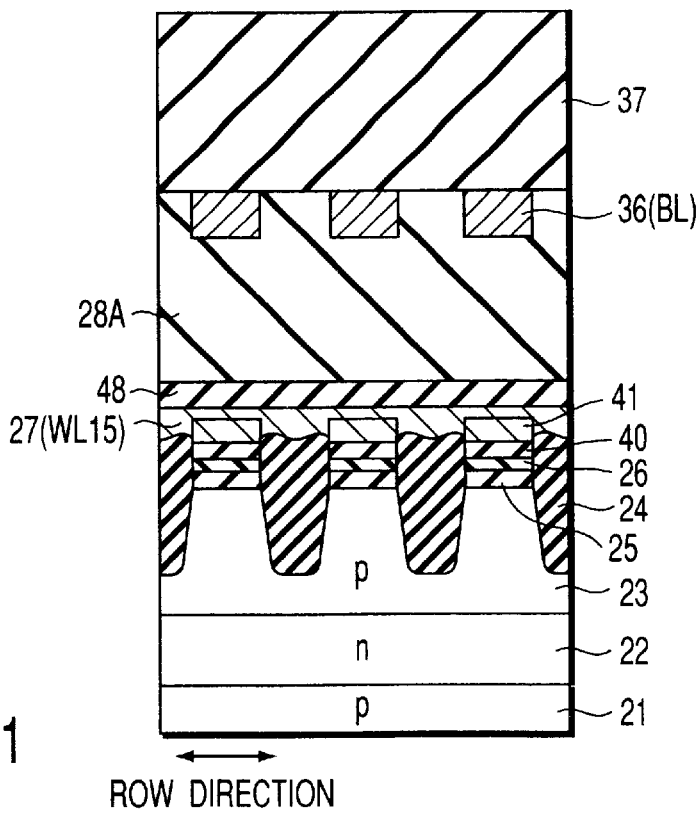
FIG. 61 is a sectional view taken along a line LXI—LXI in FIG. 58.

FIG. 58 is a plan view showing the cell array structure of a NAND EEPROM according to the present invention. FIG. 59 is a sectional view taken along a line LIX—LIX in FIG. 58. FIG. 60 is a sectional view taken along a line LX—LX in FIG. 58. FIG. 61 is a sectional view taken along a line LXI—LXI in FIG. 58.

The same reference numerals as in FIGS. 43 to 46 denote the same parts of the device in FIGS. 58 to 61, and a detailed description thereof will be omitted.

In comparison with the device according to the first embodiment described above, a characteristic feature of this device is that charge storing layers 26 extend in the column direction, and the charge storing layers 26 of select gate transistors S1 and S2 and memory cells M0, M1, . . . , M15 in one cell unit are integrated.

Of the charge storing layer 26, regions in which charges are actually stored are portions directly under control gate electrodes 27(WL0), . . . , 27(WL15) and portions directly under select gate electrodes 27(SSL) and 27(GSL). Even if the charge storing layers 26 in one cell unit are integrated (not shared), no problem arises in terms of the operation of an EEPROM.

Each of the select gate transistors S1 and S2 and memory cells M0, M1, . . . , M15 is formed by using a MONOS transistor having the charge storing layer 26. In this embodiment, one cell unit 45 is comprised of a NAND string constituted by 16 ($=2^4$) series-connected memory cells and the two select gate transistors S1 and S2 respectively connected to the two ends of the NAND string.

The number of memory cells arranged in one cell unit 45 may be one or more. If one cell unit 45 includes one memory cell, a special EEPROM called a 3Tr-NAND is obtained. In general, one cell unit includes plural memory cells. In consideration of the fact that memory cells in one cell unit 45 are selected by decoding an n-bit address signal, one cell unit 45 preferably includes $2^n$ (n is a positive integer) memory cells.

A p-type well region 23 contains a p-type impurity (e.g., boron), whose concentration is set to a predetermined value within the range of $1\times10^{14}$ to $1\times10^{19}$ atoms/cm$^3$. Tunnel gate insulating films 25, $25_{SSL}$, and $25_{GSL}$ are formed on the p-type well region 23. The thickness of the tunnel insulating film 25 is set to a predetermined value within, for example, the range of 0.5 to 10 nm. The gate insulating films 25, $25_{SSL}$, and $25_{GSL}$ are formed from insulating films such as silicon oxide films or oxynitride films.

Charge storing layers 26, $26_{SSL}$, and $26_{GSL}$ are formed on the gate insulating films 25, $25_{SSL}$, and $25_{GSL}$. The charge storing layers 26, $26_{SSL}$, and $26_{GSL}$ are formed from, for example, silicon oxide films. The thickness of each silicon nitride film is set to a predetermined value within the range of 4 nm to 50 nm.

In this embodiment, the tunnel insulating films $25_{SSL}$ and $25_{GSL}$ directly under the select gate transistors S1 and S2 are thicker than the tunnel insulating films 25 directly under the memory cells M0, M1, . . . , M15 by, for example, 2 nm or more.

The purpose of this is to stabilize the operation of the EEPROM by making tunnel currents flowing in the select gate electrodes 27(SSL) and 27(GSL) of the select gate transistors S1 and S2, which cause read and erase errors, smaller than tunnel currents flowing in the tunnel insulating films 25 of the memory cells M0, M1, . . . , M15.

In order to implement such a structure, for example, a silicon oxide film or oxynitride film having a thickness of 2 nm to 20 nm and serving as a gate insulating film is formed in advance, and regions where the select gate transistors S1 and S2 are formed are covered with a resist. Portions of the gate insulating film which correspond to regions where the memory cells M0, M1, . . . , M15 are formed are then removed. Thereafter, a silicon oxide film or oxynitride film having a thickness of 0.5 to 10 nm and serving as a gate insulating film is formed again.

According to such a method of forming the gate insulating films 25, $25_{SSL}$, and $25_{GSL}$, the thickness of the tunnel insulating films 25 of the memory cells M0, M1, . . . , M15 is 0.5 to 10 nm, and the thickness of each of the gate insulating films $25_{SSL}$ and $25_{GSL}$ of the select gate transistors S1 and S2 is 2.5 to 30 nm.

Block insulating films 40, $40_{SSL}$, and $40_{GSL}$ are formed on the charge storing layers 26, $26_{SSL}$, and $26_{GSL}$. The thickness of each of the block insulating films 40, $40_{SSL}$, and $40_{GSL}$ is set to, for example, 2 nm to 30 nm. The block insulating films 40, $40_{SSL}$, and $40_{GSL}$ are formed from insulating films such as silicon oxide films or oxynitride films.

Conductive polysilicon layers 41, $41_{SSL}$, and $41_{GSL}$ are formed on the block insulating films 40, $40_{SSL}$, and $40_{GSL}$. The polysilicon layers 41, $41_{SSL}$, and $41_{GSL}$ contain an impurity (e.g., phosphorus, arsenic, or boron), whose concentration is set to $1\times10^{17}$ to $1\times10^{21}$ atoms/cm$^3$. The thickness of each of the polysilicon layers 41, $41_{SSL}$, and $41_{GSL}$ is set to a predetermined value within the range of 10 nm to 500 nm.

The gate insulating films 25, $25_{SSL}$, and $25_{GSL}$, charge storing layers 26, $26_{SSL}$, and $26_{GSL}$, block insulating films 40, $40_{SSL}$, and $40_{GSL}$, and conductive polysilicon layers 41, $41_{SSL}$, and $41_{GSL}$ are formed on element regions (p-type silicon region 23) surrounded by element isolation layers 24 formed from, for example, silicon oxide films in a self-aligned manner. That is, the edges of the gate insulating films 25, $25_{SSL}$, and $25_{GSL}$, charge storing layers 26, $26_{SSL}$, and $26_{GSL}$, block insulating films 40, $40_{SSL}$, and $40_{GSL}$, and conductive polysilicon layers 41, $41_{SSL}$, and $41_{GSL}$ in the row direction coincide with the edges of the element isolation layers 24 in the row direction.

According to this structure, for example, after the gate insulating films 25, $25_{SSL}$, and $25_{GSL}$, charge storing layers 26, $26_{SSL}$, and $26_{GSL}$, block insulating films 40, $40_{SSL}$, and $40_{GSL}$, and conductive polysilicon layers 41, $41_{SSL}$, and $41_{GSL}$ are formed, etching (RIE) is performed to determine their edges in the row direction. Subsequently, the p-type well region 23 is also etched to form trenches each having a thickness of 0.05 to 0.5 μm therein. The element isolation layers 24 are formed by filling the trenches with insulating films, and the gate insulating films 25, $25_{SSL}$, and $25_{GSL}$, charge storing layers 26, $26_{SSL}$, and $26_{GSL}$, block insulating films 40, $40_{SSL}$, and $40_{GSL}$, and conductive polysilicon layers 41, $41_{SSL}$, and $41_{GSL}$ are formed to be self-aligned with the element isolation layers 24 (or element regions).

A low-resistance material serving as the control gate electrodes 27(WL0), . . . , 27(WL15) and select gate lines 27(SSL) and 27(GSL) is formed on the polysilicon layers 41, $41_{SSL}$, and $41_{GSL}$. This low-resistance material is Wsi (tungsten silicide), CoSi, or the like. More specifically, the control gate electrode of each memory cell and the select electrode of each select gate transistor each have a stacked structure constituted by a conductive polysilicon layer and a low-resistance material.

The thickness of each of the control gate lines 27(WL0), . . . , 27(WL15) and select gate lines 27(SSL) and 27(GSL) is set to 10 nm to 500 nm.

The edges of the polysilicon layers 41, $41_{SSL}$, and $41_{GSL}$, control gate lines 27(WL0), . . . , 27(WL15), and select gate lines 27(SSL) and 27(GSL) in the column direction are formed by etching (RIE) using cap insulting film 48 as a mask.

As a result of this etching, the control gate lines 27(WL0), . . . , 27(WL15) and select gate lines 27(SSL) and 27(GSL) extend straight in the row direction. The polysilicon layers 41, $41_{SSL}$, and $41_{GSL}$ are arranged in only element regions surrounded by the element isolation layers 24.

The n-type well region 22 is formed between the p-type well region 23 and the p-type silicon substrate 21. with this structure, the potential of the p-type well region 23 can be set independently of the p-type silicon substrate 21. Such a structure is called a double well structure (twin well structure), which requires no boosting circuit with a large driving force in erase operation, and hence can achieve a reduction in power consumption and the like.

According to the device structure of this embodiment, the gate insulating films 25, $25_{SSL}$, and $25_{GSL}$ i charge storing layers 26, $26_{SSL}$, and $26_{GSL}$, block insulating films 40, $40_{SSL}$, and $40_{GSL}$, and polysilicon layers 41, $41_{SSL}$, and $41_{GSL}$ are formed to be self-aligned with the element isolation layers 24 (or element regions). In addition, the upper surface of each element isolation layer 24 is located sufficiently above the surface of the p-type well region 23.

For this reason, the control gate lines 27(WL0), . . . , 27(WL15) and select gate lines 27(SSL) and 27(GSL) are not arranged near or below the surface of the p-type well region 23. This can therefore prevent concentration of an electric field on the interface between the p-type well region 23 and each element isolation layer 24 and the generation of parasitic transistors with low threshold values.

According to the device structure of this embodiment, a decrease in write threshold value due to electric field concentration, i.e., a so-called side walk phenomenon, does not easily occur, and hence a high-performance, high-reliability transistor can be formed.

Side-wall insulating films 43 are formed on the side walls of the control gate lines 27(WL0), . . . , 27(WL15) and select gate lines 27(SSL) and 27(GSL) in the column direction. The thickness of each of the side-wall insulating films 43 is set to, for example, 5 nm to 200 nm. The side-wall insulating film 43 is formed from a silicon nitride film, silicon oxide film, or the like.

N-type diffusion layers 28, 28s, and 28d serving as source and drain electrodes are formed in the p-type well region 23.

The MONOS memory cells M0, M1, . . . , M15 are comprised of the n-type diffusion layers 28, charge storing layers 26, conductive polysilicon layers 41, and control gate lines 27(WL0), . . . , 27(WL15). Likewise, the MONOS select gate transistors S1 and S2 are comprised of the n-type diffusion layers 28, 28s, and 28d, charge storing layers $26_{SSL}$ and $26_{GSL}$, conductive polysilicon layers $4_{SSL}$ and $41_{GSL}$ and select gate lines 27(SSL) and 27(GSL).

The gate length of each of the MONOS memory cells M0, M1, ..., M15 is set to a predetermined value within the range of 0.01 μm to 0.5 μm. The gate length of each of the MONOS select gate transistors S1 and S2 is set to a value larger than that of each of the memory cells M0, M1, ..., M15, for example, a predetermined value within the range of 0.02 μm to 1 μm. By setting such a long channel length, the ON/OFF ratio in block selection/unselection can be increased, thus preventing write and read errors.

The n-type diffusion layer 28 contains an impurity such as phosphorus, arsenic, or antimony, whose surface concentration is set to a predetermined value within the range of $1\times10^{17}$ to $1\times10^{21}$ atoms/cm$^3$. The depth of the n-type diffusion layer 28 is set to a predetermined value with the range of 10 nm to 500 nm.

In ion implantation in forming the n-type diffusion layer 28, an n-type impurity is implanted into the p-type well region 23 through the gate insulating films 25, $25_{SSL}$, and $25_{GSL}$, charge storing layers 26, $26_{SSL}$, and $26_{GSL}$, and block insulating films 40, $40_{SSL}$, and $40_{GSL}$. The n-type diffusion layer 28 is shared by two adjacent memory cells, and n-type diffusion layers 28s and 28d are shared by two adjacent cell units.

According to the device structure of this embodiment, the select gate transistors S1 and S2 have the charge storing layers 26 and are formed from MONOS transistors like the memory cells M0, M1, ..., M15. In addition, the interconnection layer on which the select gate lines SSL and GSL of the select gate transistors S1 and S2 are arranged is the same interconnection layer on which the control gate lines WL0, WL1, ..., WL15 of the memory cells M0, M1, ..., M15 are arranged.

The device structure of this embodiment differs from the device structure according to the first embodiment described above in that the charge storing layers 26 extend in the column direction on the element regions, and the charge storing layers 26 of transistors in one cell unit are integrated. In this embodiment, therefore, a material for the charge storing layers 26 is limited to an insulating material, e.g., SiN, titanium oxide, tantalum oxide, or alumina.

Unlike the conventional EEPROM having floating gate electrodes, the charge storing layers 26 are made of an insulating material, and hence the side-wall insulating film 43 for preventing a leak current between two adjacent transistors (memory cells and select gate transistors) need not be sufficiently thick.

According to the device structure of this embodiment, therefore, since the side-wall insulating film 43 can be thin, the distance between two transistors in each cell unit can be decreased, thus contributing to an increase in the packing density of elements and a reduction in chip size.

In addition, since the side walls of the charge storing layers 26, $26_{SSL}$, and $26_{GSL}$ are not exposed in forming the select gate lines 27(SSL) and 27(GSL) of the select gate transistors S1 and S2 and the control gate lines 27(WL0), ..., 27(WL15) of the memory cells M0, M1, .. ., M15, contamination of the charge storing layers 26, $26_{SSL}$, and $26_{GSL}$ and leak currents therein can be prevented. Furthermore, this can prevent write and erase errors due to electric field concentration on source and drain edges.

With regard to the gate insulating films 25, $25_{SSL}$, and $25_{GSL}$, charge storing layers 26, $26_{SSL}$, and $26_{GSL}$, and block insulating films 40, $40_{SSL}$, and $40_{GSL}$, only the edges in the row direction are processed, but the edges in the column direction are not processed.

In the column direction, therefore, only the polysilicon layers 41, $41_{SSL}$, and $41_{GSL}$, control gate electrodes 27(WL0), ..., 27(WL15), and select gate electrodes 27(SSL) and 27(GSL) may be processed, but the gate insulating films 25, $25_{SSL}$, and $25_{GSL}$, charge storing layers 26, $26_{SSL}$, and $26_{GSL}$, and block insulating films 40, $40_{SSL}$, and $40_{GSL}$ need not be processed.

For this reason, the differences in level between transistors formed after the gate process are reduced. As a consequence, the distance between two adjacent gate electrodes can be reduced, contributing to an increase in the packing density of elements. The trench between two gate electrodes must be filled with the interlayer insulating film 28. According to this embodiment, since the aspect ratio of this trench can be decreased, the trench between two gate electrodes can be completely filled with the interlayer insulating film 28.

The n-type diffusion layer (drain) $28_d$ located nearest to the drain side (bit line side) in a cell unit is connected to an intermediate layer $33_d$ through a contact plug $31_d$. The intermediate layer $33_d$ is connected to a bit line (data transfer line) 36(BL) through a contact plug $32_d$. The n-type diffusion layer (source) $28_s$ located nearest to the source side (source line side) in a cell unit is connected to a source line 33(SL) through a contact plug $31_s$.

A bit line (data transfer line) BL is made of tungsten, tungsten silicide, titanium, titanium nitride, aluminum, or the like. The source line 33(SL) extends straight in the row direction. Note that the n-type diffusion layer $28_s$ may extend straight in the row direction to be shared by cell units in the row direction.

The contact plugs $31_s$, $31_d$, and $32_d$ are made of conductive polysilicon doped with an n-type impurity or p-type impurity, tungsten, tungsten silicide, Al, TiN, Ti, or the like. The interlayer insulating film 28 is formed from an insulating film made of $SiO_2$, SiN, or the like. A protective film (passivation film) 37 is made of $SiO_2$, SiN, polyimide, or the like.

Note that an upper interconnection made of W, Wl, Cu, or the like is formed on the bit line 36(BL).

In the device structure according to this embodiment as well, threshold values can be set for the select gate transistors S1 and S2 by the method described in the first embodiment.

The electrons trapped in the charge storing layer 26 on the n-type diffusion layer 28 can be extracted into the p-type well region 23 by the erase state (SE1, SE1') shown in FIGS. 53 and 54. For this reason, electrons are not stored in the charge storing layer 26 on the n-type diffusion layer 28, thus preventing an increase in the resistance of a current path in each cell unit.

[Third embodiment]

Figure 62:
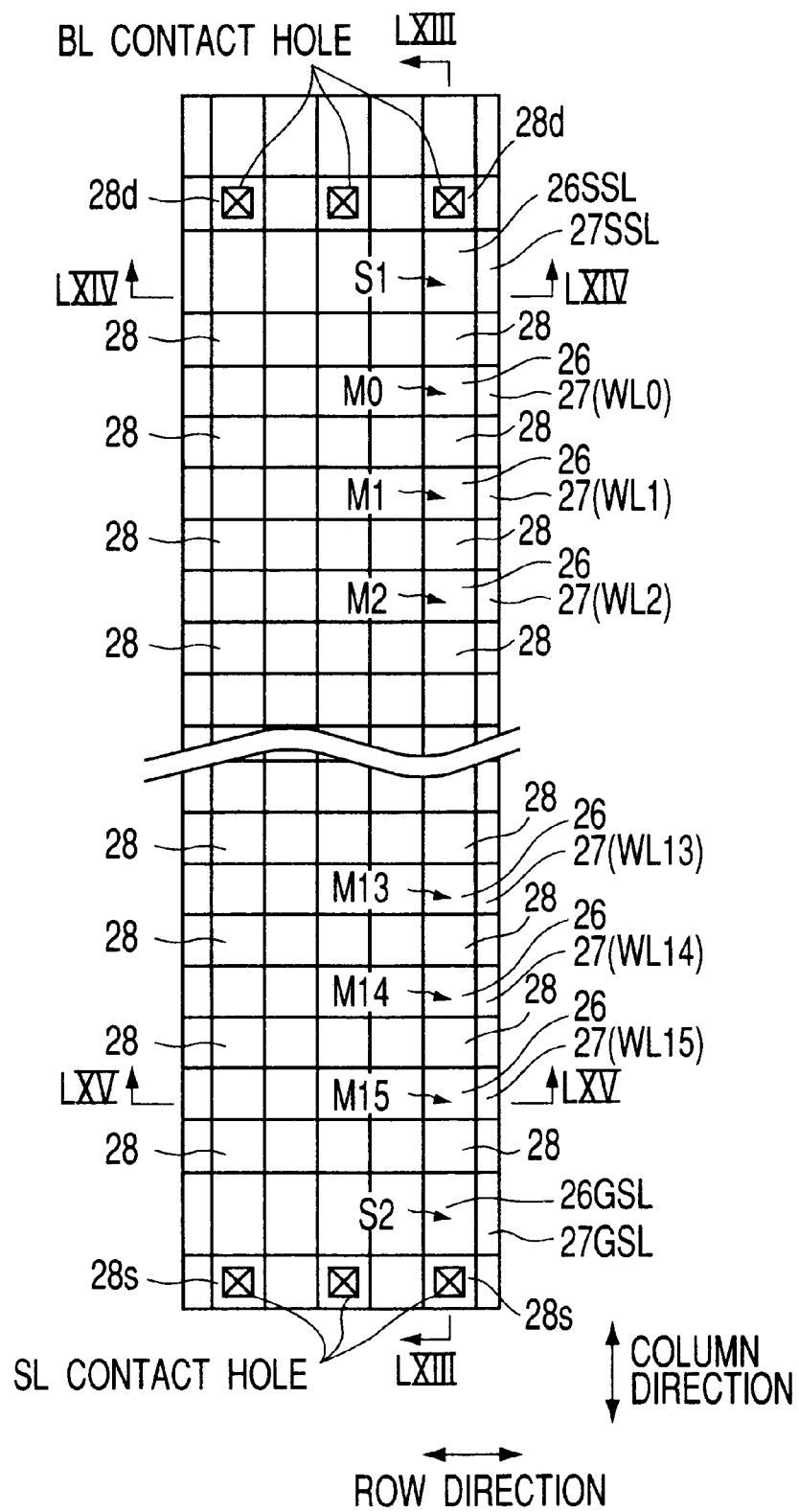
FIG. 62 is a plan view showing the third embodiment of the EEPROM according to the present invention.
Figure 63:
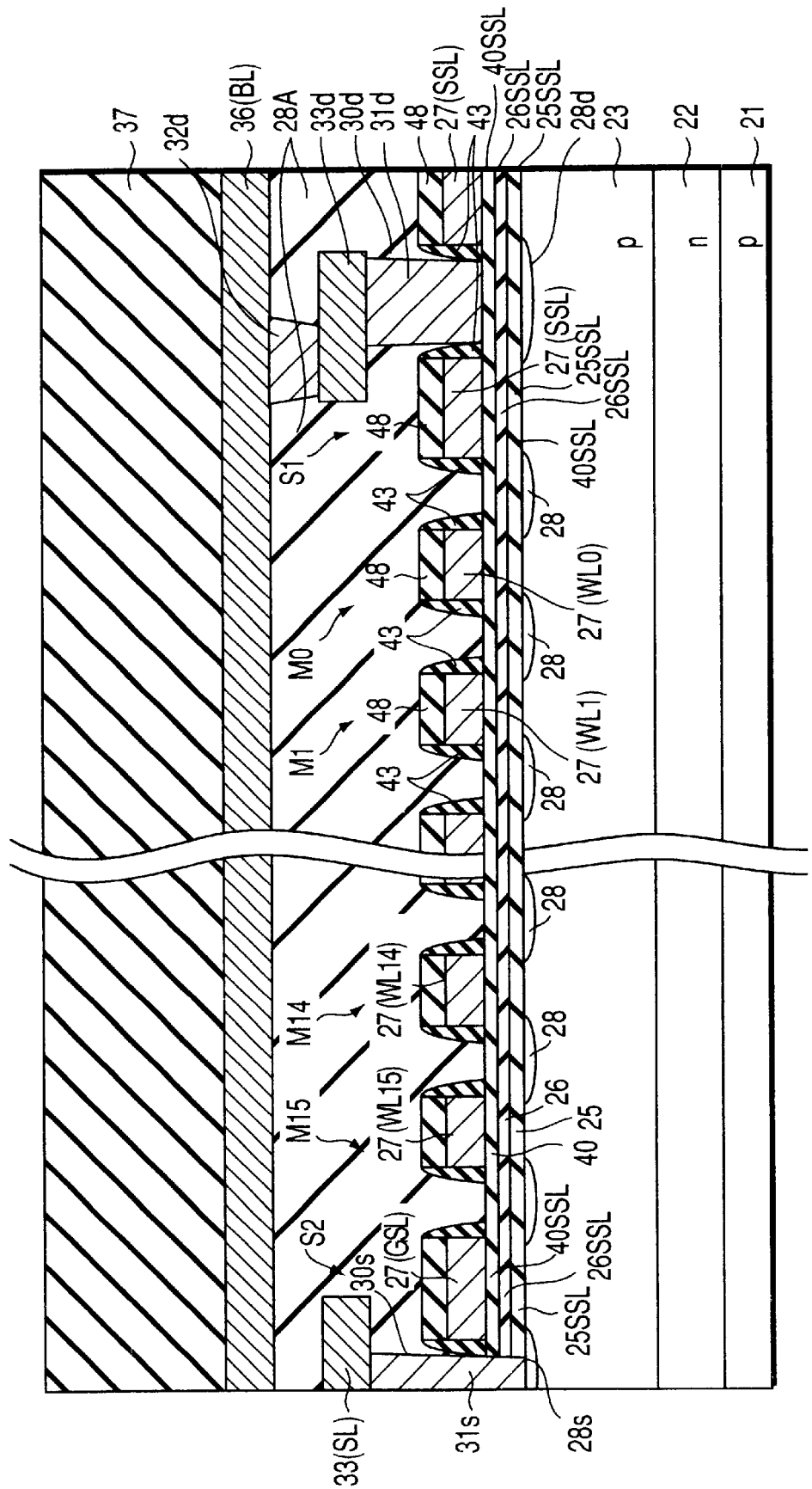
FIG. 63 is a sectional view taken along a line LXIII—LXIII in FIG. 62.

FIG. 62 is a plan view showing the cell array structure of a NAND EEPROM according to the present invention. FIG. 63 is a sectional view taken along a line LXIII—LXIII in FIG. 62. FIG. 64 is a sectional view taken along a line LXIV—LXIV in FIG. 62. FIG. 65 is a sectional view taken along a line LXV—LXV in FIG. 62.

The same reference numerals as in FIGS. 43 to 46 denote the same parts of the device in FIGS. 62 to 65, and a detailed description thereof will be omitted.

In comparison with the device according to the second embodiment described above, a characteristic feature of the device of this embodiment is that a charge storing layer 26 is formed on element isolation layers 24 and the entire element regions surrounded by the element isolation layers 24.

Of the charge storing layer 26, regions in which charges are actually stored are portions directly under control gate electrodes 27(WL0), . . . , 27(WL15) and portions directly under select gate electrodes 27(SSL) and 27(GSL). Therefore, no problem arises in terms of the operation of an EEPROM even though the charge storing layers 26 are formed on an overall p-type well region (memory cell array region) 23.

Each of select gate transistors S1 and S2 and memory cells M0, M1, . . . , M15 is formed by using a MONOS transistor having the charge storing layer 26. In this embodiment, one cell unit 45 is comprised of a NAND string constituted by 15 (=$2^4$) series-connected memory cells and the two select gate transistors S1 and S2 respectively connected to the two ends of the NAND string.

The number of memory cells arranged in one cell unit 45 may be one or more. If one cell unit 45 includes one memory cell, a special EEPROM called a 3Tr-NAND is obtained. In general, one cell unit includes plural memory cells. In consideration of the fact that memory cells in one cell unit 45 are selected by decoding an n-bit address signal, one cell unit 45 preferably includes $2^n$ (n is a positive integer) memory cells.

A p-type well region 23 contains a p-type impurity (e.g., boron), whose concentration is set to a predetermined value within the range of $1 \times 10^{14}$ to $1 \times 10^{19}$ atoms/$cm^3$. Tunnel gate insulating films 25, $25_{SSL}$, and $25_{GSL}$ are formed on the p-type well region 23. The thickness of the tunnel insulating film 25 is set to a predetermined value within, for example, the range of 0.5 to 10 nm. The gate insulating films 25, $25_{SSL}$, and $25_{GSL}$ are formed from insulating films such as silicon oxide films or oxynitride films.

Charge storing layers 26, $26_{SSL}$, and $26_{GSL}$ are formed on the gate insulating films 25, $25_{SSL}$, and $25_{GSL}$. The charge storing layers 26, $26_{SSL}$, and $26_{GSL}$ are formed from, for example, silicon oxide films. The thickness of each silicon nitride film is set to a predetermined value within the range of 4 nm to 50 nm.

In this embodiment, although the charge storing layers 26, $26_{SSL}$, and $26_{GSL}$ are formed on the overall p-type well region (memory cell array region) 23, since the charge storing layers 26, $26_{SSL}$, and $26_{GSL}$ are made of an insulating material, no problem arises in terms of the operation of the EEPROM.

Block insulating films 40, $40_{SSL}$, and $40_{GSL}$ are formed on the charge storing layers 26, $26_{SSL}$, and $26_{GSL}$. The thickness of each of the block insulating films 40, $40_{SSL}$, and $40_{GSL}$ is set to, for example, 2 nm to 30 nm. The block insulating films 40, $40_{SSL}$, and $40_{GSL}$ are formed from insulating films such as silicon oxide films or oxynitride films.

The gate insulating films 25, $25_{SSL}$, and $25_{GSL}$, charge storing layers 26, $26_{SSL}$, and $26_{GSL}$, and block insulating films 40, $40_{SSL}$, and $40_{GSL}$ are formed as follows.

After trenches each having a depth of 0.05 to 0.5 μm are formed in the p-type well region 23, the trenches are filled with the element isolation layers 24. Thereafter, the element isolation layers 24 are subjected a planarization process (etchback, CMP, or the like) until the surfaces of the element isolation layer 24 become almost flush with the surface of the p-type well region 23. The gate insulating films 25, $25_{SSL}$, and $25_{GSL}$ are formed on the element regions surrounded by the element isolation layers 24.

Subsequently, silicon nitride films serving as the charge storing layers 26 are formed on the gate insulating films 25, $25_{SSL}$, and $25_{GSL}$ and element isolation layers 24, and the block insulating films 40 are formed on the charge storing layers 26.

According to this method, unlike in the first and second embodiments, after the element isolation layers 24 having an STI structure are formed, the gate insulating films 25, $25_{SSL}$, and $25_{GSL}$, charge storing layers 26, $26_{SSL}$, and $26_{GSL}$, and block insulating films 40, $40_{SSL}$, and $40_{GSL}$ are formed. For this reason, the aspect ratio of each trench in which the element isolation layer 24 is to be formed can be decreased, and the trench is completely filled with the element isolation layer 24. This makes it possible to increase the element isolation breakdown voltage.

The control gate lines 27(WL0), . . . , 27(WL15) and select gate lines 27(SSL) and 27(GSL) formed from conductive polysilicon layers are formed on the block insulating films 40, $40_{SSL}$, and $40_{GSL}$. Each conductive polysilicon layer contains an impurity (e.g., phosphorus, arsenic, or boron), whose concentration is set to $1 \times 10^{17}$ to $1 \times 10^{21}$ atoms/$cm^3$. The thickness of the conductive polysilicon layer is set to a predetermined value within the range of 10 nm to 500 nm.

In this embodiment, the control gate lines 27(WL0), . . . , 27(WL15) and select gate lines 27(SSL) and 27(GSL) are formed from conductive polysilicon layers. Instead of this layer, each line may have a stacked structure constituted by a conductive polysilicon layer and a metal silicide layer (e.g., Wsi or CoSi).

The edges of the control gate lines 27(WL0), . . . , 27(WL15) and select gate lines 27(SSL) and 27(GSL) in the column direction are formed by etching (RIE) using a cap insulting film 48 as a mask. As a result of this etching, the control gate lines 27(WL0), . . . , 27(WL15) and select gate lines 27(SSL) and 27(GSL) extend straight in the row direction.

An n-type well region 22 is formed between the p-type well region 23 and a p-type silicon substrate 21. With this structure, the potential of the p-type well region 23 can be set independently of the p-type silicon substrate 21. Such a structure is called a double well structure (twin well structure), which requires no boosting circuit with a large driving force in erase operation, and hence can achieve a reduction in power consumption and the like.

Side-wall insulating films 43 are formed on the side walls of the control gate lines 27(WL0), . . . , 27(WL15) and select gate lines 27(SSL) and 27(GSL) in the column direction. The thickness of each of the side-wall insulating films 43 is set to, for example, 5 nm to 200 nm. The side-wall insulating film 43 is formed from a silicon nitride film, silicon oxide film, or the like.

N-type diffusion layers 28, 28s, and 28d serving as source and drain electrodes are formed in the p-type well region 23.

The MONOS memory cells M0, M1, . . . , M15 are comprised of the n-type diffusion layers 28, charge storing layers 26, and control gate lines 27(WL0), . . . , 27(WL15). Likewise, the MONOS select gate transistors S1 and S2 are comprised of the n-type diffusion layers 28, 28s, and 28d, charge storing layers $26_{SSL}$ and $26_{GSL}$, and select gate lines 27(SSL) and 27(GSL).

The gate length of each of the MONOS memory cells M0, M1, . . . , M15 is set to a predetermined value within the range of 0.01 μm to 0.5 μm. The gate length of each of the MONOS select gate transistors S1 and S2 is set to a value larger than that of each of the memory cells M0, M1, . . . , M15, for example, a predetermined value within the range of 0.02 μm to 1 μm. By setting such a long channel length, the ON/OFF ratio in block selection/unselection can be increased, thus preventing write and read errors.

The n-type diffusion layer 28 contains an impurity such as phosphorus, arsenic, or antimony, whose surface concentration is set to a predetermined value within the range of $1 \times 10^{17}$ to $1 \times 10^{21}$ atoms/$cm^3$. The depth of the n-type diffusion layer 28 is set to a predetermined value with the range of 10 nm to 500 nm.

In ion implantation in forming the n-type diffusion layer 28, an n-type impurity is implanted into the p-type well region 23 through the gate insulating films 25, $25_{SSL}$, and $25_{GSL}$, charge storing layers 26, $26_{SSL}$, and $26_{GSL}$, and block insulating films 40, $40_{SSL}$, and $40_{GSL}$. The n-type diffusion layer 28 is shared by two adjacent memory cells, and n-type diffusion layers 28s and 28d are shared by two adjacent cell units.

According to the device structure of this embodiment, the select gate transistors S1 and S2 have the charge storing layers 26 and are formed from MONOS transistors like the memory cells M0, M1, . . . , M15. In addition, the interconnection layer on which the select gate lines SSL and GSL of the select gate transistors S1 and S2 are arranged is the same interconnection layer on which the control gate lines WL0, WL1, . . . , WL15 of the memory cells M0, M1, . . . , M15 are arranged.

The device structure of this embodiment differs from the device structure according to the second embodiment described above in that the charge storing layers 26 are arranged on the element isolation layers 24 and the element regions surrounded by the element isolation layers 24, and the charge storing layers 26 of the transistors in all the cell units are integrated. In this embodiment as well, therefore, a material for the charge storing layers 26 is limited to an insulating material, e.g., SiN, titanium oxide, tantalum oxide, or alumina.

Unlike the conventional EEPROM having floating gate electrodes, the charge storing layers 26 are made of an insulating material, and hence the side-wall insulating film 43 for preventing a leak current between two adjacent transistors (memory cells and select gate transistors) need not be sufficiently thick.

According to the device structure of this embodiment, therefore, since the side-wall insulating film 43 can be thin, the distance between two transistors in each cell unit can be decreased, thus contributing to an increase in the packing density of elements and a reduction in chip size.

In addition, since the side walls of the charge storing layers 26, $26_{SSL}$, and $26_{GSL}$ are not exposed in forming the select gate lines 27(SSL) and 27(GSL) of the select gate transistors S1 and S2 and the control gate lines 27(WL0), . . . , 27(WL15) of the memory cells M0, m1, . . . , M15, contamination of the charge storing layers 26, $26_{SSL}$, and $26_{GSL}$ and leak currents therein can be prevented. Furthermore, this can prevent write and erase errors due to electric field concentration on source and drain edges.

In this embodiment, after the element isolation layers 24 having the STI structure are formed, the gate insulating films 25, $25_{SSL}$, and $25_{GSL}$, charge storing layers 26, $26_{SSL}$, and $26_{GSL}$, and block insulating films 40, $40_{SSL}$, and $40_{GSL}$ are formed. These insulating films do not undergo the heating step in forming the element isolation layers 24.

The gate insulating films 25, $25_{SSL}$, and $25_{GSL}$, charge storing layers 26, $26_{SSL}$, and $26_{GSL}$, and block insulating films 40, $40_{SSL}$, and $40_{GSL}$, each having good film quality, can be formed without any process damage.

In addition, in this embodiment, the charge storing layers 26, $26_{SSL}$, and $26_{GSL}$ are formed on the entire p-type well region (memory cell array region) 23, and there is no process for the charge storing layers 26, $26_{SSL}$, and $26_{GSL}$. Therefore, the charge storing layers 26, $26_{SSL}$, and $26_{GSL}$ suffer no damage, contributing to an improvement in charge storage characteristics.

Furthermore, only the select gate lines 27(SSL) and 27(GSL) of the select gate transistors S1 and S2 and the control gate lines 27(WL0), . . . , 27(WL15) of the memory cells M0, M1, . . . , M15 need to be processed, and the gate insulating films 25, $25_{SSL}$, and $25_{GSL}$, charge storing layers 26, $26_{SSL}$, and $26_{GSL}$, and block insulating films 40, $40_{SSL}$, and $40_{GSL}$ need not be processed.

For this reason, the differences in level between transistors formed after the gate process are reduced. As a consequence, the distance between two adjacent gate electrodes can be reduced, contributing to an increase in the packing density of elements. The trench between two gate electrodes must be filled with the interlayer insulating film 28. According to this embodiment, since the aspect ratio of this trench can be decreased, the trench between two gate electrodes can be completely filled with the interlayer insulating film 28.

The n-type diffusion layer (drain) $28_d$ located nearest to the drain side (bit line side) in a cell unit is connected to an intermediate layer $33_d$ through a contact plug $31_d$. The intermediate layer $33_d$ is connected to a bit line (data transfer line) 36(BL) through a contact plug $32_d$. The n-type diffusion layer (source) $28_s$ located nearest to the source side (source line side) in a cell unit is connected to a source line 33(SL) through a contact plug $31_s$.

A bit line (data transfer line) BL is made of tungsten, tungsten silicide, titanium, titanium nitride, aluminum, or the like. The source line 33(SL) extends straight in the row direction. Note that the n-type diffusion layer $28_s$ may extend straight in the row direction to be shared by cell units in the row direction.

The contact plugs $31_s$, $31_d$" and $32_d$ are made of conductive polysilicon, tungsten, tungsten silicide, Al, TiN, Ti, or the like which is doped with an n-type impurity or p-type impurity. The interlayer insulating film 28 is formed from an insulating film made of $SiO_2$, SiN, or the like. A protective film (passivation film) 37 is made of $SiO_2$, SiN, polyimide, or the like.

Note that an upper interconnection made of W, Wl, Cu, or the like is formed on the bit line 36(BL).

In the device structure according to this embodiment as well, threshold values can be set for the select gate transistors S1 and S2 by the method described in the first embodiment.

The electrons trapped in the charge storing layer 26 on the n-type diffusion layer 28 can be extracted into the p-type well region 23 by the erase state (SE1, SE1') shown in FIGS. 53 and 54. For this reason, electrons are not stored in the charge storing layer 26 on the n-type diffusion layer 28, thus preventing an increase in the resistance of a current path in each cell unit.

[Fourth embodiment]

Figure 66:
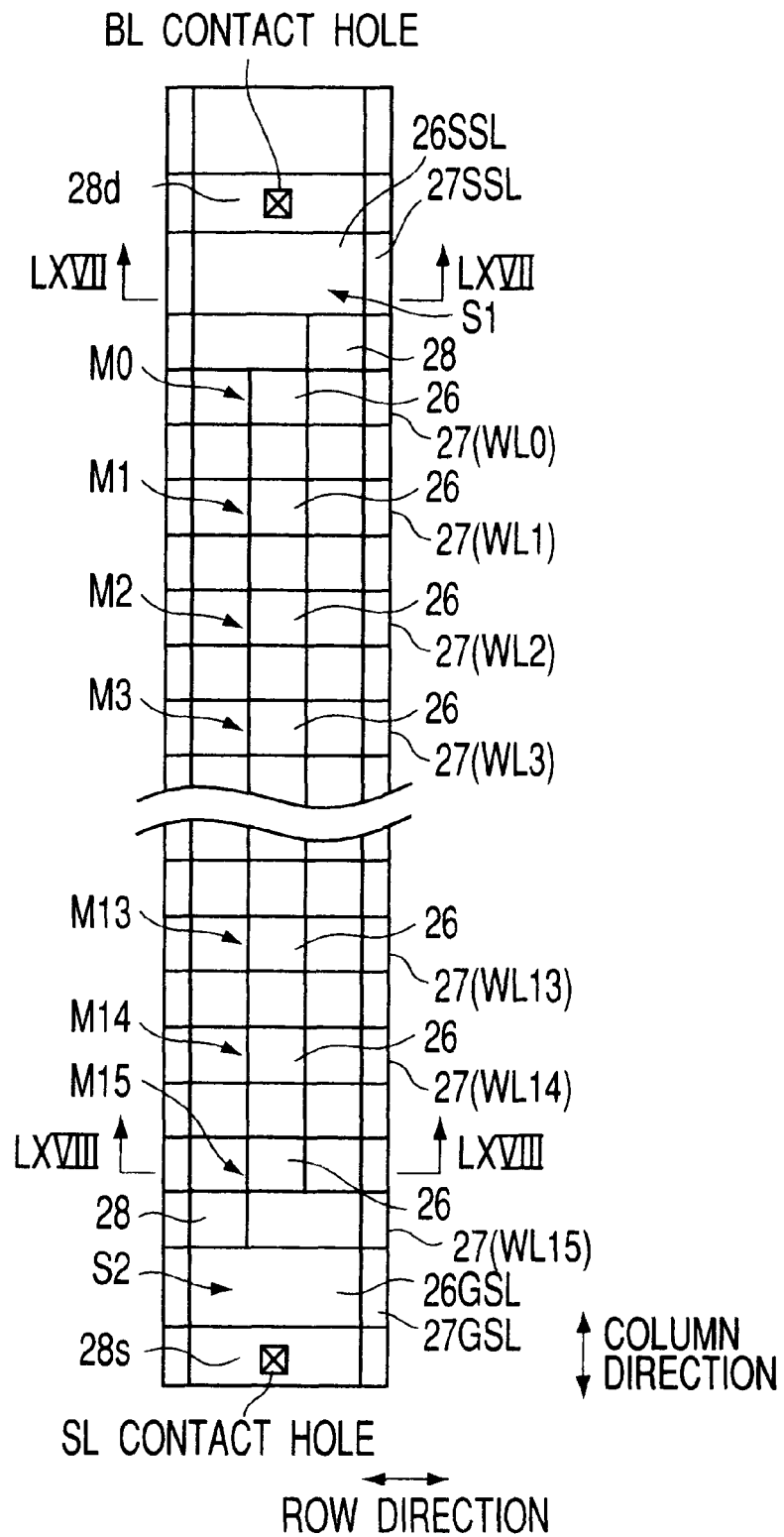
FIG. 66 is a plan view showing the fourth embodiment of the EEPROM according to the present invention.
Figure 67:
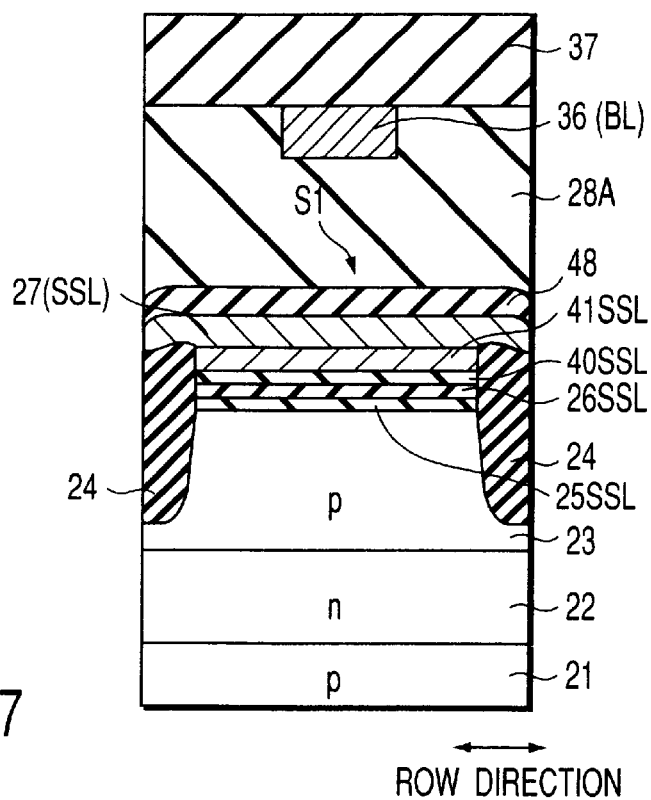
FIG. 67 is a sectional view taken along a line LXVII—LXVII in FIG. 66.
Figure 68:
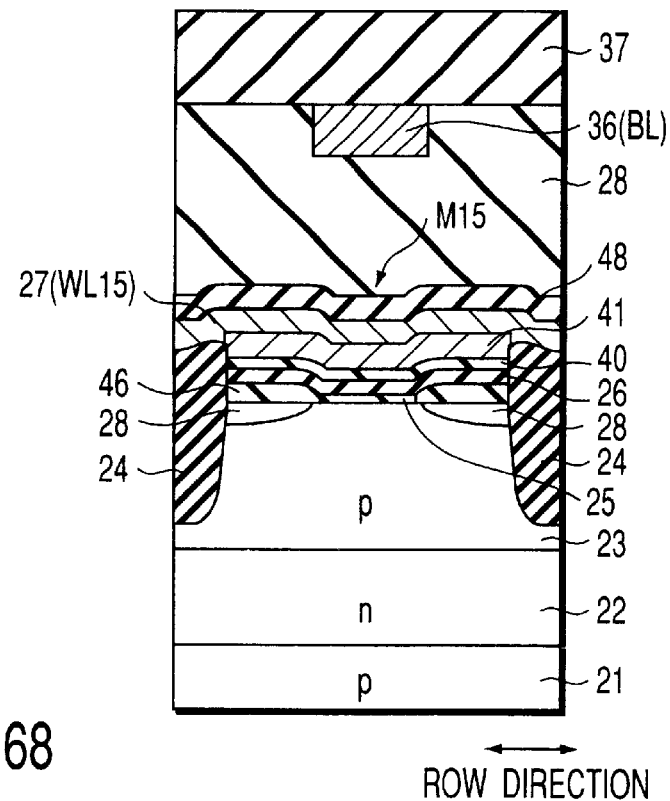
FIG. 68 is a sectional view taken along a line LXVIII—LXVIII in FIG. 66.
Figure 69:
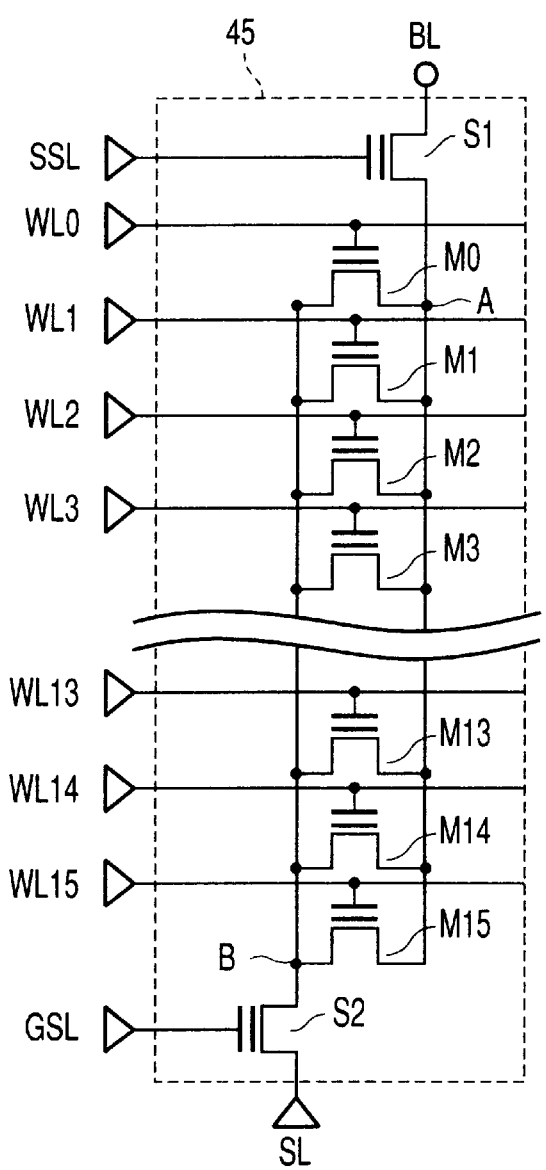
FIG. 69 is an equivalent circuit of one cell unit of the device in FIGS. 66 to 68.

FIG. 66 is a plan view showing the cell array structure of an AND EEPROM of the present invention. FIG. 67 is a sectional view taken along a line LXVII—LXVII in FIG. 66. FIG. 68 is a sectional view taken along a line LXVIII—LXVIII in FIG. 66. FIG. 69 is an equivalent circuit of one cell unit of the device shown in FIGS. 66 to 68.

The device structure of this embodiment can be considered to be obtained by changing the memory cell array having the NAND cell structure according to the first embodiment described above into a memory cell array having an AND cell structure.

Plural (16 in this case) memory cells M0, M1, . . . , M15 are connected in parallel between nodes A and B. The node A is connected to a bit line (data transfer line) BL through a select gate transistor Si. The node B is connected to a source line SL through a select gate transistor S2. All the memory cells M0, M1, M15 and select gate transistors S1 and S2 are formed on a p-type well region 23.

The control gate electrodes of the memory cells M0, M1, . . . , M15 are connected to control gate lines (data select lines, i.e., word lines) WL0, WL1, . . . , WL15. The control gate lines WL0, WL1, . . . , WL15 extend in the row direction and are connected to plural cell units 45 in one block.

The select gate electrodes of the select gate transistors S1 and S2 are connected to select gate lines SSL and GSL. The lines SSL and GSL extend in the row direction and are connected to the plural cell units 45 in one block. The lines SSL and GSL have the function of selecting a block and electrically connecting the cell units 45 in the selected block to the bit line BL.

In this embodiment, the select gate transistors Si and S2 have charge storing layers $26_{SSL}$ and $26_{GSL}$. The device structure of each of the select gate transistors S1 and S2 is substantially the same as that of each of the memory cells M0, M1, . . . , M15. In addition, the interconnection layer on which the lines SSL and GSL of the select gate transistors S1 and S2 are arranged is the same interconnection layer on which the control gate lines WL0, WL1, . . . , WL15 of the memory cells M0, M1, . . . , M15 are arranged.

In this embodiment, two select gate lines are connected to each cell unit 45 in one block. It suffice, however, that at least one select gate line is connected to each cell unit 45. In addition, in consideration of an increase in the packing density of elements, the lines SSL and GSL are preferably arranged to be parallel to the control gate lines (word lines) WL0, WL1, . . . , WL15.

In this embodiment, 16 (=$2^4$) parallel-connected memory cells are arranged in one cell unit 45. However, it suffices if one or more memory cells are arranged in one cell unit 45. In consideration of the fact that the memory cells M0, M1, . . . , M15 in one cell unit 45 are selected by decoding an n-bit address signal, one cell unit 45 preferably includes $2^n$ (n is a positive integer) memory cells.

The device structure of the semiconductor memory shown in FIGS. 66 to 68 will be described in detail next.

An n-type well region (n-type silicon region) 22 is formed in a p-type silicon substrate 21. A p-type well region (p-type silicon region) 23 is formed in the n-type well region 22. Such a well structure is called a double well structure or twin well structure.

The p-type well region 23 contains a p-type impurity (e.g., boron), whose concentration is set to a predetermined value within the range of $1 \times 10^{14}$ to $1 \times 10^{19}$ atoms/cm$^3$. For example, insulating films 25, $25_{SSL}$, and $25_{GSL}$ each having a thickness of 0.5 to 10 nm are formed on the p-type well region 23. The insulating films 25, $25_{SSL}$, and $25_{GSL}$ are formed from silicon oxide films or oxynitride films.

Charge storing layers 26, $26_{SSL}$, and $26_{GSL}$ each having, for example, a thickness of 4 nm to 50 nm are formed on the insulating films 25, $25_{SSL}$, and 25-GSL. In this embodiment, the charge storing layers 26, $26_{SSL}$, and $26_{GSL}$ are formed from silicon oxide films.

Block insulating films 40, $40_{SSL}$, and $40_{GSL}$ each having, for example, a thickness of 2 nm to 30 nm are formed on the charge storing layers 26, $26_{SSL}$, and $26_{GSL}$. The block insulating films 40, $40_{SSL}$, and $40_{GSL}$ are formed from silicon oxide films or oxynitride films.

Polysilicon layers 41, $41_{SSL}$, and $41_{GSL}$ are formed on the block insulating films 40, $40_{SSL}$, and $40_{GSL}$. The polysilicon layers 41, $41_{SSL}$, and $41_{GSL}$ contain an n-type impurity (e.g., phosphorus or arsenic) or p-type impurity (e.g., boron), whose concentration is set to a predetermined value within the range of $1 \times 10^{17}$ to $1 \times 10^{21}$ atoms/cm$^3$. Each of the polysilicon layers 41, $41_{SSL}$, and $41_{GSL}$ has, for example, a thickness of 10 nm to 500 nm.

The insulating films 25, $25_{SSL}$, and $25_{GSL}$, charge storing layers 26, $26_{SSL}$, and $26_{GSL}$, block insulating films 40, $40_{SSL}$, and $40_{GSL}$, and polysilicon layers 41, $41_{SSL}$, and $41_{GSL}$ are formed on element regions (p-type silicon region) surrounded by element isolation layers 24 to be self-aligned with the element regions (or element isolation layers 24).

In this embodiment, after the formation of the insulating films 25, $25_{SSL}$, and $25_{GSL}$, charge storing layers 26, $26_{SSL}$, and $26_{GSL}$, block insulating films 40, $40_{SSL}$, and $40_{GSL}$, and polysilicon layers 41, $41_{SSL}$, and $41_{GSL}$, these layers are processed (etched) to form edge portions in the row direction (at this time, no process for forming edge portions in the column direction is performed).

In this etching (RIE), for example, the p-type well region 23 is also etched to form trenches therein. Each trench has, for example, a depth of 0.05 to 0.5 µm from the surface. The element isolation layers 24 are then buried in these trenches, and CMP or etchback is executed with respect to the element isolation layers 24 to partition element regions and element isolation regions.

As described above, the insulating films 25, $25_{SSL}$, and $25_{GSL}$, charge storing layers 26, $26_{SSL}$, and $26_{GSL}$, block insulating films 40, $40_{SSL}$, and $40_{GSL}$, and polysilicon layers 41, $41_{SSL}$, and $41_{GSL}$ are formed on the element regions surrounded by the element isolation layers 24 formed from silicon oxide films to be self-aligned with the element regions or element isolation regions. Since the insulating films 25, $25_{SSL}$, and $25_{GSL}$, charge storing layers 26, $26_{SSL}$, and $26_{GSL}$, block insulating films 40, $40_{SSL}$, and $40_{GSL}$, and polysilicon layers 41, $41_{SSL}$, and $41_{GSL}$ are formed the p-type well region 23 having a flat surface, the uniformity of the memory cell structure improves, thus equalizing the characteristics of the memory cells.

Control gate lines 27(WL0), . . . , 27(WL15) that electrically connect the polysilicon layers 41 of the memory cells M0, M1, . . . , M15 which are arranged in the row direction are formed on the polysilicon layers 41. The control gate lines 27(WL0), . . . , 27(WL15) are made of a low-resistance material, e.g., a metal silicide such as WSi (tungsten silicide), NiSi, MoSi, TiSi, or CoSi.

Likewise, select gate lines 27(SSL) and 27(GSL) that electrically connect the polysilicon layers $41_{SSL}$ and $41_{GSL}$ of the select gate transistors S1 and S2 which are arranged in the row direction are formed on the polysilicon layers $41_{SSL}$ and $41_{GSL}$. The select gate lines 27(SSL) and 27(GSL) are made of a low-resistance material , e.g., a metal silicide such as WSi (tungsten silicide), NiSi, MoSi, TiSi, or CoSi.

In this embodiment, the control gate electrode of each memory cell and the control electrode of each select gate transistor each have a stack structure constituted by the polysilicon layer 41 with an impurity concentration of $1 \times 10^{17}$ to $1 \times 10^{21}$ atoms/cm$^3$ and a metal silicide such as WSi (tungsten silicide), NiSi, Mosi, TiSi, or CoSi.

Note that the thickness of each of the control gate lines 27(WL0), . . . , 27(WL15) and select gate lines 27(SSL) and 27(GSL) is set to, for example, 10 nm to 500 nm. The control gate lines 27(WL0), . . . , 27(WL15) and select gate lines 27(SSL) and 27(GSL) extend from one end to the other end of one block, in the row direction, which is constituted by plural cell units arranged in the row direction.

Cap insluting films 48 serving as a mask in a gate process are formed on the control gate lines 27(WL0), . . . , 27(WL15) and select gate lines 27(SSL) and 27(GSL).

When the insulating films 25, $25_{SSL}$, and $25_{GSL}$, charge storing layers 26, $26_{SSL}$, and $26_{GSL}$, block insulating films 40, $40_{SSL}$, and $40_{GSL}$, polysilicon layers 41, $41_{SSL}$, and $41_{GSL}$, and control lines (control gate lines and select gate lines) 27(WL0), ..., 27(WL15), 27(SSL), and 27(GSL) are etched by using the cap insulting films 48 as a mask, the edge portions of these components are formed in the column direction.

Each MONOS EEPROM cell (memory cell) is constituted by the n-type diffusion layer 28, charge storing layer 26, polysilicon layer 41, and control gate lines 27(WL0), ..., 27(WL15). The select gate transistors are also constituted by n-type diffusion layers 28, $28_s$, and $28_d$, charge storing layers $26_{SSL}$ and $26_{GSL}$, polysilicon layers $41_{SSL}$ and $41_{GSL}$, and select gate lines 27(SSL) and 27(GSL).

The gate length of each MONOS EEPROM cell is set to a predetermined value within the range of 0.01 µm to 0.5 µm. Each of the n-type diffusion layers 28, $28_s$, and $28_d$ contains n-type impurity (e.g., phosphorus, arsenic, or antimony), whose surface concentration is set to a predetermined value within the range of $1\times10^{17}$ to $1\times10^{21}$ atoms/cm$^3$. In addition, the depth of each of n-type diffusion layers 28, $28_s$, and $28_d$ is set to a predetermined value in the rang of 10 nm to 500 nm.

The n-type diffusion layer (source/drain) 28 is shared by plural (16 in this embodiment) parallel-connected memory cells. As a consequence, an AND cell structure constituted by plural parallel-connected memory cells is implemented. In addition, n-type diffusion layers $28_s$ and $28_d$ are shared by two cell units adjacent to each other in the column direction.

The gate length of each select gate transistor is set to be larger than that of each MONOS EEPROM cell (memory cell). For example, the gate length of each select gate transistor is set to a predetermined value within the range of 0.02 µm to 1 µm. By setting the gate length of each select gate transistor to be larger than that of each memory cell, the ON/OFF ratio in block selection/nonselection can be sufficiently increased. This makes it possible to prevent write and read errors.

A characteristic feature of the device structure according to this embodiment is that both select gate transistor and memory cell are formed by using MONOS MOSFETs. Another characteristic feature of the device structure according to this embodiment is that the select gate lines 27(SSL) and 27(GSL) of the select gate transistors are formed in the same layer as that of the control gate lines 27(WL0), ..., 27(WL15).

In this embodiment, the thicknesses of the insulating layer 25 and charge storing layer 26 of each memory cell are substantially the same as those of the insulating films $25_{SSL}$ and $25_{GSL}$ and charge storing layers $26_{SSL}$ and $26_{GSL}$ of each select gate transistor. That is, since the insulating films 25, $25_{SSL}$, and $25_{GSL}$ and charge storing layers 26, $26_{SSL}$, and $26_{GSL}$ of each memory cell and each select gate transistor can be formed at once, the manufacturing process can be shortened, and the process cost can be reduced.

The charge storing layers 26, $26_{SSL}$, and $26_{GSL}$ are not formed between the two MOSFETs (each including a memory cell and select gate transistor) adjacent to each other in the column direction. For this reason, no electron is stored in the insulating film between two MOSFETs adjacent to each other in the column direction.

The n-type diffusion layer (drain electrode) $28_d$ located nearest to the bit line side in a cell unit is connected to the bit line (data transfer line) BL. The bit line BL is made of, for example, conductive polysilicon doped with an impurity, tungsten, tungsten silicide, titanium, titanium nitride, or aluminum. The n-type diffusion layer (source electrode) $28_s$ located nearest to the source line side in a cell unit is connected to the source line.

The memory cells and select gate transistors are covered with the interlayer insulating films 28. The bit line 36(BL) is formed in an interconnection trench formed in the interlayer insulating film 28 by, for example, a damascene process. The interlayer insulating film 28 is made of, for example, $SiO_2$ or SiN.

An upper interconnection made of a metal such as W, Al, or Cu is formed on the bit line 36(BL). The bit line 36(B) and upper interconnection are covered with a protective film (passivation film) 37 formed from an insulating film made of, for example, $SiO_2$, SiN, or polyimide.

In this device structure, the n-type well region 22 is interposed between the p-type well region 23 and p-type silicon substrate 21. For this reason, the potential of the p-type well region 23 can be set independently of the p-type silicon substrate 21. As a consequence, for example, the power consumption of a boosting circuit (booster) can be reduced.

In this embodiment, the edge portions of the polysilicon layers 41, $41_{SSL}$, and $41_{GSL}$ are formed in the row direction, and trenches are formed in the p-type well region 23. The element isolation layers 24 are buried in these trenches. Thereafter, the control gate lines 27(WL0), ..., 27(WL15) and select gate lines 27(SSL) and 27(GSL) extending in the row direction are formed.

As shown in FIGS. 67 and 68, therefore, the control gate lines 27(WL0), ..., 27(WL15) and select gate lines 27(SSL) and 27(GSL) are always formed on the p-type well region 23 but are not formed near or under the p-type well region 23.

In the device structure according to this embodiment, electric field concentration does not easily occur in the boundary between the p-type well region 23 and the element isolation layer 24, and a parasitic transistor having a small threshold value is not easily formed either.

In this embodiment, the use of an AND cell structure makes it possible to reduce the series resistance of the memory cells M0, M1, ..., M15 and keep it constant. If, for example, multi-level data is to be stored in each memory cell, this structure is effective at stabilizing the threshold value of each memory cell.

In the device structure according to this embodiment, as in the first embodiment, threshold values of the select gate transistors S1 and S2 can be set. A characteristic feature of a device using an AND cell structure is that in setting threshold values, each unselected memory cell in a selected block is turned off in read operation.

In the NAND cell structure, when read operation is performed, each unselected memory cell in a selected block is turned on. Except for this point, a device using an AND cell structure operates in the same manner as a device using a NAND cell structure. Even if, therefore, the AND cell structure is used, threshold values can be set for the select gate transistors S1 and S2 in accordance with the flow charts of FIGS. 53 and 54.

In this embodiment, the charge storing layers 26 are not arranged between the memory cells M0, M1, M15. Therefore, the charge storing layer 26 may be made of a conductive material, e.g., S1 doped with P, As, or B, SiGe, or Ge, or an insulating film other than SiN, e.g., a titanium oxide, tantalum oxide, or alumina film.

[Fifth embodiment]

Figure 70:
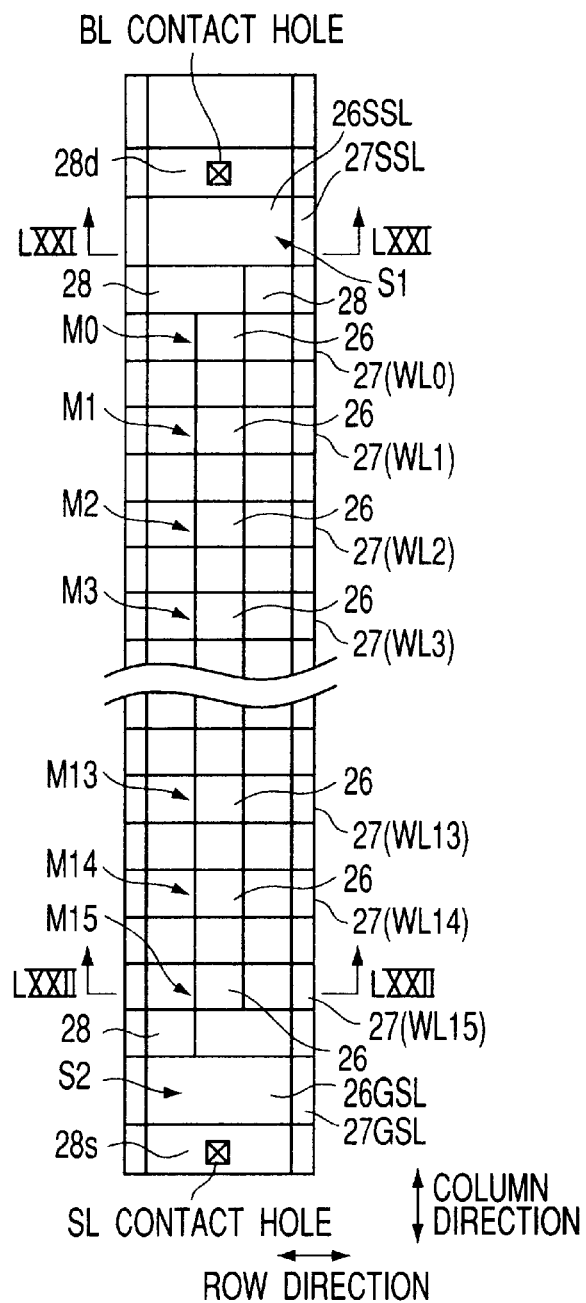
FIG. 70 is a plan view showing the fifth embodiment of the EEPROM according to the present invention.
Figure 71:
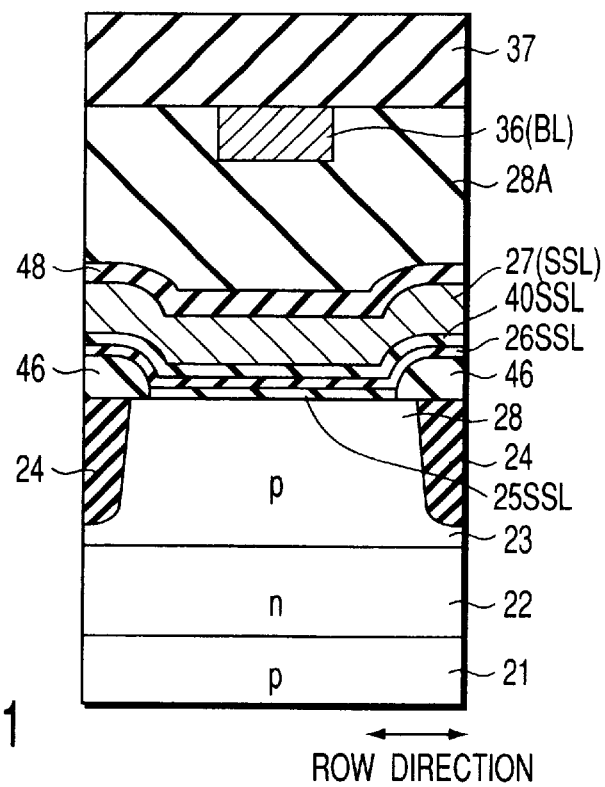
FIG. 71 is a sectional view taken along a line LXXI—LXXI in FIG. 70.
Figure 72:
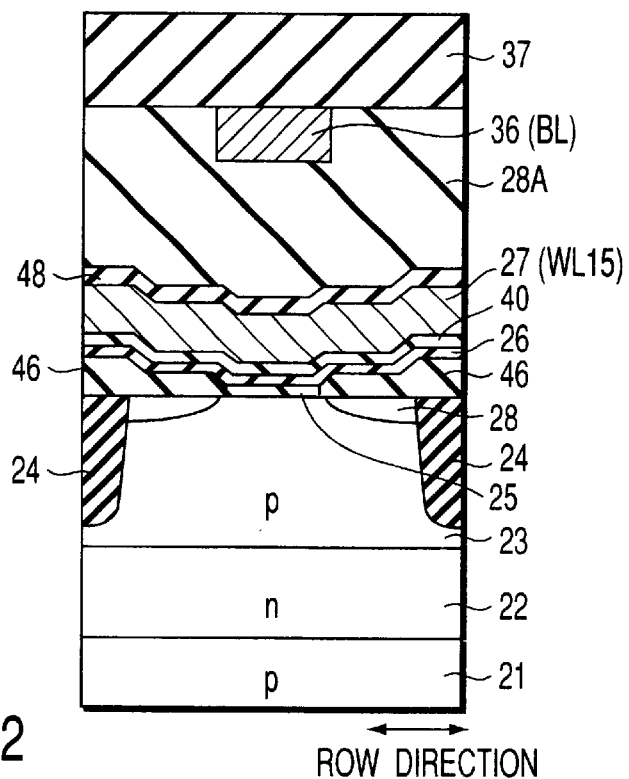
FIG. 72 is a sectional view taken along a line LXXII—LXXII in FIG. 70.

FIG. 70 is a plan view showing the cell array structure of an AND EEPROM of the present invention. FIG. 71 is a sectional view taken along a line LXXI—LXXI in FIG. 70. FIG. 72 is a sectional view taken along a line LXXII—LXXII in FIG. 70. FIG. 69 is an equivalent circuit of one cell unit of the device shown in FIGS. 70 to 72.

The same reference numerals as in FIGS. 66 to 68 denote the same parts of the device in FIGS. 70 to 72.

In comparison with the device according to the fourth embodiment described above, a characteristic feature of the device of this embodiment is that charge storing layers 26, $26_{SSL}$, and $26_{GSL}$ are formed on element isolation layers 24 and the entire element regions surrounded by the element isolation layers 24.

Plural (16 in this case) memory cells M0, M1, ..., M15 are connected in parallel between nodes A and B. The node A is connected to a bit line (data transfer line) BL through a select gate transistor S1. The node B is connected to a source line SL through a select gate transistor S2. All the memory cells M0, M1, ..., M15 and select gate transistors S1 and S2 are formed on a p-type well region 23.

The control gate electrodes of the memory cells M0, M1, ..., M15 are connected to control gate lines (data select lines, i.e., word lines) WL0, WL1, ..., WL15. The control gate lines WL0, WL1, ..., WL15 extend in the row direction and are connected to plural cell units 45 in one block.

The select gate electrodes of the select gate transistors S1 and S2 are connected to select gate lines SSL and GSL. The lines SSL and GSL extend in the row direction and are connected to the plural cell units in one block. The lines SSL and GSL have the function of selecting a block and electrically connecting the cell units in the selected block to the bit line BL.

In this embodiment, the select gate transistors Si and S2 have the charge storing layers $26_{SSL}$ and $26_{GSL}$. The device structure of each of the select gate transistors S1 and S2 is substantially the same as that of each of the memory cells M0, M1, ..., M15. In addition, the interconnection layer on which the lines SSL and GSL of the select gate transistors S1 and S2 are arranged is the same interconnection layer on which the control gate lines WL0, WL1, ..., WL15 of the memory cells M0, M1, ..., M15 are arranged.

In this embodiment, two select gate lines are connected to each cell unit 45 in one block. It suffice, however, that at least one select gate line is connected to each cell unit 45. In addition, in consideration of an increase in the packing density of elements, the lines SSL and GSL are preferably arranged to be parallel to the control gate lines (word lines) WL0, WL1, ..., WL15.

In this embodiment, 16 (=$2^4$) parallel-connected memory cells are arranged in one cell unit 45. However, it suffices if one or more memory cells are arranged in one cell unit 45. In consideration of the fact that the memory cells M0, M1, ..., M15 in one cell unit 45 are selected by decoding an n-bit address signal, one cell unit 45 preferably includes $2^n$ (n is a positive integer) memory cells.

The device structure of the semiconductor memory shown in FIGS. 70 to 72 will be described in detail next.

An n-type well region (n-type silicon region) 22 is formed in a p-type silicon substrate 21. A p-type well region (p-type silicon region) 23 is formed in the n-type well region 22. Such a well structure is called a double well structure or twin well structure.

The p-type well region 23 contains a p-type impurity (e.g., boron), whose concentration is set to a predetermined value within the range of $1 \times 10^{14}$ to $1 \times 10^{19}$ atoms/cm³. For example, gate insulating films 25, $25_{SSL}$, and $25_{GSL}$ each having a thickness of 0.5 to 10 nm are formed on the p-type well region 23. The gate insulating films 25, $25_{SSL}$, and $25_{GSL}$ are formed from silicon oxide films or oxynitride films.

Charge storing layers 26, $26_{SSL}$, and $26_{GSL}$ each having, for example, a thickness of 4 nm to 50 nm are formed on the gate insulating films 25, $25_{SSL}$, and $25_{GSL}$. In this embodiment, the charge storing layers 26, $26_{SSL}$, and $26_{GSL}$ are formed from silicon oxide films.

Block insulating films 40, $40_{SSL}$, and $40_{GSL}$ each having, for example, a thickness of 2 nm to 30 nm are formed on the charge storing layers 26, $26_{SSL}$, and $26_{GSL}$. The block insulating films 40, $40_{SSL}$, and $40_{GSL}$ are formed from silicon oxide films or oxynitride films.

In this embodiment, the charge storing layers 26, $26_{SSL}$, and $26_{GSL}$ and block insulating films 40, $40_{SSL}$, and $40_{GSL}$ are formed on the overall p-type well region (memory cell array region) 23.

In this case, since the charge storing layers 26, $26_{SSL}$, and $26_{GSL}$ are made of an insulating material, even if the charge storing layers 26, $26_{SSL}$, and $26_{GSL}$ are formed on the overall p-type well region (memory cell array region) 23, no problem arises in terms of the operation of the EEPROM.

The gate insulating films 25, $25_{SSL}$, and $25_{GSL}$, charge storing layers 26, $26_{SSL}$, and $26_{GSL}$, and block insulating films 40, $40_{SSL}$, and $40_{GSL}$ are formed as follows.

After trenches each having a depth of 0.05 to 0.5 $\mu$m are formed in the p-type well region 23, the trenches are filled with the element isolation layers 24. Thereafter, the element isolation layers 24 are subjected a planarization process (etchback, CMP, or the like) until the surfaces of the element isolation layer 24 become almost flush with the surface of the p-type well region 23. After interlayer insulating films 46 is formed, the gate insulating films 25, $25_{SSL}$, and $25_{GSL}$ are formed on the element regions surrounded by the element isolation layers 24.

Subsequently, silicon nitride films serving as the charge storing layers 26 are formed on the gate insulating films 25, $25_{SSL}$, and $25_{GSL}$ and interlayer insulating films 46, and block insulating films 40 are formed on the charge storing layers 26.

According to this method, after the element isolation layers 24 having an STI structure are formed, the gate insulating films 25, $25_{SSL}$, and $25_{GSL}$, charge storing layers 26, $26_{SSL}$, and $26_{GSL}$, and block insulating films 40, $40_{SSL}$, and $40_{GSL}$ are formed. For this reason, the aspect ratio of each trench in which the element isolation layer 24 is to be formed can be decreased, and the trench is completely filled with the element isolation layer 24. This makes it possible to increase the element isolation breakdown voltage.

For example, control gate lines 27(WL0), ..., 27(WL15) and select gate lines 27(SSL) and 27(GSL) formed from polysilicon layers are formed on the block insulating films 40, $40_{SSL}$, and $40_{GSL}$.

In this case, each polysilicon layer contains an n-type impurity (e.g., phosphorus or arsenic) or p-type impurity (e.g., boron), whose concentration is set to $1 \times 10^{17}$ to $1 \times 10^{21}$ atoms/cm³. Each of the control gate lines 27(WL0), ..., 27(WL15) and select gate lines 27(SSL) and 27(GSL) is formed to have a thickness of 10 nm to 500 nm.

Each of the control gate lines 27(WL0), ..., 27(WL15) and select gate lines 27(SSL) and 27(GSL) can be formed from a metal silicide, e.g., WSi (tungsten silicide), NiSi, MoSi, TiSi, or CoSi instead of a polysilicon layer. Alternatively, each of the control gate lines 27(WL0), ..., 27(WL15) and select gate lines 27(SSL) and 27(GSL) may be formed from a multilayer structure constituted by polysilicon and metal silicide layers.

A cap insulating film 48 serving as a mask in a gate process is formed on the control gate lines 27(WL0), ..., 27(WL15) and select gate lines 27(SSL) and 27(GSL).

When the control gate lines 27(WL0), ..., 27(WL15) and select gate lines 27(SSL) and 27(GSL) are etched by using the cap insulting film 48 as a mask, edge portions are formed in the column direction.

A MONOS EEPROM cell (memory cell) is comprised of an n-type diffusion layer 28, the charge storing layer 26, and control gate lines 27(WL0), ..., 27(WL15). A select gate transistor is comprised of n-type diffusion layers 28, 28s, and 28d, the charge storing layers $26_{SSL}$ and $26_{GSL}$, and the select gate lines 27(SSL) and 27(GSL).

The gate length of a MONOS EEPROM cell is set to a predetermined value within the range of 0.01 µm to 0.5 µm. The n-type diffusion layers 28, 28s, and 28d contain an n-type impurity (e.g., phosphorus, arsenic, antimony), whose surface concentration is set to a predetermined value within the range of $1\times10^{17}$ to $1\times10^{21}$ atoms/cm³. The depth of each of the n-type diffusion layers 28, 28s, and 28d is set to a predetermined value within the range of 10 nm to 500 nm.

The n-type diffusion layer (source/drain) 28 is shared by plural (16 in this case) memory cells connected in parallel. This makes it possible to implement an AND cell structure constituted by plural memories connected in parallel. In addition, the n-type diffusion layers 28s and 28d are shared by two cell units adjacent to each other in the column direction.

The gate length of each select gate transistor is set to be larger than that of each MONOS EEPROM cell (memory cell). For example, the gate length of each select gate transistor is set to a predetermined value within the range of 0.02 µm to 1 µm. By setting the gate length of each select gate transistor to be larger than that of each memory cell, the ON/OFF ratio in block selection/nonselection can be sufficiently increased. This makes it possible to prevent write and read errors.

A characteristic feature of the device structure according to this embodiment is that both select gate transistor and memory cell are formed by using MONOS MOSFETs. Another characteristic feature of the device structure according to this embodiment is that the select gate lines 27(SSL) and 27(GSL) of the select gate transistors are formed in the same layer as that of the control gate lines 27(WL0), ..., 27(WL15).

In this embodiment, the thicknesses of the gate insulating layer 25 and charge storing layer 26 of each memory cell are substantially the same as those of the gate insulating films $25_{SSL}$ and $25_{GSL}$ and charge storing layers $26_{SSL}$ and $26_{GSL}$ of each select gate transistor. That is, since the gate insulating films 25, $25_{SSL}$, and $25_{GSL}$ and charge storing layers 26, $26_{SSL}$, and $26_{GSL}$ of each memory cell and each select gate transistor can be formed at once, the manufacturing process can be shortened, and the process cost can be reduced.

In addition, the interlayer insulating film 46 is formed on the n-type diffusion layer 28. The thickness of the interlayer insulating film 46 is set to a value within the range of 5–20 nm. The n-type diffusion layer (drain electrode) $28_d$ located nearest to the bit line side in a cell unit is connected to the bit line (data transfer line) BL. The bit line BL is made of, for example, conductive polysilicon doped with an impurity, tungsten, tungsten silicide, titanium, titanium nitride, or aluminum. The n-type diffusion layer (source electrode) $28_s$ located nearest to the source line side in a cell unit is connected to the source line.

The memory cells and select gate transistors are covered with the interlayer insulating films 28. A bit line 36(BL) is formed in an interconnection trench formed in the interlayer insulating film 28 by, for example, a damascene process. The interlayer insulating film 28 is made of, for example, $SiO_2$ or SiN.

An upper interconnection made of a metal such as W, Al, or Cu is formed on the bit line 36(BL). The bit line 36(BL) and upper interconnection are covered with a protective film (passivation film) 37 formed from an insulating film made of, for example, $SiO_2$, SiN, or polyimide.

In this device structure, the n-type well region 22 is interposed between the p-type well region 23 and p-type silicon substrate 21. For this reason, the potential of the p-type well region 23 can be set independently of the p-type silicon substrate 21. As a consequence, for example, the power consumption of a boosting circuit (booster) can be reduced.

In the device structure of this embodiment, the charge storing layers 26 are arranged on the element isolation layers 24 and the element regions surrounded by the element isolation layers 24, and the charge storing layers 26 of the transistors in all the cell units are integrated. In this embodiment as well, therefore, a material for the charge storing layers 26 is limited to an insulating material, e.g., SiN, titanium oxide, tantalum oxide, or alumina.

Unlike the conventional EEPROM having floating gate electrodes, the charge storing layers 26 are made of an insulating material, and hence the side-wall insulating film 43 for preventing a leak current between two adjacent transistors (memory cells and select gate transistors) need not be sufficiently thick.

According to the device structure of this embodiment, therefore, since the side-wall insulating film 43 can be thin, the distance between two transistors in each cell unit can be decreased, thus contributing to an increase in the packing density of elements and a reduction in chip size.

In addition, since the side walls of the charge storing layers 26, $26_{SSL}$, and $26_{GSL}$ are not exposed in forming the select gate lines 27(SSL) and 27(GSL) of the select gate transistors S1 and S2 and the control gate lines 27(WL0), ..., 27(WL15) of the memory cells M0, M1, ..., M15, contamination of the charge storing layers 26, $26_{SSL}$, and $26_{GSL}$ and leak currents therein can be prevented. Furthermore, this can prevent write and erase errors due to electric field concentration on source and drain edges.

In this embodiment, after the element isolation layers 24 having the STI structure are formed, the gate insulating films 25, $25_{SSL}$, and $25_{GSL}$, charge storing layers 26, $26_{SSL}$, and $26_{GSL}$, and block insulating films 40, $40_{SSL}$, and $40_{GSL}$ are formed. These insulating films do not undergo the heating step in forming the element isolation layers 24.

The gate insulating films 25, $25_{SSL}$, and $25_{GSL}$, charge storing layers 26, $26_{SSL}$, and $26_{GSL}$, and block insulating films 40, $40_{SSL}$, and $40_{GSL}$, each having good film quality, can be formed without any process damage.

In addition, in this embodiment, the charge storing layers 26, $26_{SSL}$, and $26_{GSL}$ are formed on the entire p-type well region (memory cell array region) 23, and there is no process for the charge storing layers 26, $26_{SSL}$, and $26_{GSL}$. Therefore, the charge storing layers 26, $26_{SSL}$, and $26_{GSL}$ suffer no damage, contributing to an improvement in charge storage characteristics.

Furthermore, only the select gate lines 27(SSL) and 27(GSL) of the select gate transistors S1 and S2 and the control gate lines 27(WL0), ..., 27(WL15) of the memory cells M0, M1, ..., M15 need to be processed, and the gate insulating films 25, $25_{SSL}$, and $25_{GSL}$, charge storing layers 26, $26_{SSL}$, and $26_{GSL}$, and block insulating films 40, $40_{SSL}$, and $40_{GSL}$ need not be processed.

For this reason, the differences in level between transistors formed after the gate process are reduced. As a consequence, the distance between two adjacent gate electrodes can be reduced, contributing to an increase in the packing density of elements. The trench between two gate electrodes must be filled with the interlayer insulating film 28. According to this embodiment, since the aspect ratio of this trench can be decreased, the trench between two gate electrodes can be completely filled with the interlayer insulating film 28.

In addition, in this embodiment, the use of an AND cell structure makes it possible to reduce the series resistance of the memory cells M0, M1, . . . , M15 and keep it constant. If, for example, multi-level data is to be stored in each memory cell, this structure is effective at stabilizing the threshold value of each memory cell.

In the device structure according to this embodiment, as in the first embodiment, threshold values of the select gate transistors S1 and S2 can be set. A characteristic feature of a device using an AND cell structure is that in setting threshold values, each unselected memory cell in a selected block is turned off in read operation.

In the NAND cell structure, when read operation is performed, each unselected memory cell in a selected block is turned on. Except for this point, a device using an AND cell structure operates in the same manner as a device using a NAND cell structure. Even if, therefore, the AND cell structure is used, threshold values can be set for the select gate transistors S1 and S2 in accordance with the flow charts of FIGS. 53 and 54.

[Others]

In all the embodiments described above, since the select gate lines SSL and GSL of the select gate transistors S1 and S2 and the control gate lines WL0, WL1, . . . , WL15 of the memory cells M0, M1, . . . , M15 are formed on the same interconnection layer, the interconnection resistances of the select gate lines SSL and GSL and control gate lines WL0, WL1, . . . , WL15 can be set to be low.

A process that reduces the resistances of gate interconnections, such as a polycide process or SALICIDE process, can be used for the select gate lines SSL and GSL and the control gate lines WL0, WL1, . . . , WL15. In addition, since the select gate lines SSL and GSL and control gate lines WL0, WL1, . . . , WL15 can be simultaneously formed, a reduction in cost can be attained by reducing the number of manufacturing steps.

The select gate lines SSL and GSL and control gate lines WL0, WL1, . . . , WL15 can be patterned by one PEP (Photo Engraving Process) and RIE. Therefore, no misalignment occurs between the select gate lines SSL and GSL and the control gate lines WL0, WL1, . . . , WL15 in lithography.

Since there is no need to form low-resistance backside sub wires on the select gate lines SSL and GSL to decrease their resistances, the number of interconnection layers can be decreased. In addition, since there is no need to form contact portions (shunt areas) between the select gate lines SSL and GSL and backside sub wires, the chip area can be reduced, and the problem of contact failures and disconnection failures can be eliminated.

Since the charge storing layers 26 made of an insulating material are used instead of floating gate electrodes, a so-called slit forming process is not required. This can simplify the process. In addition, a manufacturing process for select gate transistors and a manufacturing process for memory cells can be made perfectly common.

Furthermore, since there is no need to form contact portions (shunt areas) between the select gate lines SSL and GSL and backside sub wires, the interval between the two select gate lines SSL and GSL sandwiching a bit line/source line contact portion can be made equal to the interval between the control gate lines WL0, WL1, . . . , WL15 of memory cells.

The present invention is not limited to the above five embodiments.

As methods of forming insulating films including the element isolation insulating films 25, a method of implanting oxygen ions into silicon, a method of oxidizing deposited silicon, and the like can be used as well as the method of converting silicon (S1) into a silicon oxide film or silicon nitride film.

The charge storing layer 26 may be formed by using $TiO_2$, $Al_2O_3$, tantalum oxide film, strontium titanate, barium titanate, lead zirconate titanate, or a multilayer film thereof.

Each embodiment described above uses the p-type silicon substrate (silicon substrate) 21. Instead of this, however, each embodiment may use an n-type silicon substrate, SOI (Silicon On Insulator) substrate, or single-crystal semiconductor substrate containing silicon (SiGe mixed crystal substrate or SiGeC mixed crystal substrate).

The memory cells M0, M1, . . . , M15 and select gate transistors S1 and S2 are formed from n-channel transistors formed in the p-type well region 23. However, they can be formed from p-channel transistors formed in an n-type well region (n-type semiconductor substrate). In this case, in each embodiment described above, n and p types may be replaced with p and n types, respectively.

The control gate electrode of each memory cell and the select gate electrode of each select gate transistor may be made of an S1 semiconductor material, SiGe mixed crystal, or SiGeC mixed crystal. Alternatively, they may be made of a silicide (or polycide) material such as TiSi, NiSi, CoSi, TaSi, WSi, or MoSi, a metal such as Ti, Al, Cu, TiN, or W, or a polycrystal material. In addition, these electrodes may be formed from a multilayer structure comprised of these materials.

The control gate electrode of each memory cell and the select gate electrode of each select gate transistor may be made of amorphous S1, amorphous SiGe mixed crystal, amorphous SiGeC mixed crystal, or a multilayer structure thereof. The charge storing layers 26, $26_{SSL}$, and $26_{GSL}$ of the memory cells M0, M1, . . . , M15 and select gate transistors S1 and S2 may be formed from plural dot-like members.

Various changes and modifications can be made within the spirit and scope of the invention.

As has been described above, according to the semiconductor memory of the present invention, the select gate lines SSL and GSL of the select gate transistors S1 and S2 and the control gate lines WL0, WL1, . . . , WL15 of the memory cells M0, M1, . . . , M15 can be formed on the same interconnection layer, and the interconnection resistances of the select gate lines SSL and GSL and control gate lines WL0, WL1, . . . , WL15 can be simultaneously decreased.

A process that decreases the resistances of gate interconnections, such as a polycide process or SALICIDE process, can be commonly used for the select gate lines SSL and GSL and the control gate lines WL0, WL1, . . . , WL15, and hence both a reduction in interconnection resistance and a decrease in the number of manufacturing steps can be attained.

In addition, since the select gate lines SSL and GSL and control gate lines WL0, WL1, . . . , WL15 can be simultaneously processed by using a mask formed by one lithography process, no misalignment occurs between the select gate lines SSL and GSL and the control gate lines WL0, WL1, . . . , WL15, and the chip area does not increase.

There is no need to form so-called low-resistance backside sub wires on the select gate lines SSL and GSL to reduce the resistances of the select gate lines SSL and GSL.

This makes it possible to decrease the number of interconnection layers. Furthermore, since no contact portions (shunt areas) are required between the select gate lines SSL and GSL and backside sub wires, the chip area can be reduced, and the problem of contact failures and disconnection failures can be eliminated.

Since the charge storing layers 26 made of an insulating material are used instead of floating gate electrodes, a so-called slit forming process is not required. This can simplify the process. In addition, a manufacturing process for select gate transistors and a manufacturing process for memory cells can be made perfectly common.

Furthermore, since there is no need to form contact portions (shunt areas) between the select gate lines SSL and GSL and backside sub wires, the interval between the two select gate lines SSL and GSL sandwiching a bit line/source line contact portion can be made equal to the interval between the control gate lines WL0, WL1, . . . , WL15 of memory cells.

(3) Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
    a cell unit having first and second ends and constituted by transistors connected in series between the first and second ends;
    a data transferring line connected to the first end of said cell unit; and
    a common voltage node connected to the second end of said cell unit,
    wherein each transistor has substantially the same structure and a function of storing data in a nonvolatile manner, one of the transistors which is located nearest to said data transferring line and one of the transistors which is located nearest to said common voltage node are used as select gate transistors, and the transistors other than the transistors used as the select gate transistors are used as memory cells.

2. The semiconductor memory according to claim 1, wherein the transistors used as the select gate transistors are always set in an erase state or write state.

3. The semiconductor memory according to claim 1, wherein after all the transistors are set in the erase state, the transistors used as the select gate transistors are set in the write state.

4. The semiconductor memory according to claim 3, wherein after the transistors used as the select gate transistors are set in the write state, data programming is executed for the transistors used as the memory cells.

5. The semiconductor memory according to claim 1, wherein after all the transistors are set in the erase state, data programming is executed for the transistors used as the memory cells.

6. A semiconductor memory comprising:
    a cell unit having first and second ends and constituted by MFSFETs connected in series between the first and second ends and having substantially the same structure;
    a data transferring line connected to the first end of said cell unit; and
    a common voltage node connected to the second end of said cell unit,
    wherein one of the MFSFETs which is located nearest to said data transferring line and one of the MFSFETs which is located nearest to said common voltage node are used as select gate transistors, and the MFSFETs other than the MFSFETs used as the select gate transistors are used as memory cells.

7. The semiconductor memory according to claim 6, wherein the MFSFETs used as the select gate transistors are always set in an erase state or write state.

8. The semiconductor memory according to claim 6, wherein after all the MFSFETs are set in the erase state, the MFSFETS used as the select gate transistors are set in the write state.

9. The semiconductor memory according to claim 8, wherein after the MFSFETs used as the select gate transistors are set in the write state, data programming is executed for the MFSFETs used as the memory cells.

10. The semiconductor memory according to claim 6, wherein after all the MFSFETs are set in the erase state, data programming is executed for the MFSFETs used as the memory cells.

11. The semiconductor memory according to claim 6, wherein a low potential is applied to gate electrodes of the MFSFETs used as the memory cells, the gate electrode of an unselected MFSFET of the MFSFETs used as the memory cells is set in a floating state, a high potential is applied to a semiconductor substrate on which the MFSFETs are formed, and data erase operation is executed to a selected MFSFET of the MFSFETs used as the memory cells.

12. The semiconductor memory according to claim 6, wherein a predetermined potential is applied to the data transferring line to charge channels of the MFSFETs used as the memory cells to an initial potential, the channels of the MFSFETs used as the memory cells are then set in the floating state, a program potential or transfer potential is applied to the gate electrodes of the MFSFETs used as the memory cells, and data programming is executed to a selected MFSFET of the MFSFETs used as the memory cells.

13. The semiconductor memory according to claim 6, wherein a ground potential is applied to the data transferring line to set the channels of the MFSFETs used as the memory cells to a ground potential, a program potential or transfer potential is then applied to the gate electrodes of the MFSFETs used as the memory cells, and data programming is executed for a selected MFSFET of the MFSFETs used as the memory cells.

14. A semiconductor memory comprising:
    memory cells formed on a semiconductor region and connected in series or parallel between first and second nodes; and
    a select switching element formed on the semiconductor region and connected between the first node and a third node,
    wherein said memory cells and said select switching element each have a charge storing layer, and the charge storing layer of each of said memory cells is made of the same material as that for the charge storing layer of said select switching element and has the same thickness as that thereof.

15. The semiconductor memory according to claim 14, wherein each of said memory cells has a control gate electrode, said select switching element has a select gate electrode having the same structure as that of the control gate electrode, and the control gate electrodes and the select gate electrode are arranged on the same interconnection layer.

16. The semiconductor memory according to claim 14, wherein the charge storing layer of each of said memory cells and the charge storing layer of said select switching element are separated from one another, said charge storing layer comprises a material selected from the group consisting of conductive materials including impurity-doped Si, SiGe, and Ge, and insulating materials including SiN, titanium oxide, tantalum oxide, and alumina.

17. The semiconductor memory according to claim 16, further comprising element isolation insulating films surrounding element regions on which said memory cells and said select switching element are arranged, wherein the charge storing layers of said memory cells and the charge storing layer of said select switching element are arranged on only the element regions.

18. The semiconductor memory according to claim 16, wherein said memory cells and said select switching element each have a gate insulating film, and the gate insulating film of said select switching element is thicker than that of each of said memory cells.

19. The semiconductor memory according to claim 14, wherein the charge storing layer of each of said memory cells and the charge storing layer of said select switching element are combined with each other and the charge storing layer comprises one material selected from the group consisting of insulating materials including SiN, titanium oxide, tantalum oxide, and alumina.

20. The semiconductor memory according to claim 19, further comprising element isolation insulating films surrounding element regions on which said memory cells and said select switching element are arranged, wherein the charge storing layers of said memory cells and the charge storing layer of said select switching element are arranged on only the element regions.

21. The semiconductor memory according to claim 19, further comprising element isolation insulating films surrounding element regions on which said memory cells and said select switching element are arranged, wherein the charge storing layers of said memory cells and the charge storing layer of said select switching element are arranged on the element regions and said element isolation insulating films, respectively.

22. The semiconductor memory according to claim 19, wherein said memory cells and said select switching element each have a gate insulating film, and the gate insulating film of said select switching element is thicker than that of each of said memory cells.

23. The semiconductor memory according to claim 14, wherein said select switching element has a select gate electrode and a block insulating film placed between the select gate electrode and the charge storing layer of said select switching element, a current which flowed in the block insulating film is larger than that in a gate insulating film between the charge storing layer of said select switching element and the semiconductor region in write/erase operation for said select switching element.

24. The semiconductor memory according to claim 14, wherein a threshold voltage of said select switching element change in a direction to converge to a predetermined value in erase operation.

25. The semiconductor memory according to claim 14, wherein a threshold voltage of said select switching element change in a direction to converge to a predetermined value in write operation.

26. The semiconductor memory according to claim 14, wherein said memory cells and said select switching element comprise field-effect transistors of a second conductivity type arranged in a well region of a first conductivity type.

27. The semiconductor memory according to claim 14, wherein said select switching element has a select gate electrode forming above the charge storing layer, and a potential of the semiconductor region is more positive than a potential of the select gate electrode.

28. The semiconductor memory according to claim 14, wherein the memory cells and the select switching element have a gate electrode each, which is provided on an insulating film formed on the charge storing layer, which extends at right angles to a data transferring line and which is connected to the third node.

29. A threshold voltage setting method of a semiconductor memory including a select gate transistor having a charge storing layer and memory cells having a charge storing layer, comprising the steps of:

setting both a threshold voltage of the select gate transistor and a threshold voltage of the memory cells to be negative by erase operation;

setting the threshold voltage of the select gate transistor to be positive by write operation;

verifying whether the threshold voltage of the select gate transistor become positive;

performing re-write operation if the threshold voltage of the select gate transistor has not become positive;

setting the threshold voltage of the select gate transistor to be positive, and then performing write operation to make the threshold voltage of the select gate transistor fall within a set range;

verifying whether the threshold voltage of the select gate transistor falls within the set range; and performing the re-write operation if the threshold voltage of the select gate transistor has not fallen within the set range.

30. The semiconductor memory according to claim 29, wherein the threshold voltage of the select gate transistor does not become smaller than a first value in the erase operation and does not become larger than a second value in the write operation.

31. The semiconductor memory according to claim 30, wherein the threshold voltage of said select gate transistor converges to the second value upon the re-write operation.

* * * * *